United States Patent
Ishikawa

(10) Patent No.: US 8,378,863 B2
(45) Date of Patent: Feb. 19, 2013

(54) ANALOG-TO-DIGITAL CONVERTER AND CORRECTION METHOD THEREOF

(75) Inventor: Kiyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 169 days.

(21) Appl. No.: 13/040,062

(22) Filed: Mar. 3, 2011

(65) Prior Publication Data

US 2011/0215956 A1    Sep. 8, 2011

(30) Foreign Application Priority Data

Mar. 5, 2010  (JP) .................................. 2010-49278

(51) Int. Cl.
 *H03M 1/06* (2006.01)
(52) U.S. Cl. ......................... 341/118; 341/172; 341/150
(58) Field of Classification Search .................. 341/118, 341/120, 150, 172
See application file for complete search history.

(56) References Cited

U.S. PATENT DOCUMENTS

| | | | |
|---|---|---|---|
| 6,448,911 B1 * | 9/2002 | Somayajula .................. | 341/120 |
| 7,609,184 B2 | 10/2009 | Kuramochi et al. | |
| 7,755,521 B1 * | 7/2010 | Kuramochi et al. .......... | 341/118 |
| 2003/0197636 A1 * | 10/2003 | Confalonieri et al. ........ | 341/172 |
| 2009/0121907 A1 | 5/2009 | Kuramochi et al. | |
| 2010/0039303 A1 * | 2/2010 | Tsukamoto .................... | 341/150 |
| 2011/0148675 A1 * | 6/2011 | Zhao et al. .................... | 341/118 |

FOREIGN PATENT DOCUMENTS

| | | |
|---|---|---|
| JP | 01-185025 | 7/1989 |
| JP | 2005-045795 A | 2/2005 |
| JP | 2009-118488 A | 5/2009 |

\* cited by examiner

*Primary Examiner* — Howard Williams
(74) *Attorney, Agent, or Firm* — Arent Fox LLP

(57) ABSTRACT

An analog-to-digital (AD) converter device, includes: a capacitive digital-to-analog converter (DAC) including a reference capacitor group having capacitors which are weighted with a ratio, one terminal of each of the capacitors being coupled to a common signal line, the other terminal of each of the capacitors being coupled to one of reference power supplies via one of switches; a comparator to compare a voltage of the common signal line with a reference voltage; a successive approximation routine circuit to control the switches based on a comparison result of the comparator; an offset correction circuit to correct an offset of the comparator; and a DAC correction circuit to correct an error in a voltage change of the common signal line, the offset correction circuit and the DAC correction circuit performing a correction so that a residual offset of the comparator and a residual error of the capacitive DAC cancel.

18 Claims, 56 Drawing Sheets

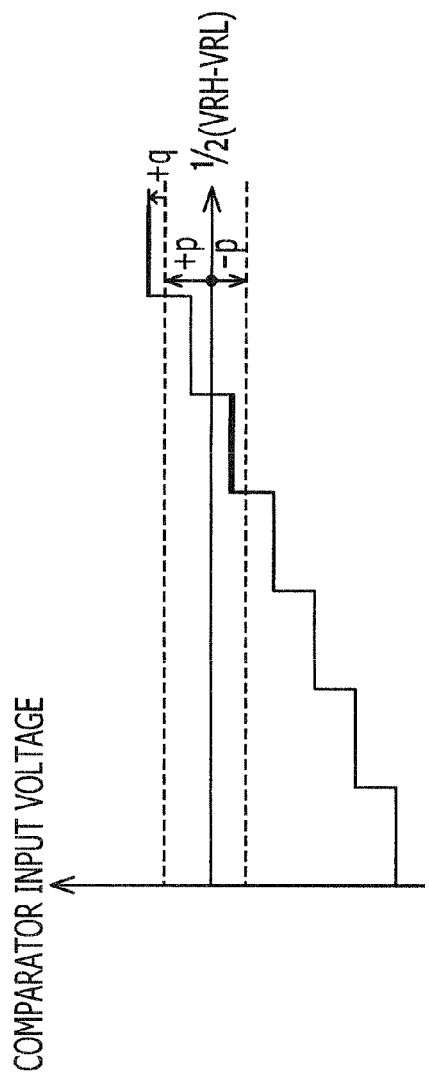
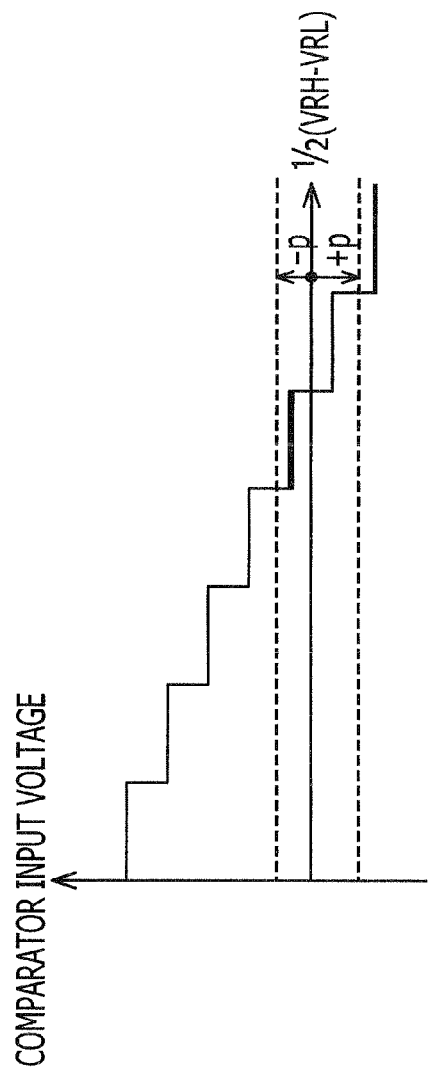
FIG. 7A
FIG. 7B

FIG. 8

|  |  | COMPARATOR RESIDUAL OFFSET | |
|---|---|---|---|
|  |  | POSITIVE | NEGATIVE |
| CDAC RESIDUAL ERROR | POSITIVE | ONE-STEP PRECEDING CORRECTION CODE (CORRECTION CODE -1) | CORRECTION CODE HELD |
|  | NEGATIVE | CORRECTION CODE HELD | ONE-STEP PRECEDING CORRECTION CODE (CORRECTION CODE -1) |

ANALOG-TO-DIGITAL CONVERTER AND CORRECTION METHOD THEREOF

CROSS-REFERENCE TO RELATED APPLICATIONS

This application claims the benefit of priority from Japanese Patent Application No. 2010-49278 filed on Mar. 5, 2010, the entire contents of which are incorporated herein by reference.

BACKGROUND

1. Field

Aspects discussed herein relate to an analog-to-digital converter device.

2. Description of Related Art

A successive approximation routine (SAR) analog-to-digital converter (ADC) compares a voltage of an analog input signal with an output voltage of a digital-to-analog (DA) converter through a comparator, and determines a digital signal to be supplied to the DA converter in response to comparison results in the order of upper to lower bits. The SAR-ADC calculates an approximate digital value in voltage. The operation speed of the SAR-ADC may be determined by an output operation time of the DA converter.

Related art is discussed in Japanese Laid-Open Patent Publication No. H1-185025, Japanese Laid-Open Patent Publication No. 2005-45795, and Japanese Laid-Open Patent Publication No. 2009-118488.

SUMMARY

Aspects include an analog-to-digital (AD) converter device, includes: a capacitive digital-to-analog converter (DAC) including a reference capacitor group having a plurality of capacitors which are weighted with a ratio and to store an analog input signal applied at a sampling time, one terminal of each of the plurality of capacitors being coupled to a common signal line, the other terminal of each of the plurality of capacitors being coupled to at least one of a plurality of reference power supplies via at least one of a plurality of switches; a comparator to compare a voltage of the common signal line with a reference voltage; a successive approximation routine circuit to control the plurality of switches based on a comparison result of the comparator; an offset correction circuit to correct an offset of the comparator; and a DAC correction circuit to correct an error in a voltage change of the common signal line, the offset correction circuit and the DAC correction circuit to perform a correction so that a residual offset of the comparator and a residual error of the capacitive DAC cancel each other.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIGS. 7A and 7B illustrate an exemplary residual error;

FIG. 8 illustrates an exemplary process of a correction logic circuit;

DESCRIPTION OF EMBODIMENTS

A charge redistribution type SAR-ADC calculates an approximate digital value in response to a charge.

An increase in the number of bits is desired of the charge redistribution type successive approximation routine (SAR) analog-to-digital converter (ADC). A conversion process may have a high accuracy to increase the number of bits on the charge redistribution type SAR-ADC. If the reference capacitance of the CDAC does not change in accordance with the power of 2, the output voltage of the CDAC may not change in accordance with the power of 2 either. Therefore, an analog-to-digital (AD) converted value may have error. During the manufacturing phase, [0005]

An offset correction logic circuit correcting an offset of the comparator is provided in the comparator to reduce the offset. The offset correction logic circuit may be adjusted during a manufacturing process of the AD converter device or during an operation of the AD converter device. The offset correction may be performed on an analog signal or using a digital correction code.

In the digital correction of the comparator, an analog signal is generated in response to the digital correction code, and is applied to a portion of one signal path line of a differential amplifier so that a current flowing through the one signal path line increases or decreases. A minimum change width of a correction signal may correspond to the least significant bit of the digital correction code. A correction process is performed by equalizing a positive input signal and a negative input signal, changing the digital correction code in steps in order to gradually change the correction signal, and stopping changes of the digital correction code when an output of the comparator changes. The value of the digital correction code at this state is determined as a correction value. In this state, an offset voltage is slightly above the zero level. A difference between the offset voltage and the zero level is referred to as a residual offset. The absolute value of the residual offset may be smaller than the offset voltage width corresponding to one step of the digital correction code. A polarity of the residual offset depends on a position of correction in the comparator and a search method (direction).

An error correction circuit may be provided in the CDAC in order to reduce an error in the output voltage of the CDAC. In the error correction, the digital correction code is changed in order to reduce the error. The polarity of the residual error is determined depending on the correction method such as a search direction.

Figure 1:
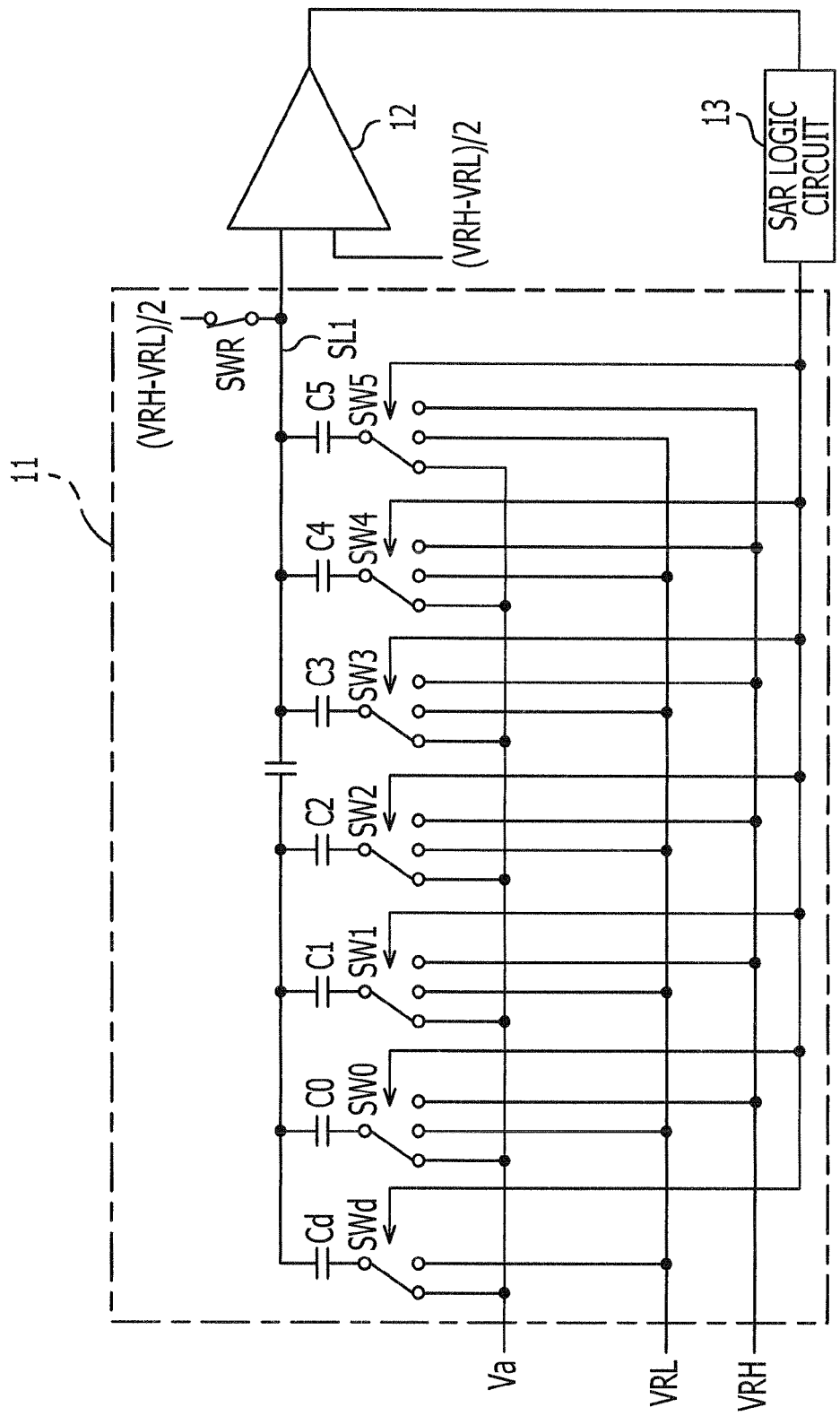
FIG. 1 illustrates an exemplary charge redistribution type SAR-ADC.

FIG. 1 illustrates an exemplary charge redistribution type SAR-ADC. The charge redistribution type SAR-ADC of FIG. 1 may be a six-bit charge redistribution type SAR-ADC. The charge redistribution type SAR-ADC includes charge redistribution type digital-to-analog converter (CDAC) 11, comparator 12, and successive approximation routine (SAR) logic circuit 13. The CDAC 11 includes three upper side capacitors C3-C5 having terminals coupled to a common signal line SL1, a bridge capacitor Cb having one terminal coupled to the common signal line SL1, three lower side capacitors C0-C2 having terminals coupled to a signal line SL2 coupled to the other terminal of the bridge capacitor Cb, a dummy capacitor Cd having one terminal coupled to the signal line SL2, switches SW0-SW5 each of which are coupled to one of a terminal receiving an analog signal Va, a terminal receiving an upper reference voltage VRH, and a terminal receiving a lower reference voltage VRL, a switch d which couples the dummy capacitance Cd to one of a VRH terminal and a VRL terminal, and a switch SWR supplying a reference voltage (VRH−VRL)/2 to the common signal line SL1. The comparator 12 compares a voltage of the common signal line SL1 with the reference voltage (VRH−VRL)/2. The SAR logic circuit 13 controls the switches SW0-SW5 in response to a sampling operation and the comparison results of the comparator 12 so that the voltage of the common signal line SL1 approaches the reference voltage (VRH−VRL)/2. Subsequent to the end of the comparison process, the SAR logic circuit 13 determines an analog-to-digital converted value in response to the connection state of the switches SW0-SW5 and the final comparison result.

The capacitance ratio of the three upper side capacitors C3-C5 may be 1:2:4, for example. The capacitance of the bridge capacitor Cb may be the 8/7 of the upper reference capacitor C3. The capacitance ratio of the dummy capacitor Cd and the three lower side capacitors C0-C2 may be 1:1:2:4. Since the common signal line SL1 is coupled via the bridge capacitor Cb, each capacitance of the dummy capacitor Cd and the three lower side capacitors C0-C2 to the upper reference capacitor C3 may be the ⅛, ⅛, ¼, and ½ of the upper reference capacitor C3. The capacitance ratio of the three lower side capacitors C0-C2 to the three upper side capacitors C3-C5 may be a power of 2. The capacitance of the dummy capacitor Cd may be set so that the capacitance ratio of the three lower side capacitors C0-C2 to the three upper side capacitors C3-C5 becomes a power of 2.

Since the charge redistribution type SAR-ADC of FIG. 1 includes the bridge capacitor Cb, the capacitances of the three upper side capacitors C3-C5 are set substantially equal to the three lower side capacitors C0-C2 and the reference capacitance may be reduced.

Figure 2A:
FIGS. 2A-2F illustrate an exemplary offset voltage.
Figure 2C:
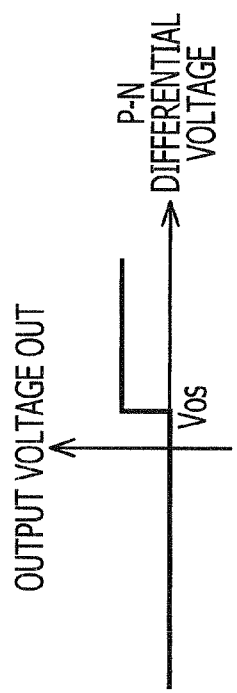
Figure 2E:
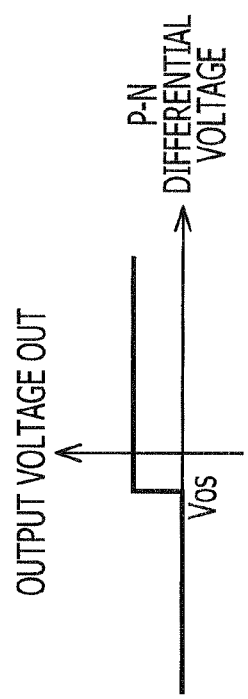
Figure 2B:
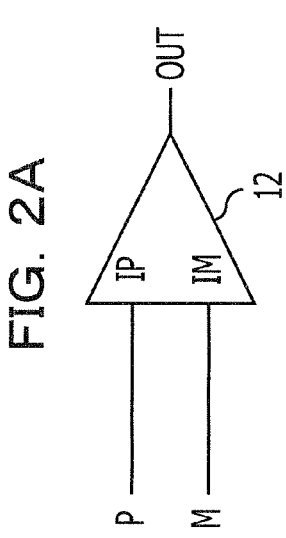

FIGS. 2A-2F illustrate exemplary offset voltages. The offset voltages of FIGS. 2A-2F may be the offset of the comparator 12. FIG. 2A illustrates a zero offset. When the offset is zero, a difference between a positive input P input to a positive input terminal IP and a negative input M input to a negative input terminal IM becomes zero, as illustrated in FIG. 2B. When the positive input P is substantially equal to the negative input M (P=M), an output voltage OUT changes.

Figure 2D:
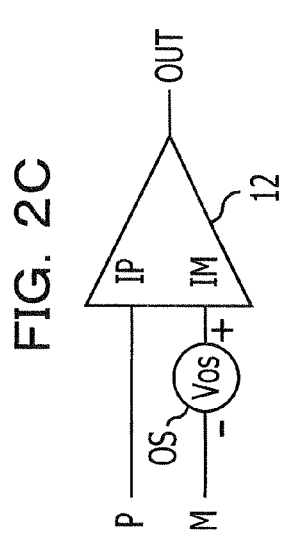

In FIG. 2C, the comparator 12 has a positive (+) offset. The comparator 12 has no offset and the negative input M is input to the negative input terminal IM from an offset voltage source OS. The offset voltage source OS adds a positive offset voltage Vos to the negative input M, thereby resulting in M+Vos (Vos>0). When the positive input P is substantially equal to the negative input M (P=M), M+Vos higher than the voltage Vos (Vos>0) is supplied to the negative input terminal IM and the output voltage OUT is not changed. As illustrated in FIG. 2D, when a difference P-M between the positive input P and the negative input M is Vos (Vos>0), the output voltage OUT changes.

Figure 2F:
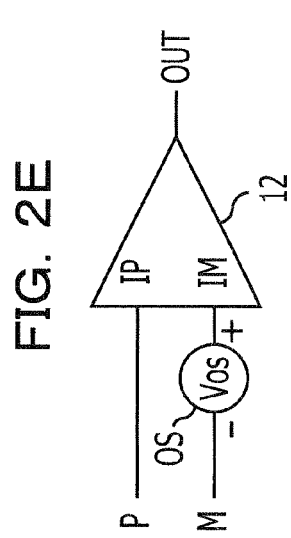

As illustrated in FIG. 2E, the comparator 12 has a negative (−) offset. The comparator 12 has no offset, and the negative input M is input to the negative input terminal IM via the offset voltage source OS. The offset voltage source OS adds a negative offset voltage Vos to the negative input M, resulting in M+Vos (Vos<0). As illustrated in FIG. 2F, when a difference P−M between the positive input P and the negative input M is Vos (Vos<0), the output voltage OUT changes.

When the difference voltage P-M between the two inputs is positive, the comparator 12 may have a positive offset, and when the difference voltage P-M between the two inputs is negative, the comparator 12 may have a negative offset.

The comparator 12 includes a differential amplifier, amplifies a difference of input data and outputs the amplified difference. An offset occurs due to an unbalance between currents flowing through a pair of signal paths of the differential amplifier. A current flowing through one of the signal paths in the differential amplifier is increased or decreased so that the currents flowing through the pair of signal paths become substantially equal to each other, thereby correcting the offset of the comparator. In the digital correction, an analog signal, generated in response to the digital correction code, is applied to a portion of one signal path. A minimum change of the width of the correction signal may correspond to the least significant bit of the digital correction code. The positive input P is set substantially equal to the negative input M (P=M) by the correction, and a correction signal is varied by changing the digital correction code in steps, for example. The digital correction code when the output voltage OUT changes is set as a correction value.

Figure 3:
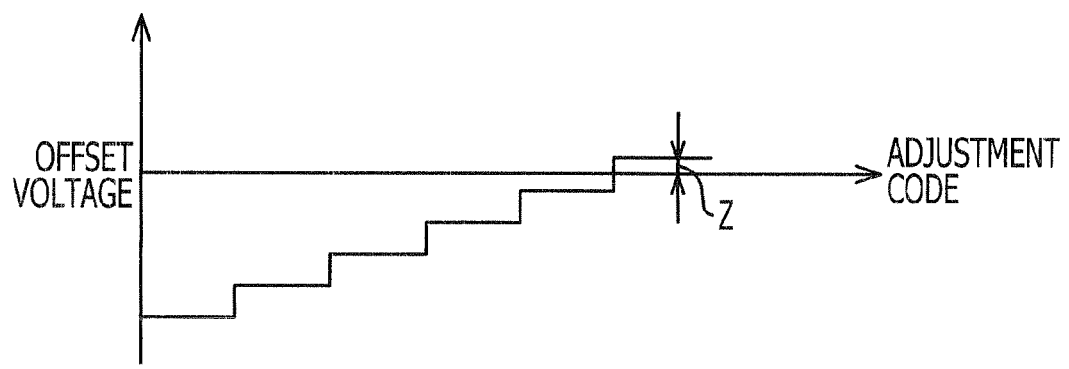
FIG. 3 illustrates an exemplary offset voltage.

FIG. 3 illustrates an exemplary offset voltage. The offset voltage of FIG. 3 may occur in response to a change in the digital correction code of the comparator having a negative offset. If the digital correction code increases in steps, a negative offset voltage increases, exceeds zero (Vos=0), and reaches a positive value. When the offset voltage turns positive, the digital correction code stops increasing. A difference Z between the offset voltage slightly exceeding the zero level and zero is referred to as a residual offset. The absolute value of the residual offset may be smaller than the offset voltage width corresponding to one step of the digital correction code.

Since the digital correction code stops changing when the offset voltage increases and turns positive in FIG. 3, the residual offset may be positive. If the digital correction code stops changing when a positive offset voltage decreases and turns negative, the residual offset may be negative.

The polarity of the residual offset may be determined based on the position of a correction circuit within the comparator, the search method, or the search direction.

Figure 4:
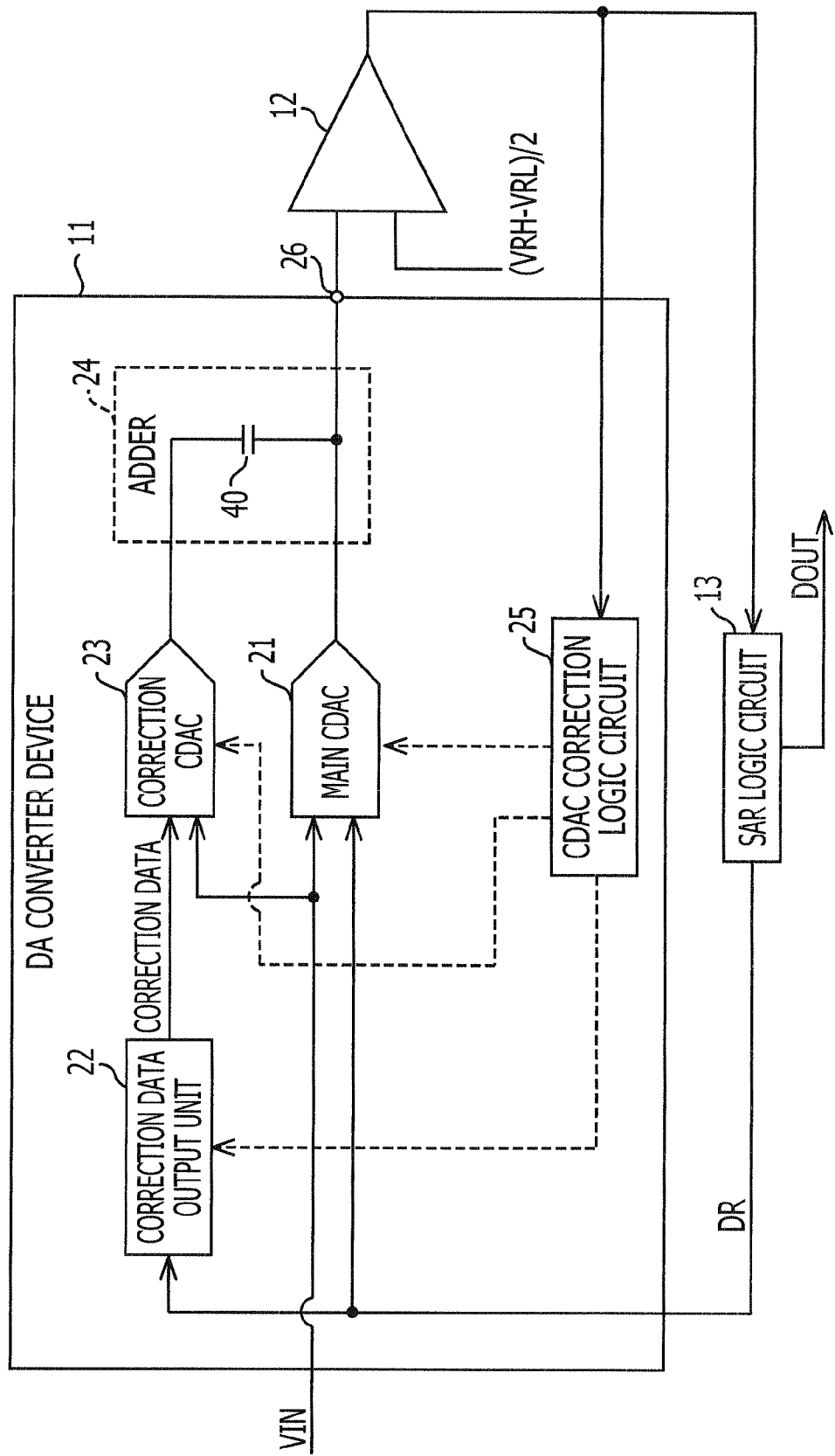
FIG. 4 illustrates an exemplary charge redistribution type SAR-ADC.

FIG. 4 illustrates an exemplary charge redistribution type SAR-ADC. The charge redistribution type SAR-ADC of FIG. 4 may correct an error in a capacitance value of a reference capacitor of the CDAC 11. As the SAR-ADC of FIG. 1, the charge redistribution type SAR-ADC of FIG. 4 includes CDAC 11, comparator 12, and SAR logic circuit 13. The CDAC 11 includes main CDAC 21, correction data output unit 22, correction CDAC 23, adder 24, CDAC correction logic circuit 25, and output terminal 26. The elements included in the main CDAC 21 are substantially the same as or similar to those included in the CDAC 11 of FIG. 1.

In the CDAC 11 of FIG. 4, the correction CDAC 23 generates a correction voltage corresponding to correction data, and adds the correction voltage to the output of the main CDAC 21 via the adder 24. The output of the main CDAC 21 thus linearly varies. The correction data may be determined for each comparison data, and stored on the correction data output unit 22. In a conversion process, the correction CDAC 23 generates a correction voltage in response to the correction data that is read from the correction data output unit 22 in response to comparison data DR from the SAR logic circuit 13. The correction voltage is added via the adder 24 to a main voltage that is generated by the main CDAC 21 in response to the comparison data DR, and a comparison signal whose linearity is corrected is output via the terminal 26.

In the correction process, the correction data may be determined on a per bit basis of the comparison data DR or on a per step basis of the data. For example, if the capacitance values of the reference capacitors change in a power of 2, the sum of capacitance values of the lower side capacitors is substantially equal to the capacitance value of an upper side capacitor. For example, if eight-bit comparison data DR is 10000000, the reference capacitance at the most significant position may be substantially equal to the sum of a capacitance at lower position and a dummy capacitance. A capacitance when the reference capacitor at the most significant position is coupled to VRH and the other capacitors and the dummy capacitor is coupled to VRL may be substantially equal to a capacitance when the reference capacitor at the most significant position is coupled to VRL and the other capacitors and the dummy capacitor is coupled to VRH. The correction data is set to a certain value, and reference voltages are sampled and compared in accordance with the two capacitances. Whether to increase or decrease the digital correction code is determined based on the comparison results. A correction code is stored when the comparison results are changed. A state where a correction voltage corresponding to the correction data is applied corresponds to a state where the reference capacitor at the most significant position is substantially equal to the sum of the capacitance of the capacitor at the lower position and the dummy capacitor. The correction data is determined based on the comparison data DR, and stored in the correction data output unit 22.

Figure 5A:
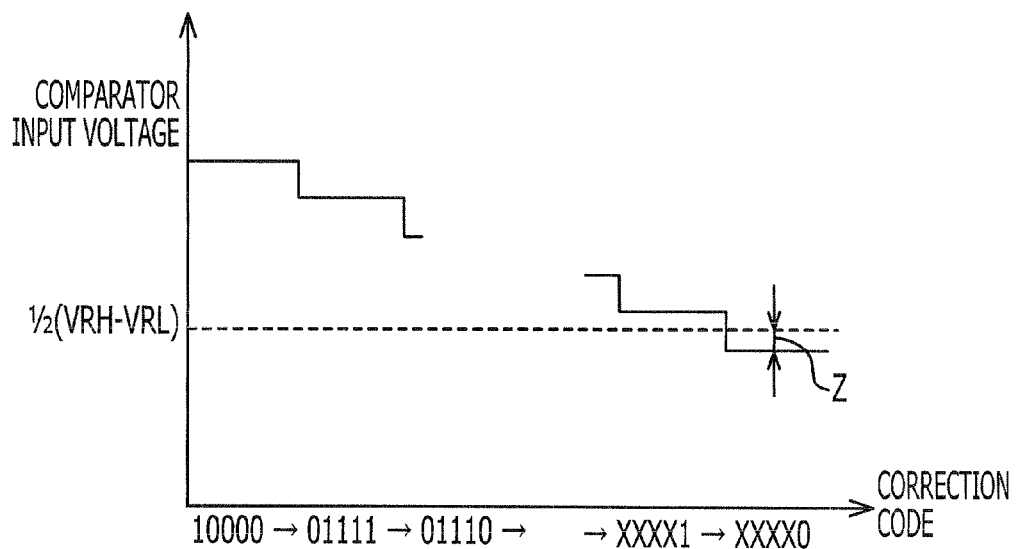
FIGS. 5A and 5B illustrate an exemplary input voltage to a comparator.
Figure 5B:
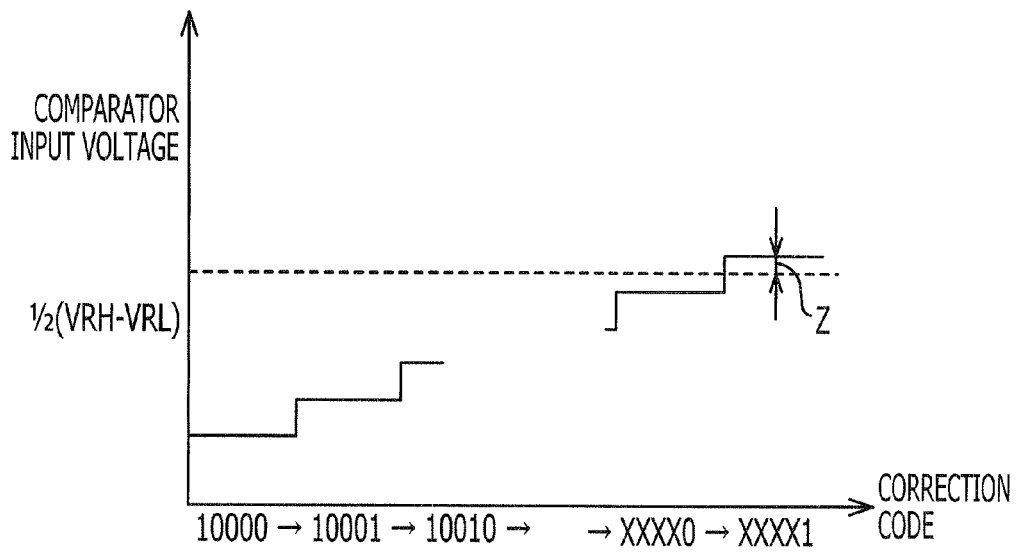

FIGS. 5A and 5B illustrate an exemplary comparator input voltage. FIGS. 5A and 5B illustrate a comparison signal at the terminal 26 when the correction code is changed, for example, via a change in the comparator input voltage. Whether the correction code is increased or decreased is determined. Since, in FIG. 5A, a correction voltage is reduced and the correction code is reduced, the comparator input voltage is reduced. When the comparator input voltage falls below a reference voltage (VRH−VRL)/2, the correction code is determined. The residual error related to the determination of the comparator may have a negative polarity. Since, in FIG. 5B, the correction code increases and the correction voltage increases, the comparator input voltage is increased. When the comparator input voltage exceeds the reference voltage (VRH−VRL)/2, the correction code is determined. The residual error related to the determination of the comparator may have a positive polarity.

As illustrated in FIG. 4, the linearity of the CDAC is corrected for each comparison data unit. A variety of methods for correcting errors of CDAC may be applied.

The polarity of the residual error when the CDAC 11 is corrected in response to the correction code may be determined in accordance with a correction method, such as a search direction.

Similarly to the offset, the residual error in the correction of the CDAC 11 may affect the determination results of the comparator 12.

Figure 6:
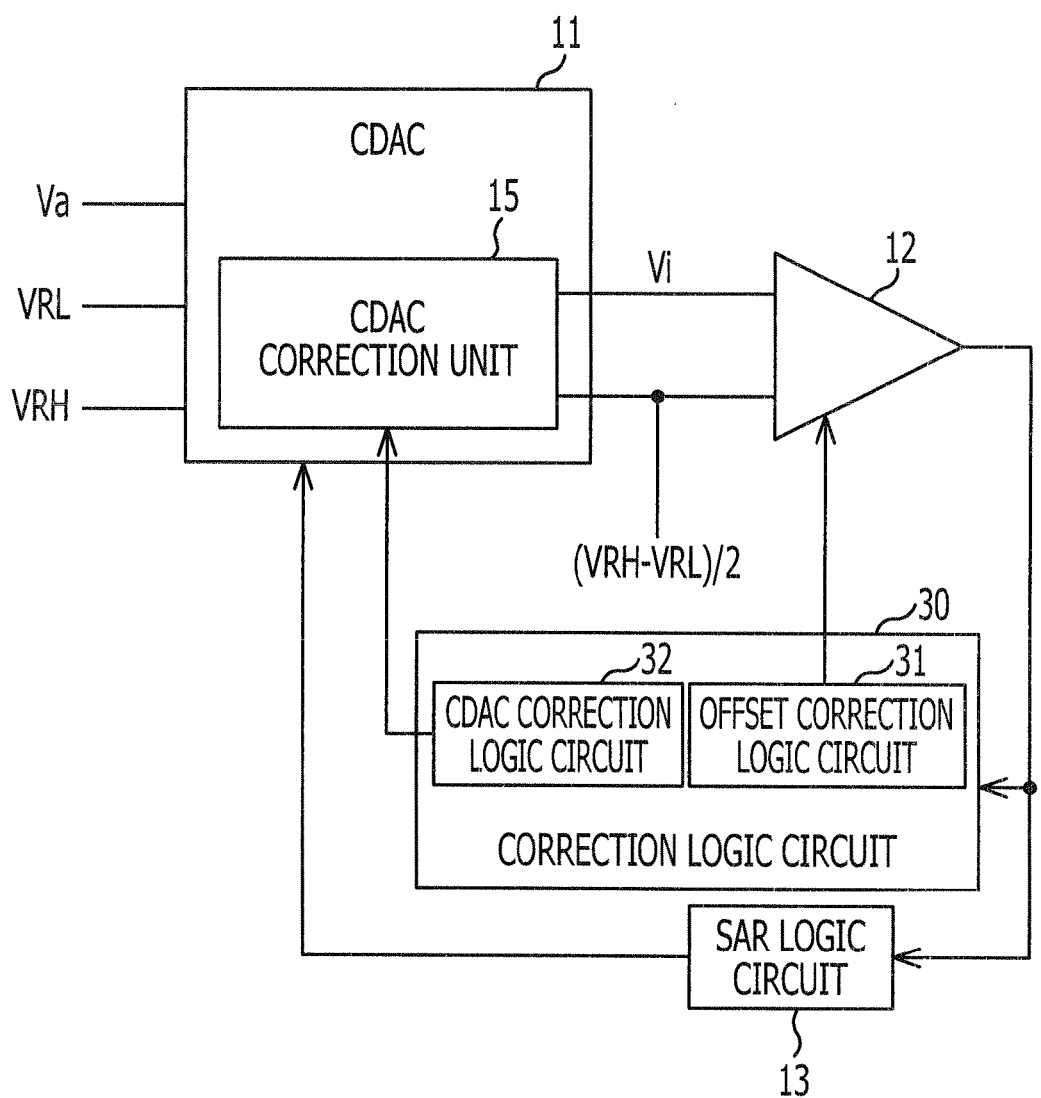
FIG. 6 illustrates an exemplary ADC device.

FIG. 6 illustrates an exemplary AD converter device. The AD converter device of FIG. 6 includes CDAC 11, comparator 12, SAR logic circuit 13, and correction logic circuit 30. The CDAC 11 receives the analog signal Va, the upper reference voltage VRH, the lower reference voltage VRL, and the reference voltage (VRH−VRL)/2. The CDAC 11 includes a CDAC correction unit 15 that corrects a capacitive digital-to-analog converter (CDAC) error in response to a CDAC correction code from the correction logic circuit 30. The CDAC correction may include a correction other than the correction for each the comparison data of FIG. 4. The comparator 12 may correct the offset in response to an offset correction code from the correction logic circuit 30. The SAR logic circuit 13 controls the switches of the CDAC 11 in response to the comparison results of the comparator 12, and determines an AD conversion value so that an output voltage Vi of the CDAC 11 approaches the reference voltage (VRH−VRL)/2.

The correction logic circuit 30 includes an offset correction logic circuit 31 and a CDAC correction logic circuit 32. The offset correction logic circuit 31 determines the offset correction code for correcting the offset of the comparator 12. The CDAC correction logic circuit 32 determines the CDAC correction code for correcting the error of the CDAC 11. The offset correction logic circuit 31 and the CDAC correction logic circuit 32 cancel the residual offset when correcting the offset of the comparator 12 and the residual error when correcting the error of the CDAC 11 with each other. An offset correction circuit includes a circuit for correcting the offset arranged in the comparator 12 and the offset correction logic circuit 31. A CDAC correction circuit includes the CDAC correction unit 15 in the CDAC 11 and the CDAC correction logic circuit 32.

Each of the SAR logic circuit 13, the offset correction logic circuit 31, and the CDAC correction logic circuit 32 may include a logic circuit or a microcomputer. A single microcomputer may include the SAR logic circuit 13, the offset correction logic circuit 31, and the CDAC correction logic circuit 32.

The AD converter device may correct the offset of the comparator 12 in response to the correction code, and correct the CDAC 11 in response to the correction code. When the offset of the comparator 12 is corrected in response to the correction code, a residual offset may occur. When the CDAC 11 is corrected in response to the correction code, a residual error may occur. The residual offset and the residual error of the CDAC 11 may affect the determination of the comparator 12.

FIGS. 7A and 7B illustrate an exemplary residual error. FIGS. 7A and 7B illustrate a relationship between the residual offset and the residual error of the CDAC 11. As illustrated in FIG. 7A, the error of the CDAC 11 is corrected in the search direction of increasing the correction code. As illustrated in FIG. 7B, the error of the CDAC 11 is corrected in the search direction of decreasing the correction code.

As illustrated in FIG. 7A, a solid line represents the reference voltage (VRH−VRL)/2. The residual offset of the comparator 12 may be p. If the residual offset is positive, the determination threshold value of the comparator 12 may be shifted upward by p, thereby becoming an upper determination level (VRH−VRL)/2+p. If the residual offset is negative, the determination threshold value of the comparator 12 may be shifted downward by p, thereby becoming a lower determination level (VRH−VRL)/2−p.

When the residual offset is negative and the error of the CDAC 11 is corrected in the search direction of increasing the correction code, the increasing of the correction code is stopped, if the correction code exceeds the lower determination level (VRH−VRL)/2−p. Therefore, the correction level of the CDAC 11 may be between the reference voltage and the lower determination level. An error in the determination level of the analog signal Va of the comparator 12 when the offset correction of the comparator 12 and the error correction of the CDAC 11 are complete may be within p. The residual offset of the comparator 12 and the residual error of the CDAC 11 may cancel with each other.

When the residual offset is positive and the error of the CDAC 11 is corrected in the search direction of increasing the correction code, the increasing of the correction code is stopped if the correction code exceeds the lower determination level (VRH−VRL)/2+p. Therefore, the correction level of the CDAC 11 may be off by p or more from the reference voltage. An error in the determination level of the analog signal Va of the comparator 12 when the offset correction of the comparator 12 and the error correction of the CDAC 11 are complete may be over p. The residual offset of the comparator 12 and the residual error of the CDAC 11 may be superimposed with each other.

If the error of the CDAC 11 is corrected in the search direction of reducing the correction code as illustrated in FIG. 7B, the process is opposite to the above-described process. Since the residual offset of the comparator 12 and the residual error of the CDAC 11 cancel with each other when the residual offset is positive, an error in the determination level for the analog signal Va of the comparator 12 may be within p. The residual offset of the comparator 12 and the residual error of the CDAC 11 may be superimposed with each other when the residual offset is negative, an error in the determination level for the analog signal Va of the comparator 12 may be over p.

The error is reduced if the residual offset of the comparator 12 and the residual error of the CDAC 11 cancel with each other, and is increased if the residual offset of the comparator 12 and the residual error of the CDAC 11 are superimposed with each other.

The residual offset may be within a minimum change X of the offset correction of the comparator 12, and the residual error of the CDAC 11 may be within a minimum change Y of the error correction of the CDAC 11. When two correction processes are performed, the final error may be determined based on X or Y, whichever is greater, for example. If the residual offset of the comparator 12 and the residual error of the CDAC 11 cancel with each other, the resulting error becomes smaller than X or Y, whichever is greater. If the residual offset of the comparator 12 and the residual error of the CDAC 11 are superimposed with each other, the final error may be greater than X or Y, whichever is greater.

The AD converter device is adjusted based on whether the residual offset of the comparator 12 and the residual error of the CDAC 11 cancel with each other or they are superimposed with each other. For example, when the residual offset of the comparator 12 and the residual error of the CDAC 11 cancel with each other, the correction code determined in the correction process is maintained. When the residual offset of the comparator 12 and the residual error of the CDAC 11 are superimposed with each other, one of the correction codes determined in the correction process is set to be a one-step preceding correction code.

FIG. 8 illustrates an exemplary correction logic process. For example, if the residual offset of the comparator 12 and the residual error of the CDAC 11 have the same polarity, one of the correction codes is modified to the correction code at one step earlier in the correction process.

When the residual offset of the comparator 12 and the residual error of the CDAC 11 have the same polarity and substantially the same size, one of the residual offset of the comparator 12 and the residual error of the CDAC 11 may be corrected. When the residual offset of the comparator 12 and the residual error of the CDAC 11 have the same polarity and different sizes, the correction code corresponding to the smaller size may be shifted back by two steps or more. For example, if the minimum change in the offset correction of the comparator 12 is twice the minimum change in the error correction of the CDAC 11, the CDAC 11 is corrected after the offset correction of the comparator 12. If the residual offset of the comparator 12 and the residual error of the CDAC 11 have the same polarity, the correction code of the CDAC 11 may be shifted back by two steps.

The polarities of the residual offset of the comparator 12 and the residual error of the CDAC 11 may be different depending on the correction position, or the search method (search direction).

Figure 9:
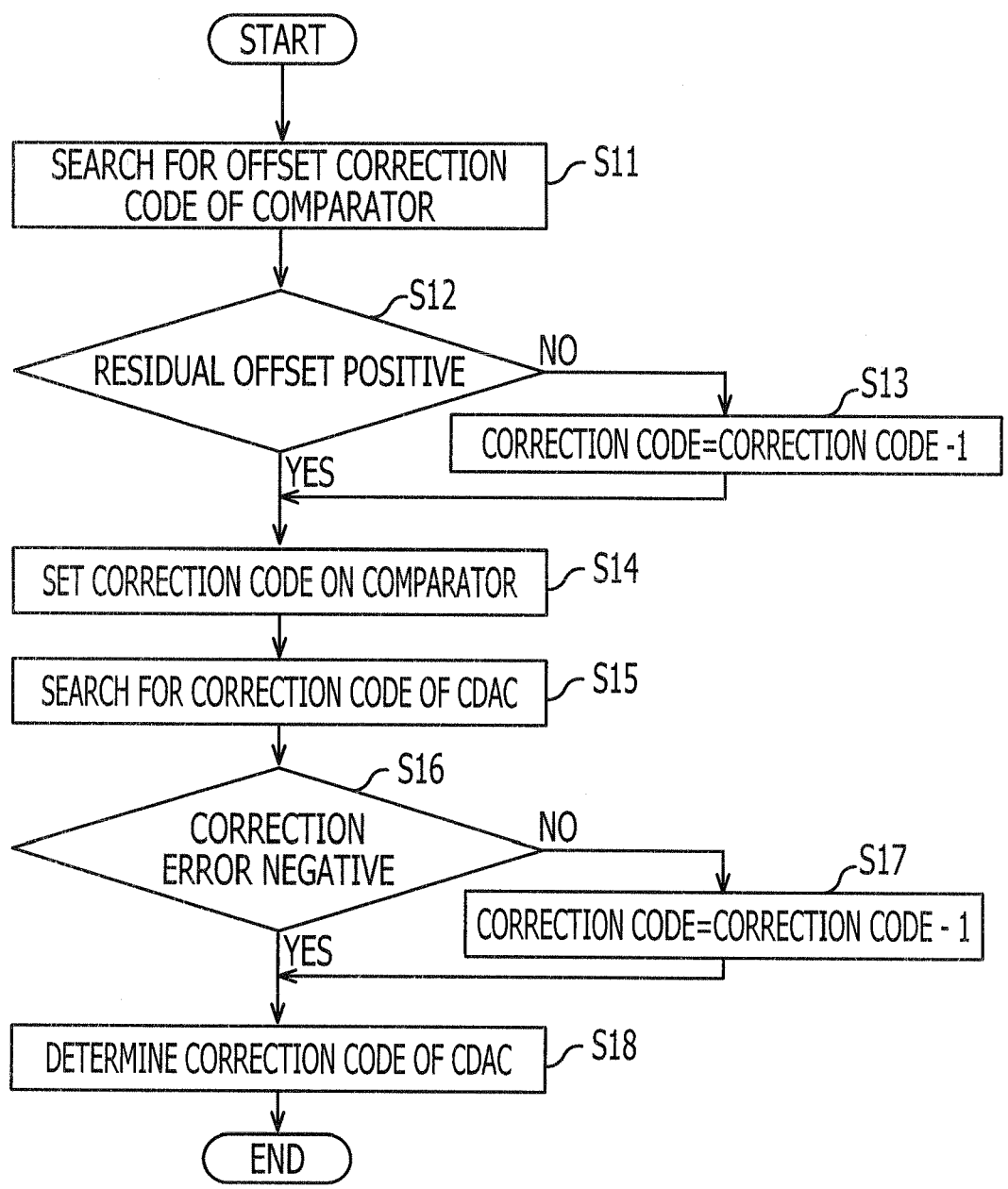
FIG. 9 illustrates an exemplary correction process.

FIG. 9 illustrates an exemplary correction process. The residual offset of the comparator to be corrected first is set to be a certain polarity, for example, positive. The residual error of the CDAC is corrected. If the CDAC residual error is negative, the CDAC correction code determined in the correction is maintained. If the CDAC residual error is positive, the CDAC correction code determined in the correction is set to the correction code from one step preceding.

In an operation S11, the offset correction logic circuit searches for and determines the offset correction code in order to correct the offset of the comparator.

In an operation S12, the offset correction logic circuit 31 determines whether the residual offset of the offset correction code is positive or negative. If the residual offset is positive, the process proceeds to an operation S14, and if the residual offset is negative, the process proceeds to an operation S13.

In the operation S13, the offset correction logic circuit changes the offset correction code to an offset correction code at one step earlier than the offset correction code at which the search operation is being performed.

The offset correction code for a positive residual offset is determined.

In operation the S14, the offset correction logic circuit sets the offset correction code on the comparator 12.

In an operation S15, the CDAC correction logic circuit searches for and determines the CDAC correction code in order to correct the error of the CDAC.

In the operation S16, the CDAC correction logic circuit 32 determines whether the residual error of the CDAC correction code is positive or negative. If the residual error of the CDAC correction code is positive, process proceeds to an operation S17. If the residual error of the CDAC correction code is negative, process proceeds to an operation S18.

In the operation S17, the CDAC correction logic circuit changes the CDAC correction code to a CDAC correction code at one step earlier than the CDAC correction code at which the search operation is being performed.

In the operation S18, the CDAC correction code for the negative residual error is determined.

The CDAC correction code is stored in the CDAC correction circuit of the CDAC.

Figure 10:
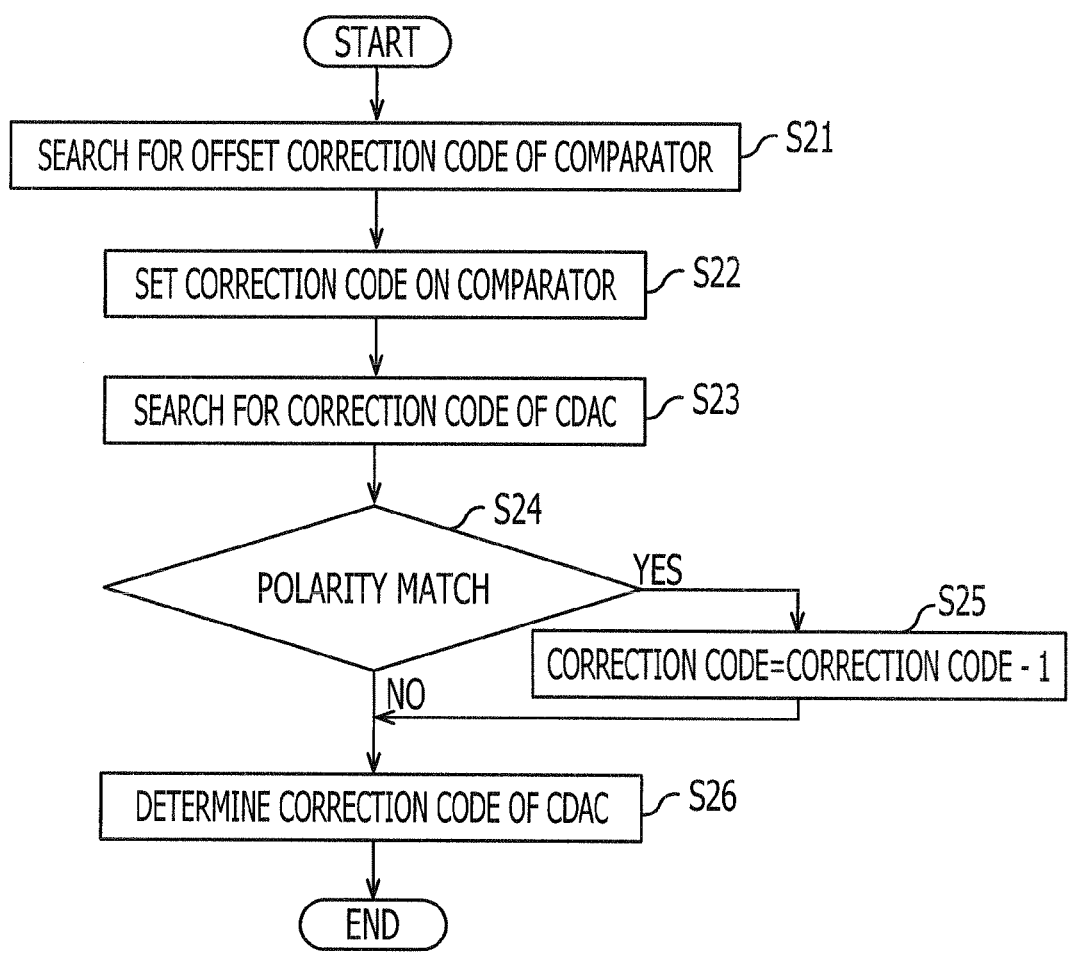
FIG. 10 illustrates an exemplary correction process.

FIG. 10 illustrates an exemplary correction process. An offset is first set in the comparator, and then the error of the CDAC is corrected. It is then determined whether the polarity of the residual error in the error correction of the CDAC matches the polarity of the residual offset. If the residual error and the residual error are different in polarity, the CDAC correction code is maintained. If the residual error and the residual error have the same polarity, the CDAC correction code determined in the correction is shifted back to be the correction code from one step preceding.

In an operation S21, the offset correction logic circuit searches for and determines the offset correction code in order to correct the offset of the comparator.

In an operation S22, the offset correction logic circuit sets the offset correction code to the comparator.

In an operation S23, the CDAC correction logic circuit 32 searches for and determines the CDAC correction code in order to correct the error of the CDAC.

In an operation S24, the CDAC correction logic circuit 32 determines whether the residual offset and the residual error of the CDAC have the same polarity. If the residual offset and the residual error of the CDAC are different in polarity, process proceeds to an operation S26. If the residual offset and the residual error of the CDAC 11 have the same polarity, process proceeds to an operation S25.

In the operation S25, the CDAC correction logic circuit 32 changes the CDAC correction code to a CDAC correction code one step earlier than the CDAC correction code at which the search operation is being performed.

In the operation S26, the CDAC correction code having a residual error whose polarity is opposite to a polarity of the residual offset is determined.

The determined CDAC correction code is stored in the CDAC correction unit.

Figure 11:
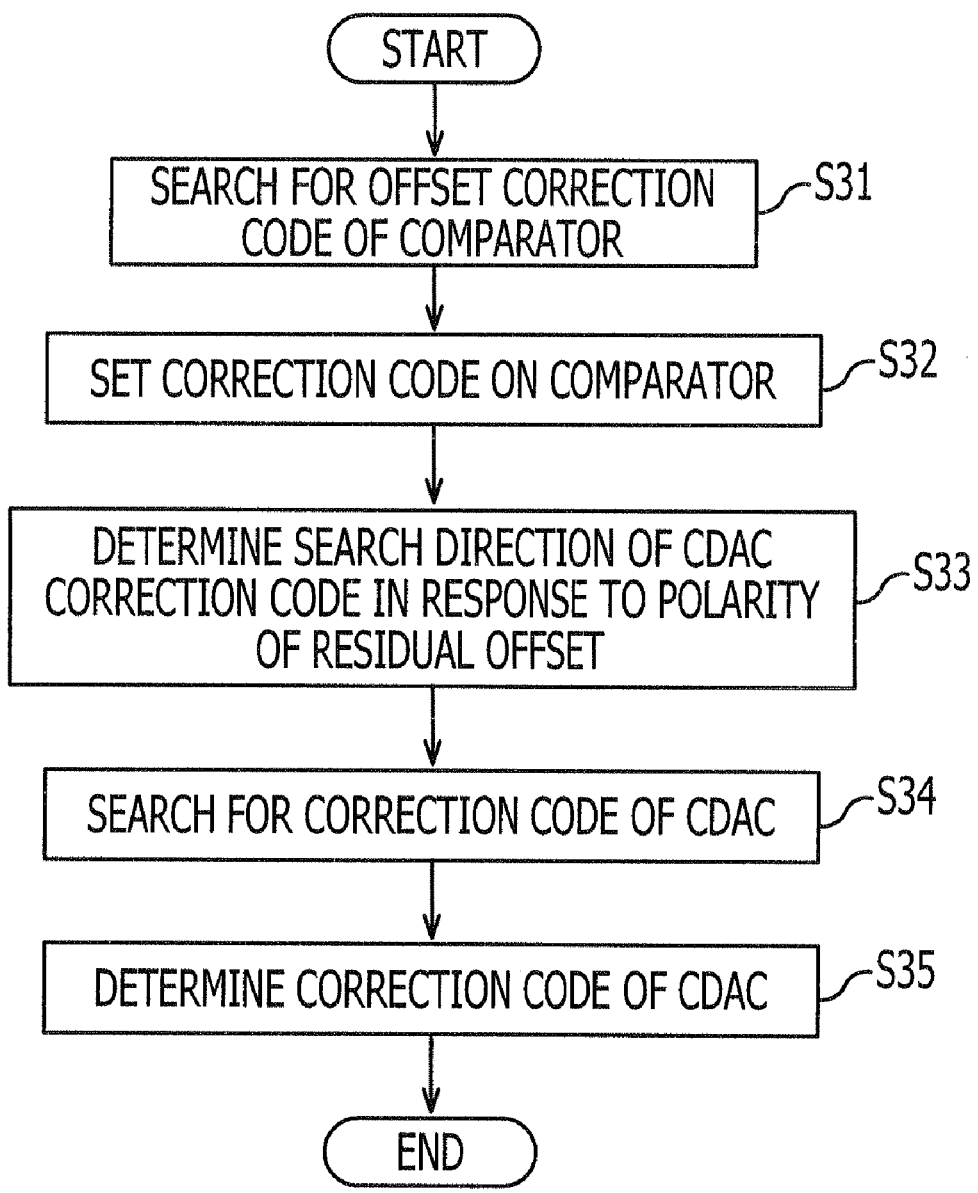
FIG. 11 illustrates an exemplary correction process.

FIG. 11 illustrates an exemplary correction process. The offset of the comparator is corrected. The search direction of the CDAC correction code in the error correction of the CDAC is selected so that the residual offset and the residual error of the CDAC cancel each other based on the polarity of the residual offset.

In an operation S31, the offset correction logic circuit 31 searches for and determines the offset correction code in order to correct the offset of the comparator.

In an operation S32, the offset correction logic circuit 31 sets the offset correction code to the comparator 12.

In an operation S33, the CDAC correction logic circuit 32 determines the search direction of the CDAC correction code of the error correction of the CDAC so that the residual offset and the residual error of the CDAC cancel each other based on the polarity of the residual offset.

In an operation S34, the CDAC correction logic circuit searches the CDAC correction code in the set search direction in order to correct the error of the CDAC.

In an operation S35, the CDAC correction logic circuit sets the CDAC correction code.

The set CDAC correction code is stored in the CDAC correction unit in the CDAC.

Figure 12:
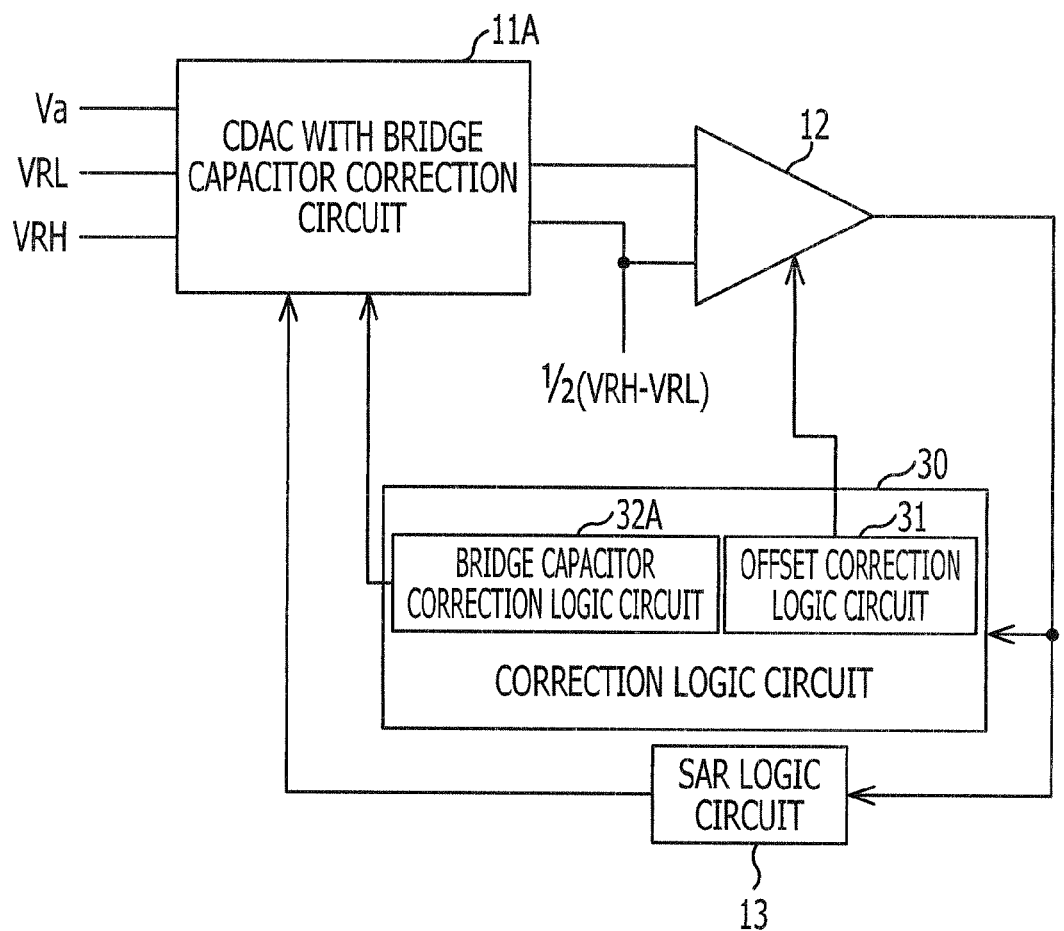
FIG. 12 illustrates an exemplary ADC device.

FIG. 12 illustrates an exemplary AD converter device.

The AD converter device of FIG. 12 includes CDAC 11A, comparator 12, SAR logic circuit 13, and correction logic circuit 30. The CDAC 11A receives the analog signal Va, the upper reference voltage VRH, the lower reference voltage VRL, and the reference voltage (VRH−VRL)/2. The CDAC 11A includes a bridge capacitance correction circuit correcting an error in the bridge capacitance in response to the CDAC correction code. The offset of the comparator 12 may be corrected in response to the offset correction code. The SAR logic circuit 13 controls the switches of the CDAC 11 in response to the comparison results of the comparator 12, and determines the AD conversion value so that the output voltage Vi of the CDAC 11 approaches the reference voltage (VRH−VRL)/2.

The correction logic circuit 30 includes an offset correction logic circuit 31 controlling the offset correction, and a bridge capacitance correction logic circuit 32A correcting a bridge capacitance error of the CDAC 11A.

The offset correction logic circuit 31 sets the polarity of the residual offset of the comparator 12 to positive. The bridge capacitance correction logic circuit 32A reduces the bridge capacitance of the CDAC 11A with the bridge capacitance correction function in a stepwise fashion from the positive side to the negative side, and ends the correction when the output of the comparator 12 turns negative. In FIG. 11, the correction logic circuit 30 sets the polarity of the residual offset to positive, sets a correction direction of the residual error to a negative correction direction, and corrects the bridge capacitance. The process of setting the polarity of the residual offset to positive may be substantially the same as the first half of the process illustrated in FIG. 9.

Figure 13:
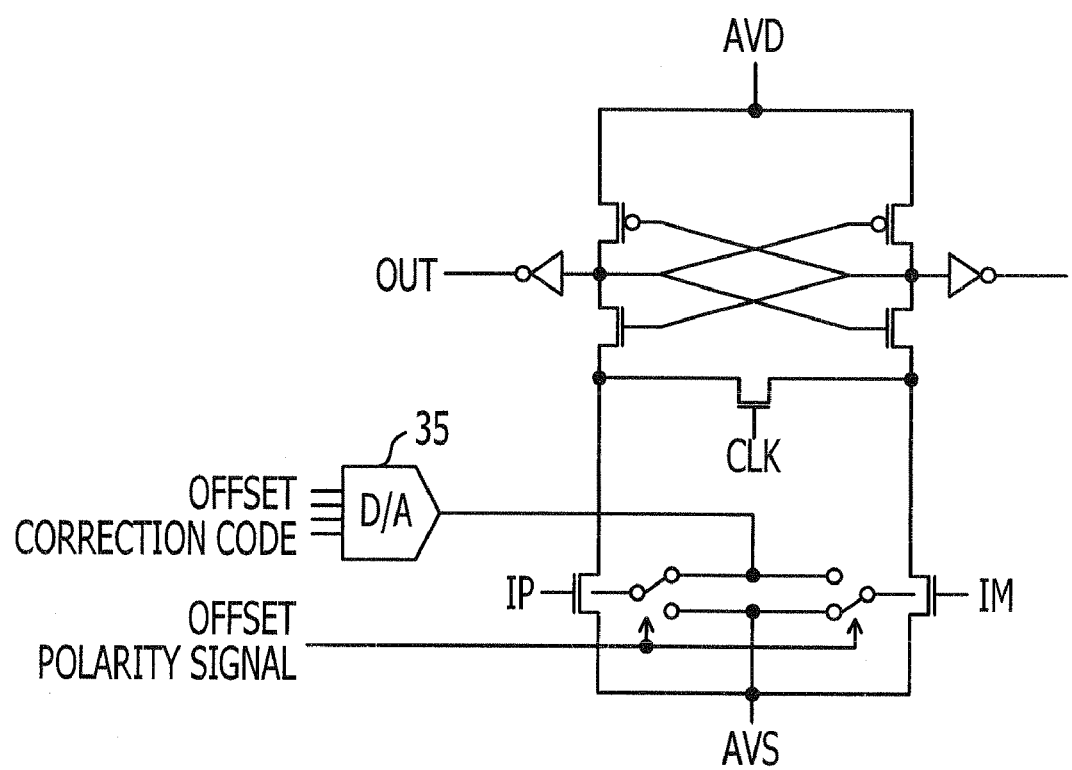
FIG. 13 illustrates an exemplary comparator.

FIG. 13 illustrates an exemplary comparator 12. The comparator 12 of FIG. 13 may be included in the AD converter device of FIG. 12. The comparator 12, including a differential amplifier, compares the voltage at the positive input terminal IP with the voltage at the negative input terminal IM, and outputs the comparison results OUT. The comparator 12 includes a digital-to-analog (DA) converter 35 for digital-to-analog converting the offset correction code into a voltage signal, and switches for selecting one of the channels (wells) of transistors, which respectively receives the positive input P and the negative input M at the gates thereof, and applying the output voltage from the DA converter 35. The offset of the comparator 12 is thus corrected. The channels of the input transistors, respectively receiving at the gates thereof the positive input P and the negative input M, are switched between one state, where one channel is coupled to a low voltage source AVS and the other channel is coupled to the output of the DA converter 35, and the other state, where the one channel is coupled to the output of the DA converter 35 and the other is coupled to the low voltage source AVS. A reset transistor, which is coupled between opposed signal paths and receives a clock CLK at the gate thereof, switches between a reset state and a comparison state in response to the clock CLK.

The differential amplifier included in the comparator 12 may be an ordinary comparator. An offset occurs due to a difference between currents flowing through two opposed signal paths. For this reason, a voltage applied to the channel of an input transistor of a signal path having a small current flowing is increased in response to an offset polarity signal so that a current difference between the currents flowing through the two signal paths is reduced.

Figure 14:
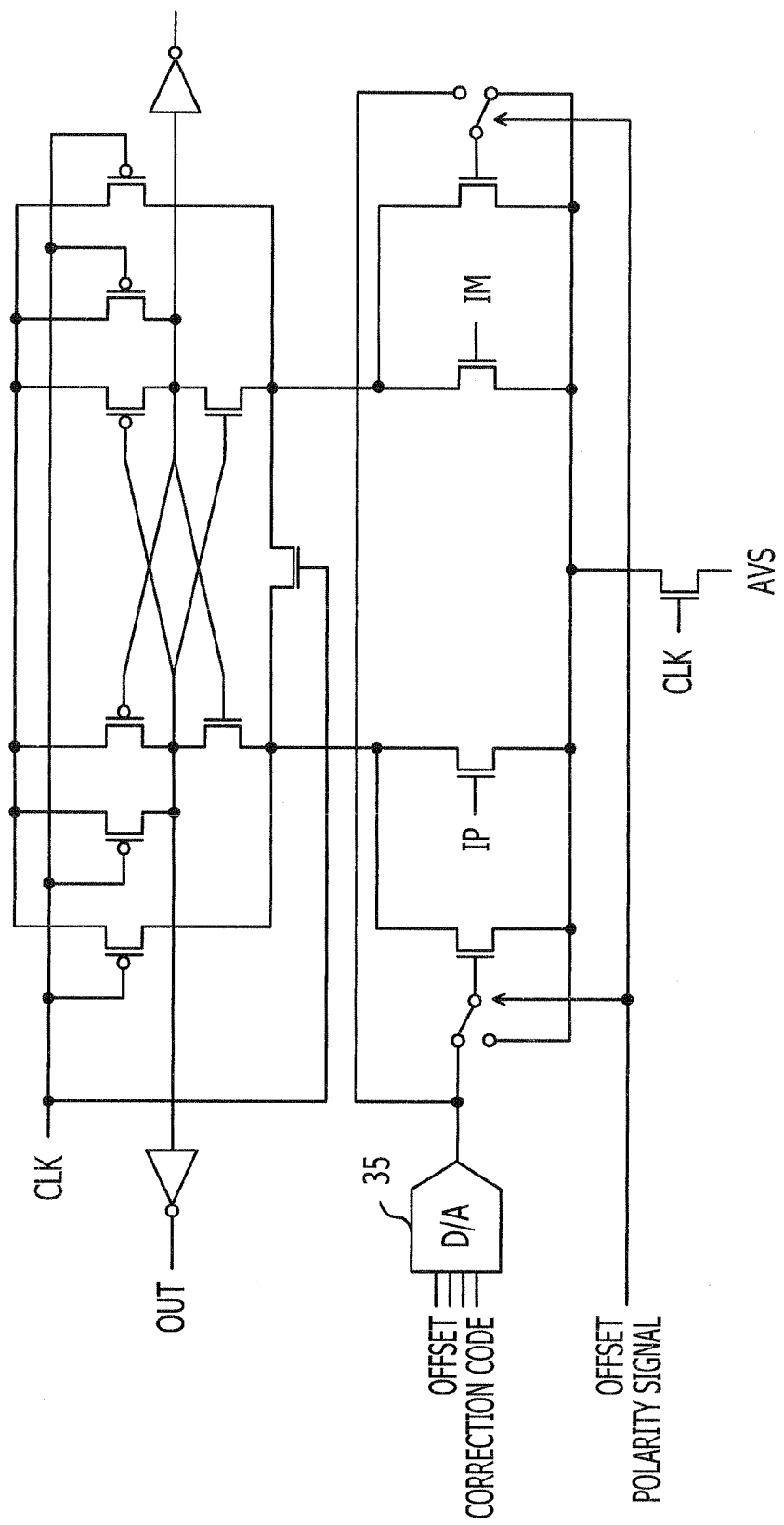
FIG. 14 illustrates an exemplary comparator.
Figure 15:
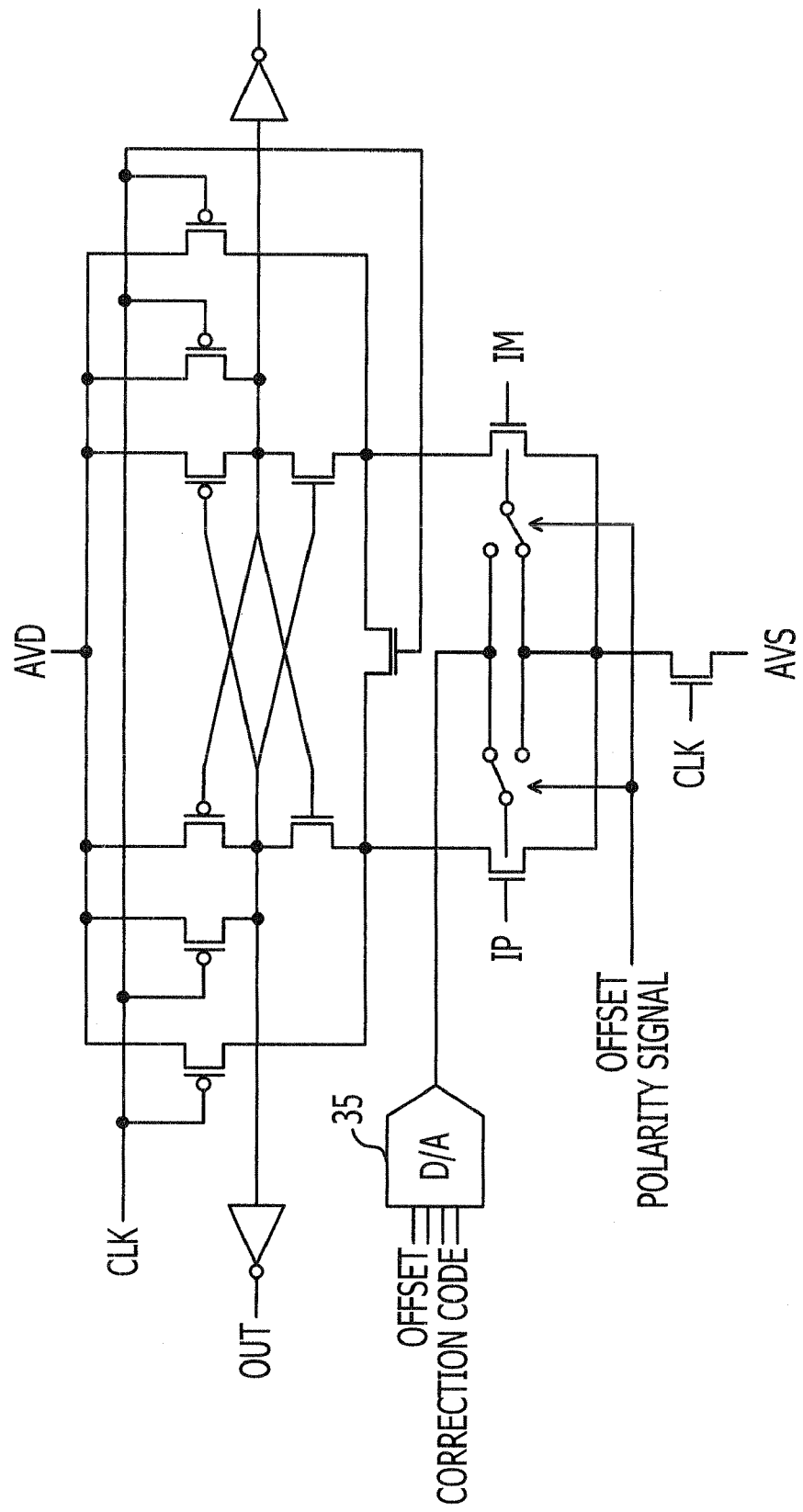
FIG. 15 illustrates an exemplary comparator.
Figure 16:
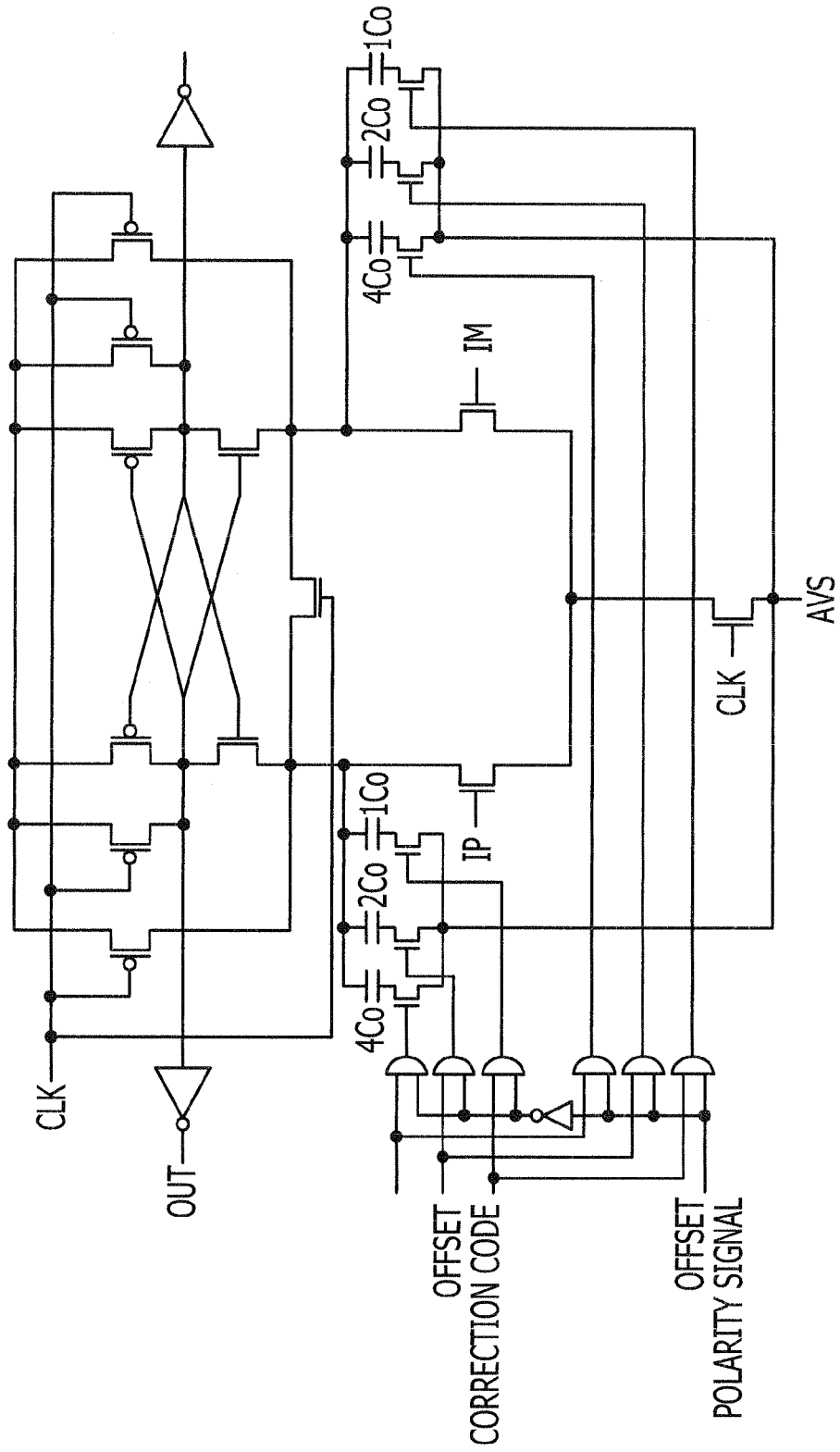
FIG. 16 illustrates an exemplary comparator.

FIGS. 14-16 illustrate an exemplary comparator.

Referring to FIG. 14, an input transistor receiving at the gate thereof the positive input P and an input transistor receiving at the gate thereof the negative input M are arranged in parallel. Two states are alternately switched in response to an offset polarity signal. In one state, the gate of the one transistor is coupled to the low voltage source AVS and the gate of the other transistor is coupled to the output of the DA converter 35. In the other state, the gate of the one transistor is coupled to the output of the DA converter 35 and the gate of the other transistor is coupled to the low voltage source AVS.

Referring to FIG. 15, a transistor receiving at the gate thereof the clock CLK is arranged in parallel with output P-channel transistors. The remaining elements may be substantially the same as those in FIG. 13. A resetting operation is reliably performed.

In FIG. 16, a capacitance value of capacitors coupled between two opposed paths changes based on the offset correction code. The path coupled to the capacitors is selected in response to the offset polarity signal.

Figure 17:
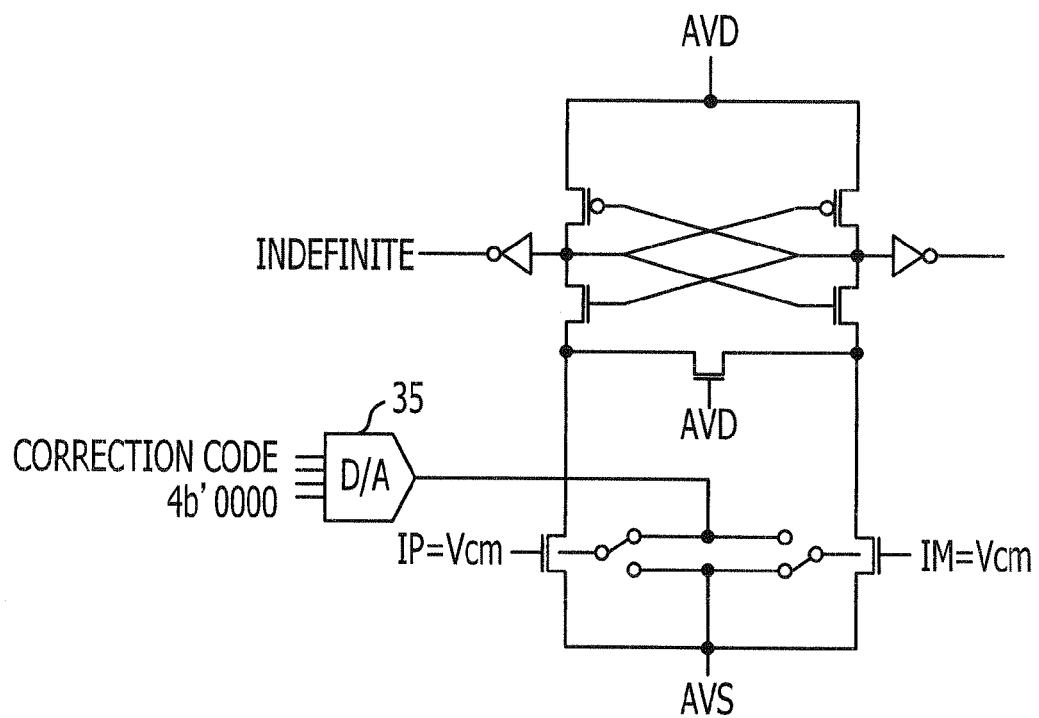
FIG. 17 illustrates an exemplary offset correction.

FIG. 17 illustrates an exemplary offset correction. For example, a four-bit offset correction code "0000" is input. The DA converter 35 may output a voltage which is substantially equal to the low voltage source AVS. Since an output signal line of the CDAC 11A with the bridge capacitance correction function is coupled to the reference voltage (VRH−VRL)/2, the same input signal Vcm is input to the input terminals IP and IM. When a voltage, which is substantially the same as a high voltage source AVD, is output, a reset transistor becomes conductive, thereby short circuiting the opposed paths and establishing a reset state. The output voltage OUT may be indefinite.

Figure 18:
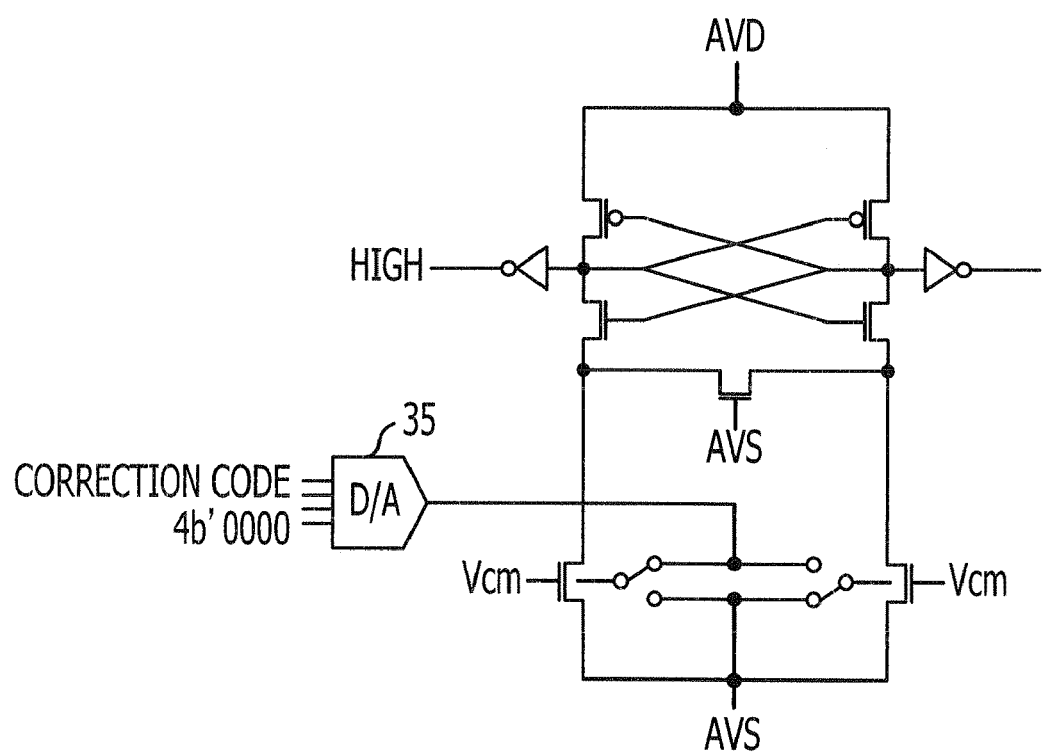
FIG. 18 illustrates an exemplary offset correction.

FIG. 18 illustrates an exemplary offset correction. If CLK outputs a voltage which is substantially the same as the low voltage source AVS, the comparison is performed and the output voltage OUT may be at a high level or at a low level. If the output voltage OUT is at the high level, a current, which is higher than a current flowing through a transistor supplied with the negative input M, flows through a transistor supplied with the positive input P. When the output voltage OUT is at the low level, a current, which is higher than a current flowing through the transistor supplied the positive input P, flows through the transistor supplied with the negative input M. If the output voltage OUT is at the high level, a negative offset is set, and if the output voltage OUT is at the low level, a positive offset is set.

Figure 19:
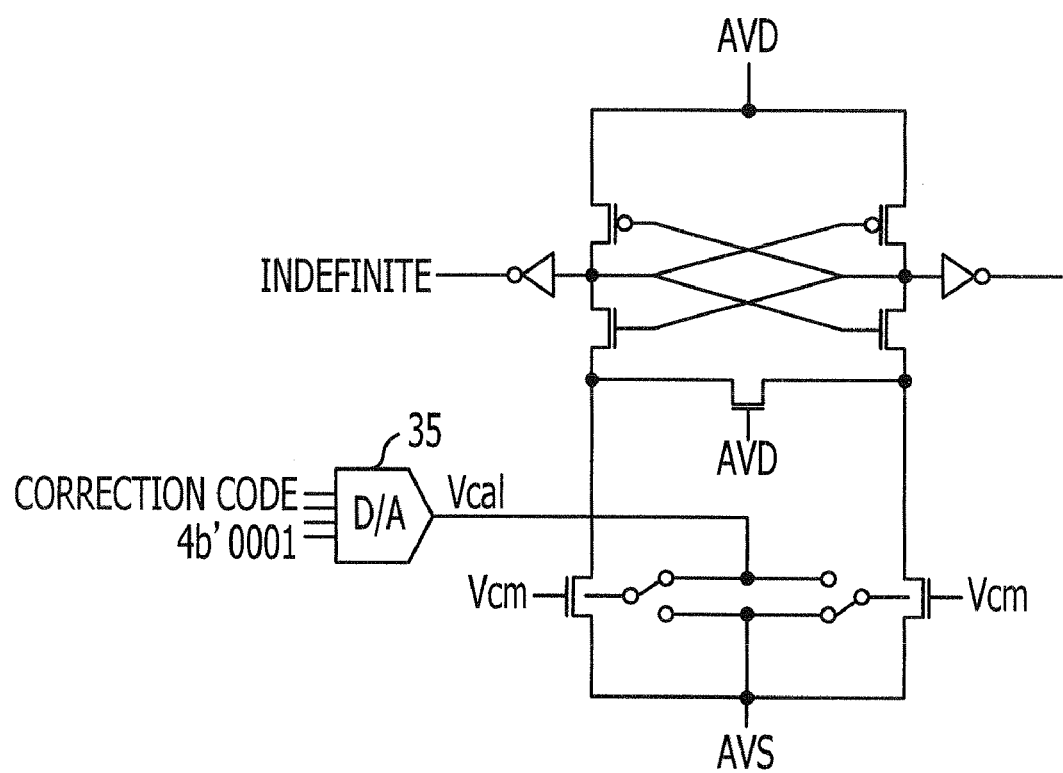
FIG. 19 illustrates an exemplary offset correction.

FIG. 19 illustrates an exemplary offset correction. The offset polarity signal is set so that the channel of the transistor supplied with the positive input P is coupled to the output of the DA converter 35 and the low voltage source AVS is applied to the channel of the transistor supplied with the negative input M. Since the offset correction code is modified to "0001," the DA converter 35 outputs a voltage higher than the low voltage source AVS by a voltage corresponding to one change width. The clock CLK may be the high voltage source AVD, and the output voltage may be indefinite.

Figure 20:
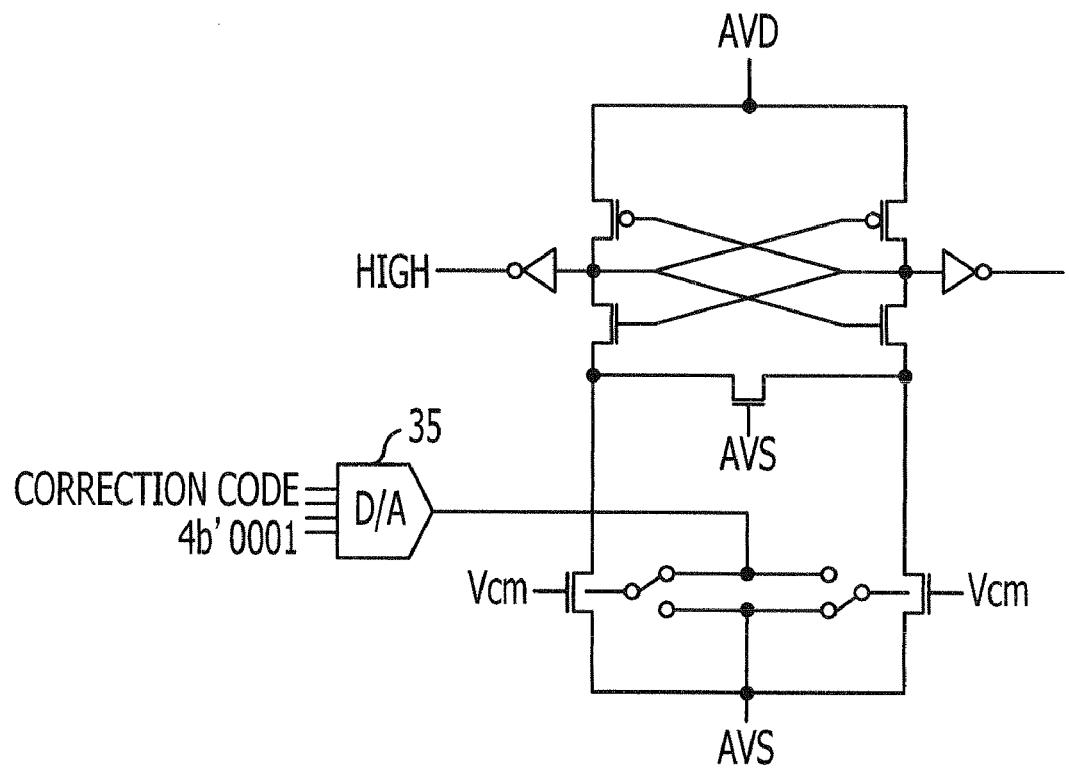
FIG. 20 illustrates an exemplary offset correction.

FIG. 20 illustrates an exemplary offset correction. If the clock CLK outputs a voltage which is substantially the same as the low voltage source AVS, the comparison is performed, and the output voltage OUT may be at a high level or at a low level. If the output voltage OUT is at the high level, a current, which is higher than a current flowing through the transistor supplied with the negative input M, flows through the transistor supplied with the positive input P. If the output voltage OUT is at the low level, a current, which is higher than a current flowing through the transistor supplied with the positive input P, flows through the transistor supplied with the negative input M. If the output voltage OUT is at the low level, the offset turns positive, and "0001" is set as an offset correction code.

If the output voltage OUT is at the high level, the offset is negative. With the offset correction code increased by 1, the process of FIGS. 19 and 20 is repeated. When the output voltage OUT turns low, the offset correction code is determined.

Figure 21:
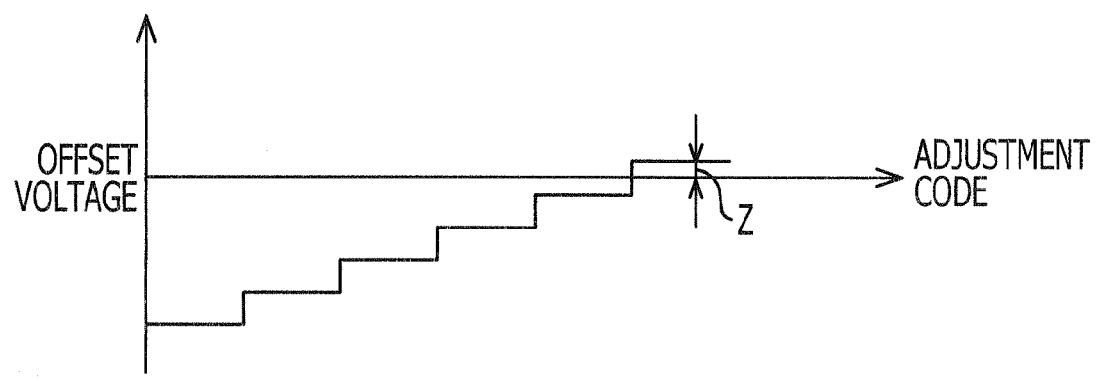
FIG. 21 illustrates an exemplary offset correction.

FIG. 21 illustrates an exemplary offset voltage. Referring to FIG. 21, the offset correction code is searched until the offset, which is negative at the start of the correction process, turns positive. Since the correction process is complete when the offset voltage turns positive, the residual offset may be positive.

Figure 22:
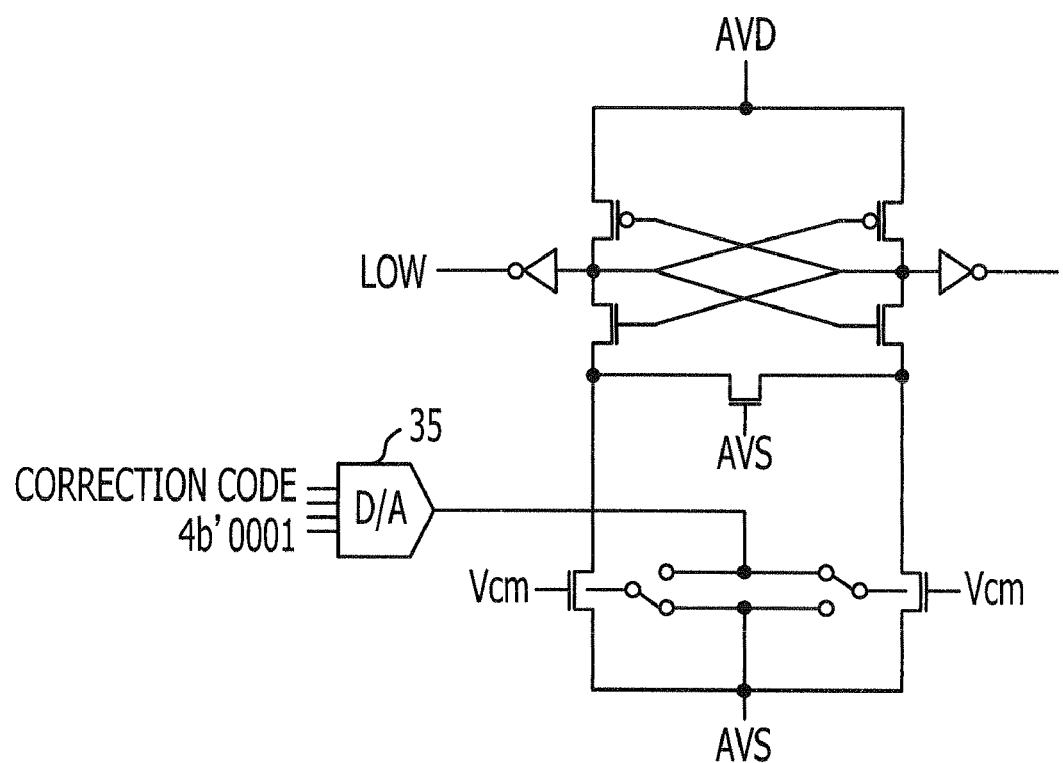
FIG. 22 illustrates an exemplary offset correction.

FIG. 22 illustrates an exemplary offset correction. When the output voltage OUT of FIG. 18 is at a low level, for example, when the offset is positive, the offset polarity signal is set so that the low voltage source AVS is supplied to the channel of the transistor supplied with the positive input IP as illustrated in FIG. 22, and the channel of the transistor supplied with the negative input IM is coupled to the output of the DA converter 35. The offset correction code is modified to "0001." The process may be repeated until the output voltage OUT turns positive.

Figure 23:
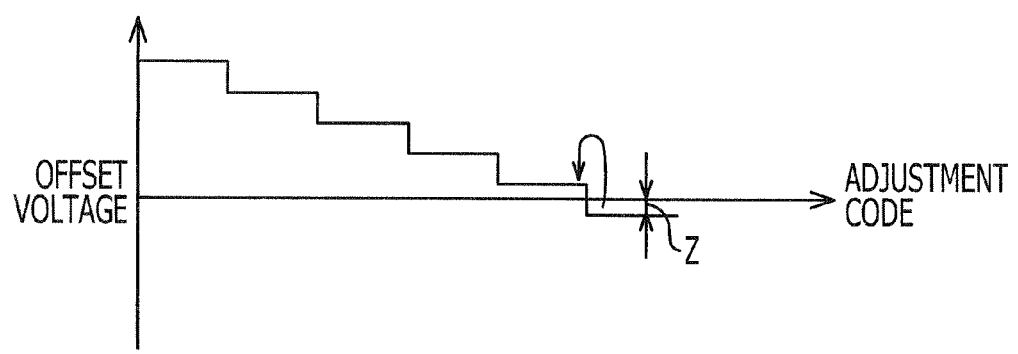
FIG. 23 illustrates an exemplary offset correction.

FIG. 23 illustrates an exemplary offset voltage. In FIG. 23, the offset correction code is searched until the offset, which is positive at the start of the correction process, turns negative.

The correction process is complete when the offset voltage turns negative. The residual offset may be negative.

If the residual offset is set to be positive as illustrated in FIG. 9, the offset correction code when the offset voltage of FIG. 23 turns negative is set to be the one-step preceding offset correction code. For this reason, the residual offset may be positive.

Figure 24:
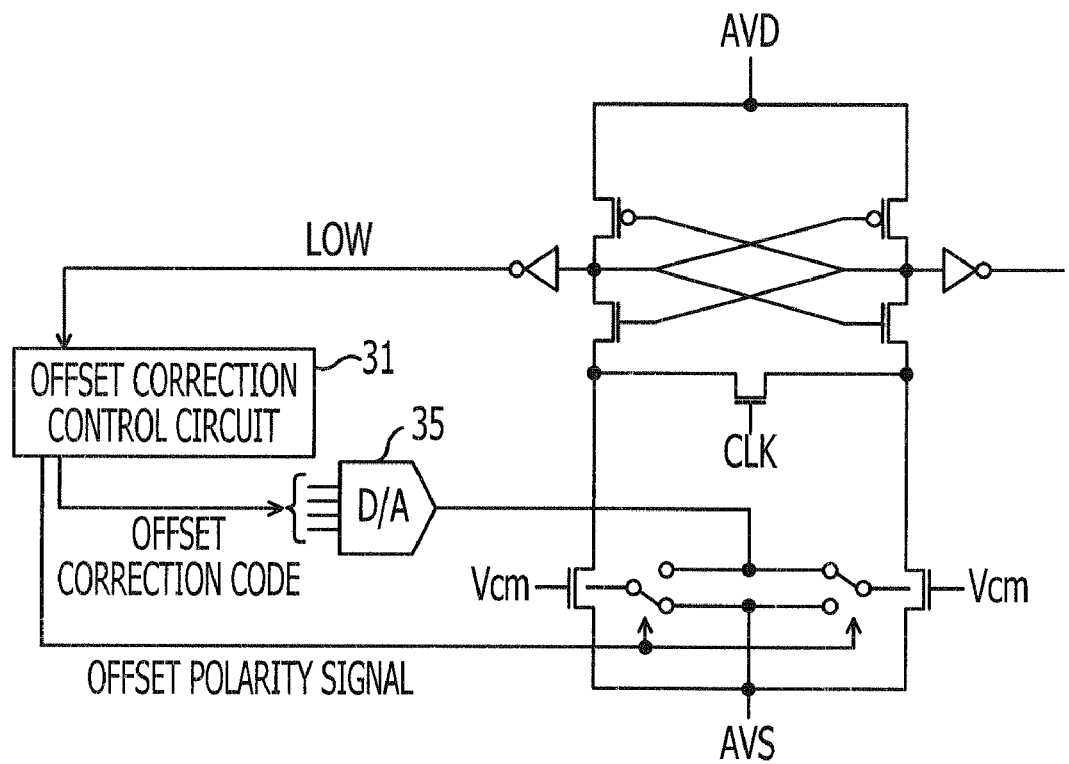
FIG. 24 illustrates an exemplary offset correction logic circuit and an exemplary comparator.

FIG. 24 illustrates an exemplary offset correction logic circuit 31 and the comparator 12. The DA converter 35 may be included in the correction logic circuit 30 or the comparator 12. As illustrated in FIG. 9, the offset correction logic circuit 31 may perform the offset correction so that the residual offset turns positive.

As illustrated in FIG. 24, the offset correction logic circuit 31 receives the output voltage OUT from the comparator 12, outputs the offset correction code to the DA converter 35, and outputs the offset polarity signal to the switches of the input transistors of the comparator 12.

A counter 50 outputs zero correction code at an initialization, and the DA converter 35 outputs a voltage at substantially the same voltage as the low voltage source AVS. Through a first comparison operation, the offset polarity signal is determined based on the comparison results. The counter increases the correction code until the comparison result is changed. The counter stops increasing the correction code when the comparison result changes. When the residual offset is positive, the correction code is maintained. When the residual offset is negative, the correction code is shifted back to the correction code from one preceding.

The four-bit counter 50 may output "0000" When it is initialized. When XEN=H is established, the counter 50 counts up in synchronization with the clock CLK. An FF group 51 holds the immediately preceding count value of the counter 50. When SEL=H is established, the selector 52 selects the value of the counter 50 at an A input thereof. When SEL=L is established, the selector 52 selects a one-step preceding value of the counter 50 held by the FF group 51 at a B input thereof. The selector 52 selects the A input from the output of the counter 50 when SEL=H is established, and selects the B input from the output of the FF group 51.

Three flip-flops FF 44, FF 46, and FF 47 may output a low signal at an initialization. An EXNOR gate 48 may output a high signal, and the selector 52 may select an initial value 0000 of the counter 50 at a start of the correction. Since a signal indicating a correction becomes high at the start of the correction, SEL of the selector 54 becomes high at the start of the correction. The selector 52 may output the initial value 0000 as a correction code. The comparator 12 performs a first-round determination process, thereby determining whether the offset is positive or negative.

If the correction process active signal is at a high level, the clock CLK is supplied to the three flip-flops FF 44, FF 46, and FF 47 and the counter 50.

A first-determination round signal may be set to be high in the middle of the first determination round. The output voltage OUT of the comparator 12 in the first-round determination represents the polarity of the comparator 12. Upon receiving the output voltage OUT, the FF 46 outputs the offset polarity signal in response to the clock CLK passing through an AND gate 42 during the first-round determination. During the determination period of second and subsequent rounds of determination, the offset polarity signal is maintained because the clock CLK does not pass through the AND gate 42.

The output voltage OUT of the comparator 12 is supplied to the FF 44. The output voltage OUT passes through an AND gate 43 and reaches one input of a NOR gate 45 during the first-round determination. Since the other input of the NOR gate 45 is at a low level during the first-round determination, the output voltage OUT of the comparator 12 is supplied to the FF 47. The FF 44 and the FF 47 may hold first determination results in response to a change in the clock CLK subsequent to the first-round determination.

Since the FF 47 outputs a low signal at the initialization, XEN remains high (XEN=H) during the first-round determination. The counter 50 counts up by 1 in response to a change in the clock CLK.

During the second comparison period, one of the input transistors of the comparator 12 is selected in response to the offset polarity signal, and is supplied with the output of the DA converter 35. The other transistor is supplied with the low voltage source AVS. Since the outputs of the FF 44 and the FF 47 are maintained, the selector 52 selects the A input thereof, the selector 54 selects the A input thereof, and the correction code of the counter 50, which is counted up by one, is output. The comparison process is performed, and the comparison results are supplied to the FF 44.

Since the FF 44 and the FF 47 holds the comparison results of the first round, the output of the EXNOR gate 48 is at a high level. The counter 50 counts up by 1 in response to a change in the clock CLK.

Since a first determination signal is at a low level, the NOR gate 45 inputs the output of the FF 44, e.g., the first comparison result to the FF 47. In response to a change in the clock CLK, the FF 44 holds second comparison result and the FF 47 holds the first comparison result. The output of the EXNOR gate 48 is at a high level when the outputs of the FF 44 and the FF 47 are substantially the same, and is at a low level when the outputs of the FF 44 and the FF 47 are different. If the first comparison result and the second comparison result are substantially identical to each other, the above process is performed. The counter 50 continues counting up by 1.

If the first comparison result and the second comparison result are different, the output of the EXNOR gate 48 becomes low. The counter 50 stops counting up.

If any two consecutive comparison results are substantially the same, the counter 50 continues to count up. If any two consecutive comparison results are different, e.g., the consecutive comparison result changes, the counter 50 stops counting up. If the output of the EXNOR gate 48 turns low in the middle of the correction process, a circuit (not illustrated) causes the signal for the correction operation to turn low. For this reason, no change occurs at the outputs of the FF 44, the FF 46, the FF 47, the counter 50, and the FF group 51.

If a change is detected in the comparison result, the count value of the counter 50 has been counted up by 1. When the output of the EXNOR gate 48 turns low, the selector 52 selects and outputs the output from the FF group 51 at the B input, i.e., the immediately preceding count value on the counter 50. The selector 54 receives the count value at the change in the comparison result from the A input and the count value of one step earlier from the B input.

If the comparison result changes, the signal during correction process turns low. A NOR gate 49 outputs the output of the FF 47, i.e., the immediately preceding comparison result. A high comparison result indicates that the offset is negative in the first comparison, and that the offset increases in response to an increase in the correction code and rises above zero, i.e., the residual offset is positive. A low comparison result indicates that the offset is positive in the first comparison, and that the offset decreases in response to an increase in the correction code and falls below zero, i.e., the residual offset is negative. If the output of the NOR gate 49 is at a high level, the selector 54 outputs the signal at the A input thereof, e.g., the count value responsive to a change in the comparison result. If the output of the NOR gate 49 is at a low level, the selector 54 outputs the signal at the B input thereof, e.g., a count value resulting from subtracting 1 from the count value responsive the change in the comparison result. The residual offset is positive.

Figure 25:
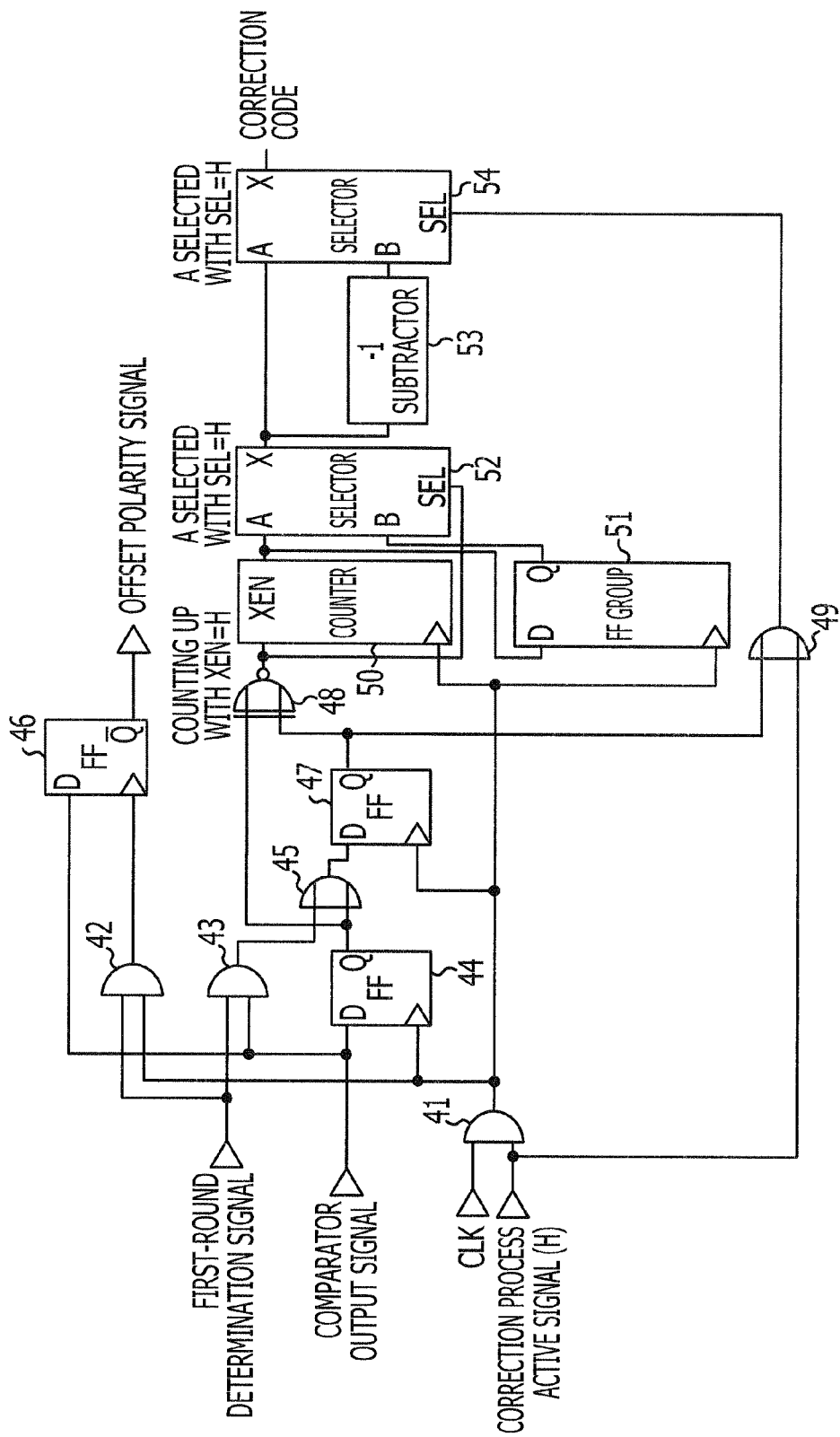
FIG. 25 illustrates an exemplary offset correction logic circuit.

FIG. 25 illustrates an exemplary AD converter device. In FIG. 25, the CDAC 11A with the bridge capacitance correction function of FIG. 12 is illustrated in detail. The offset correction logic circuit 31 may not be illustrated.

As illustrated in FIG. 25, the CDAC 11A with the bridge capacitance correction function includes three upper side capacitors C3-C5, bridge capacitor Cb, three lower side capacitors C0-C2, dummy capacitor Cd, four correction capacitors hC0-hC3, switches SW0-SW5, SWd, and hSW0-hSW3, and SWR. The switch SWd is coupled to one of the terminals of the analog signal Va, the upper reference voltage VRH, and the lower reference voltage VRL. An SAR logic circuit 13 and a bridge capacitance correction logic circuit 32A output a control code controlling the switches SW0-SW5, SWd, and hSW0-hSW3, and SWR.

The CDAC 11A with the bridge capacitance correction function includes four correction capacitors hC0-hC3. The other configuration is substantially the same as or similar to the configuration of the CDAC 11 of FIG. 1. For example, if capacitances of the minimum capacitor C3 of the upper side, the minimum capacitor C0 of the lower side, and the dummy capacitor Cd are 1, a capacitance of the bridge capacitor Cb may be slightly larger than 8/7. For example, the capacitance of the bridge capacitor Cb may be 8/7+α in absolute value.

One terminal of each of the four correction capacitors hC0-hC3 is coupled to a common signal line SL2, and the other terminals thereof are respectively coupled to the switches hSW0-hSW3. The switches hSW0-hSW3 couple the terminals of the four correction capacitors hC0-hC3 to the lower reference voltage VRL. The ratio of the capacitances of the four correction capacitors hC0-hC3 may be 1:2:4:8. The ratio of the capacitances of the capacitors C3, C0 and Cd may be set taking a correction range and the residual error into consideration. The four correction capacitors hC0-hC3 may also be referred to as correction capacitances.

In the CDAC 11 of FIG. 1, the ratio of the weights of the capacitances of the lower side reference capacitors to those of the upper side reference capacitors may become small because of a parasitic capacitance. Therefore, changes in an analog output voltage output to the common signal line SL1 may not be uniform. In the CDAC 11A with the bridge capacitance correction function of FIG. 26, the capacitance of the bridge capacitor Cb may be set to be larger than a theoretical value, e.g., 8/7, and the weight of the capacitance of the lower side capacitor may be larger. A capacitor to be coupled to the lower reference voltage VRL is selected from among the four correction capacitors hC0-hC3 so that the sum of capacitances of the four correction capacitors hC0-hC3 is adjusted. The weights of the capacitances of the lower side capacitors may be decreased because of the correction capacitance and the parasitic capacitance, and is corrected so as to approach ideal values. The capacitance of the minimum capacitor C3 of an upper side reference capacitor and the sum of capacitances of the lower side capacitors C0-C2 and the dummy capacitor Cd may have substantially the same weight. If a change in the common signal line SL1 when switching between one state and the other state is small, it may be determined that an ideal state be achieved. In the one state, the capacitor C3 is coupled to the upper reference voltage VRH and the capacitors C0-C2 and the dummy capacitor Cd is coupled to the lower reference voltage VRL. In the other state, the capacitor C3 is coupled to the lower reference voltage VRL with the capacitors C0-C2 and the dummy capacitor Cd is coupled to the upper reference voltage VRH. For example, the determination process is repeated while the number of correction capacitors coupled to the lower reference voltage VRL is increased in a stepwise fashion from an open state of the correction capacitors. It may be determined that the ideal state be achieved when the comparison result changes.

FIGS. 26-31 illustrate an exemplary correction of CDAC with a bridge capacitance correction circuit.

Figure 26:
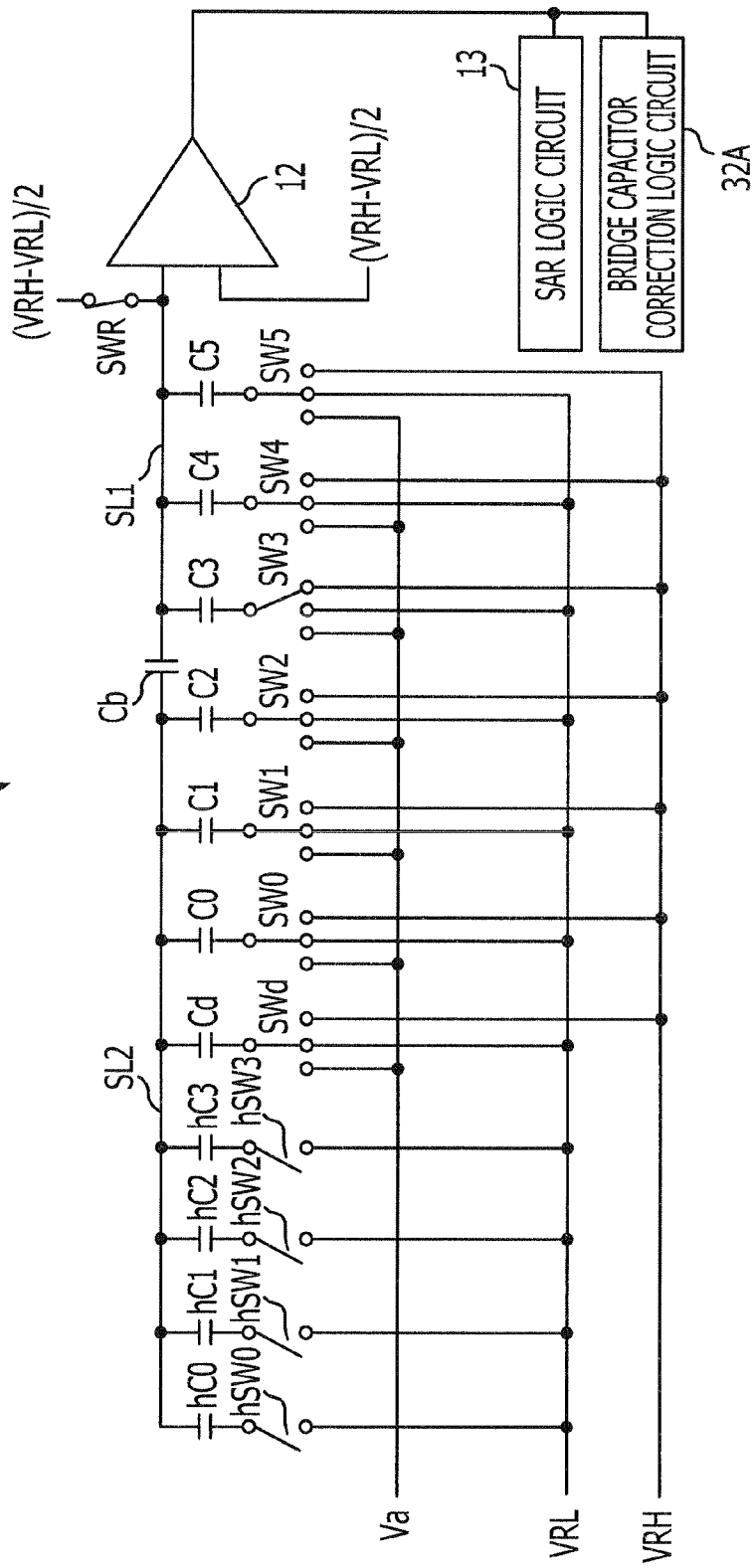
FIG. 26 illustrates an exemplary correction process of a capacitive type digital-to-analog converter (CDAC) with a bridge capacitor correction circuit.

As illustrated in FIG. 26, the switches SW0-SW2, SW4, SW5 and SWd are coupled to the lower reference voltage VRL, the switch SW3 is coupled to the upper reference voltage VRH, and the switches hSW-hSW3 are open. Under this condition, the switch SWR is coupled to the reference voltage (VRH−VRL)/2. The common signal line SL1 becomes the reference voltage (VRH−VRL)/2, the capacitors C4 and C5 are supplied with a voltage (VRH−3VRL)/2, and the capacitors C0-C2 are supplied with the voltage (VRH−3VRL)/2 via the bridge capacitor Cb. The capacitor C3 is supplied with a voltage of −(VRH−VRL)/2. Each capacitor stores a charge corresponding to the applied voltage.

Figure 27:
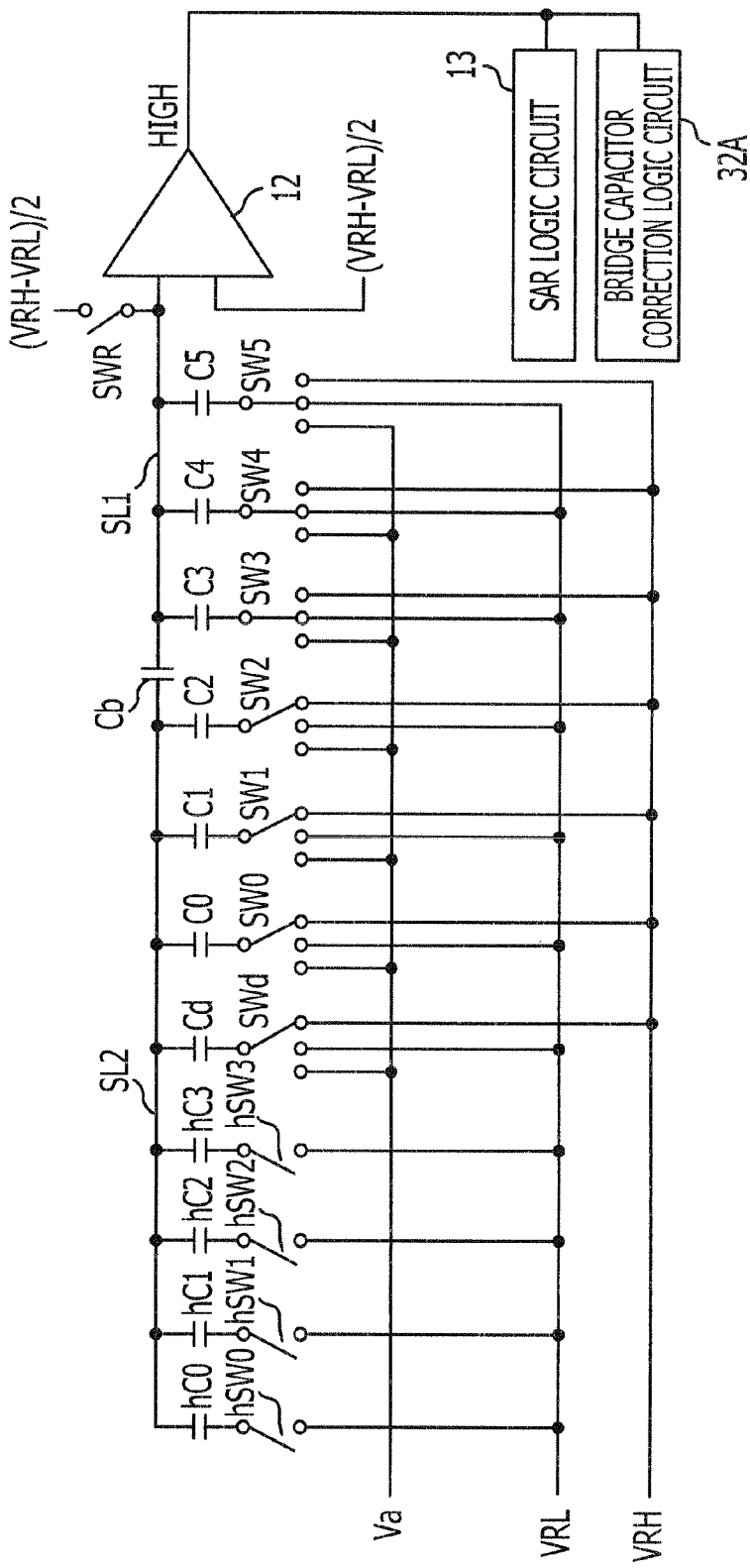
FIG. 27 illustrates an exemplary correction process of a CDAC with a bridge capacitor correction circuit.

As illustrated in FIG. 27, while the state where the switches SW4 and SW5 are coupled to the lower reference voltage VRL and the switch SWR is open is maintained, the switches SW0-SW2 and SWd are coupled to the upper reference voltage VRH and the switch SW3 is coupled to the lower reference voltage VRL. Since the capacitance of the capacitor C3 is substantially equal to the sum of capacitances of C1-C3 and Cd in an ideal state including the parasitic capacitance, the voltage of the common signal line SL1 may not change. Since an effect for coupling the switches SW-SW2 and SWd to the upper reference voltage VRH is strong due to a large capacitance of the bridge capacitor, the voltage of the common signal line SL1 becomes higher than the reference voltage (VRH−VRL)/2 and the output of the comparator 12 becomes high.

Figure 28:
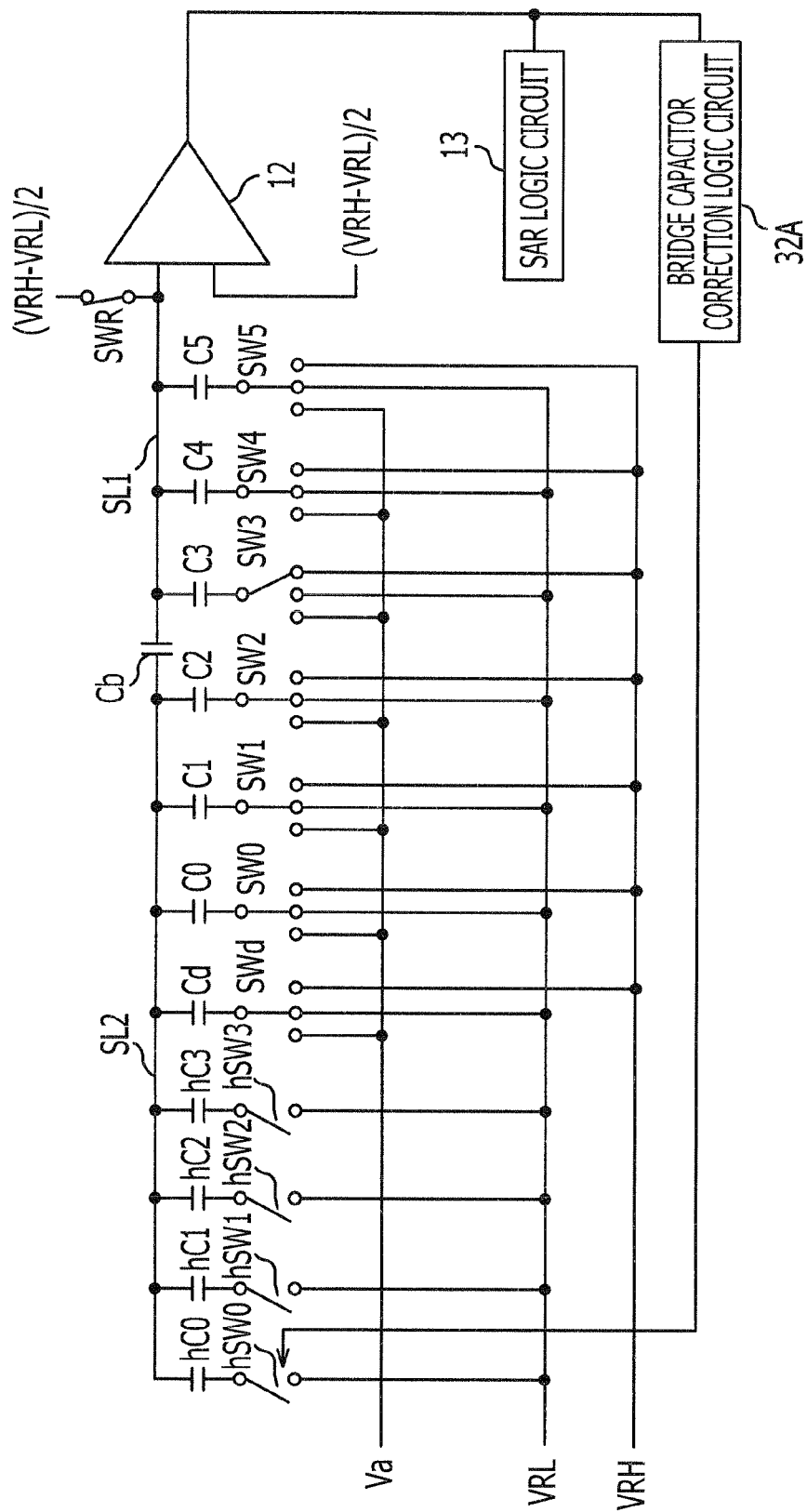
FIG. 28 illustrates an exemplary correction process of a CDAC with a bridge capacitor correction circuit.

As illustrated in FIG. 28, after the switch hSW0 is coupled to the lower reference voltage VRL, the switches SW0-SW2, SW4, SW5, and SWd are coupled to the lower reference voltage VRL, the switch SW3 is coupled to the upper reference voltage VRH, and the switch SWR is coupled to the reference voltage (VRH−VRL)/2 in the same manner as illustrated in FIG. 26. The common signal line SL1 becomes the voltage (VRH−VRL)/2, and each capacitor stores a charge corresponding to the voltage applied thereto.

Figure 29:
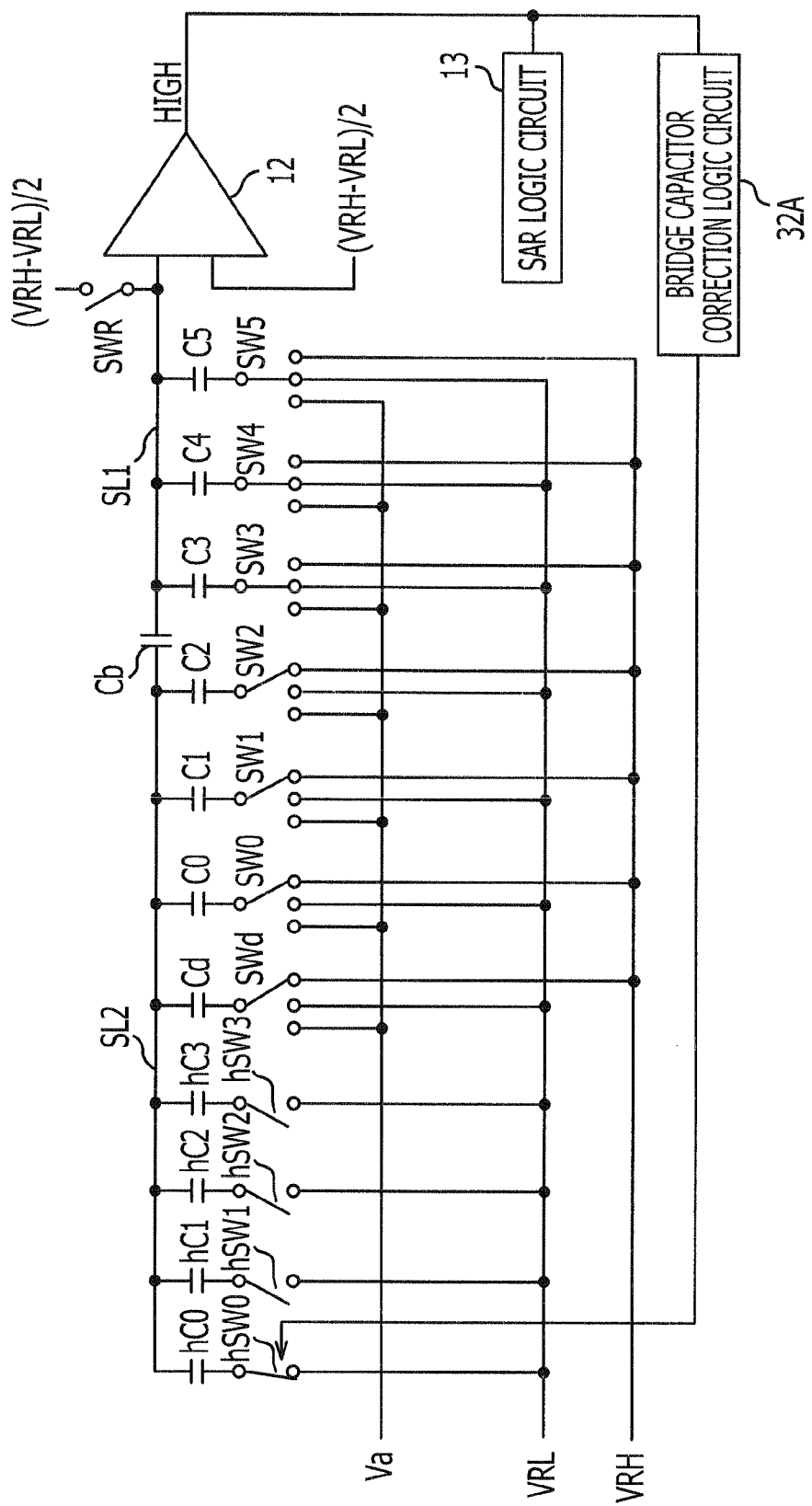
FIG. 29 illustrates an exemplary correction process of a CDAC with a bridge capacitor correction circuit.

As illustrated in FIG. 29, while the switch SWR is open, the switches SW4 and SW5, and the capacitor hC0 are coupled to the lower reference voltage VRL, the switches SW0-SW2 and SWd are coupled to the upper reference voltage VRH and the switch SW3 is coupled to the lower reference voltage VRL. When the weight of the lower side reference capacitors increases and exceeds an ideal value by the capacitor hC0 being coupled to the lower reference voltage VRL, the voltage on the common signal line SL1 falls below the reference voltage (VRH−VRL)/2, and the output of the comparator 12 becomes low. When the weight of the lower side reference capacitor does not exceed the ideal value by the capacitor hC0 being coupled to the lower reference voltage VRL, the voltage on the common signal line SL1 exceeds the reference voltage (VRH−VRL)/2, and the output of the comparator 12 becomes high.

Figure 30:
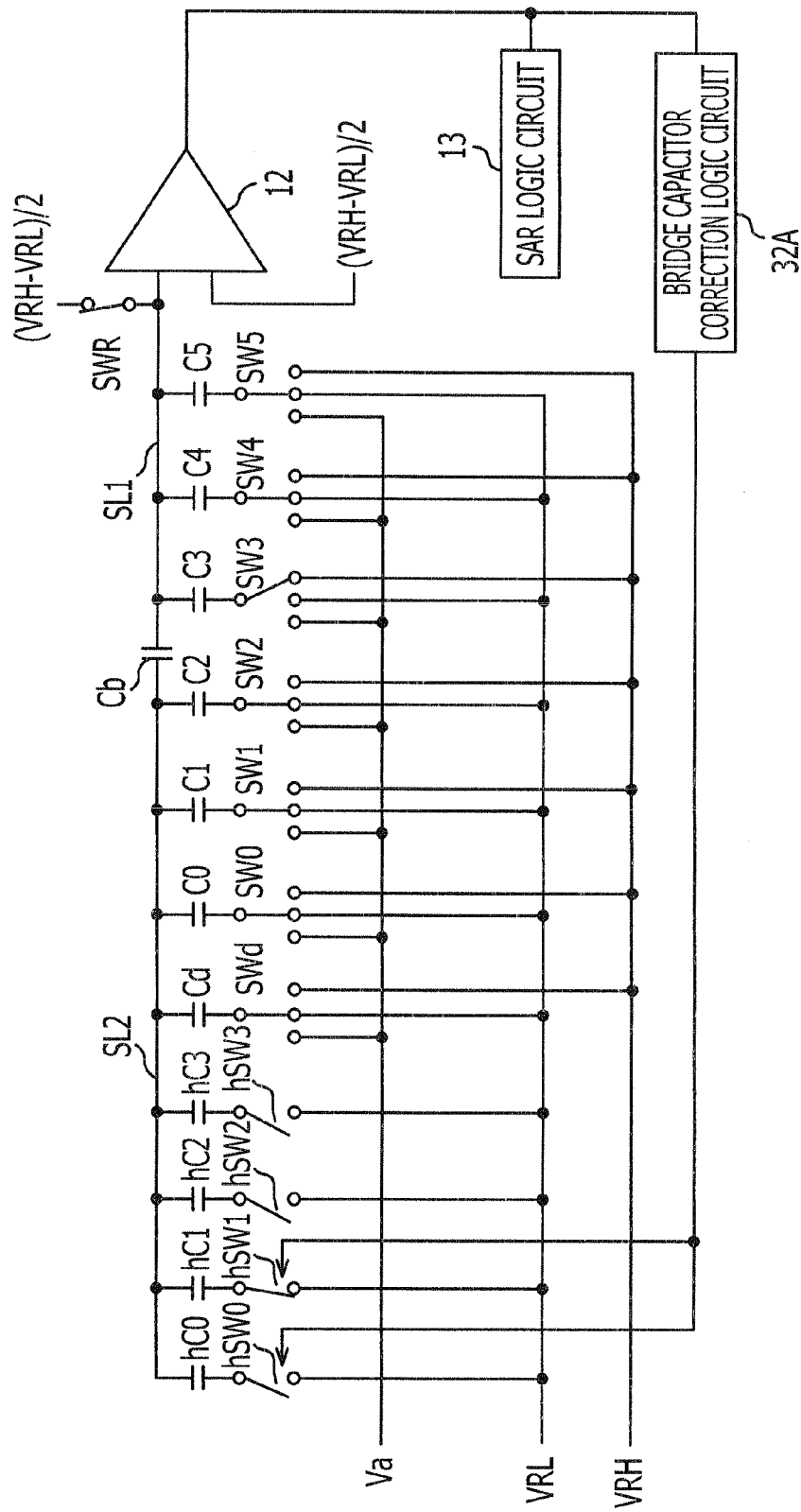
FIG. 30 illustrates an exemplary correction process of a CDAC with a bridge capacitor correction circuit.
Figure 31:
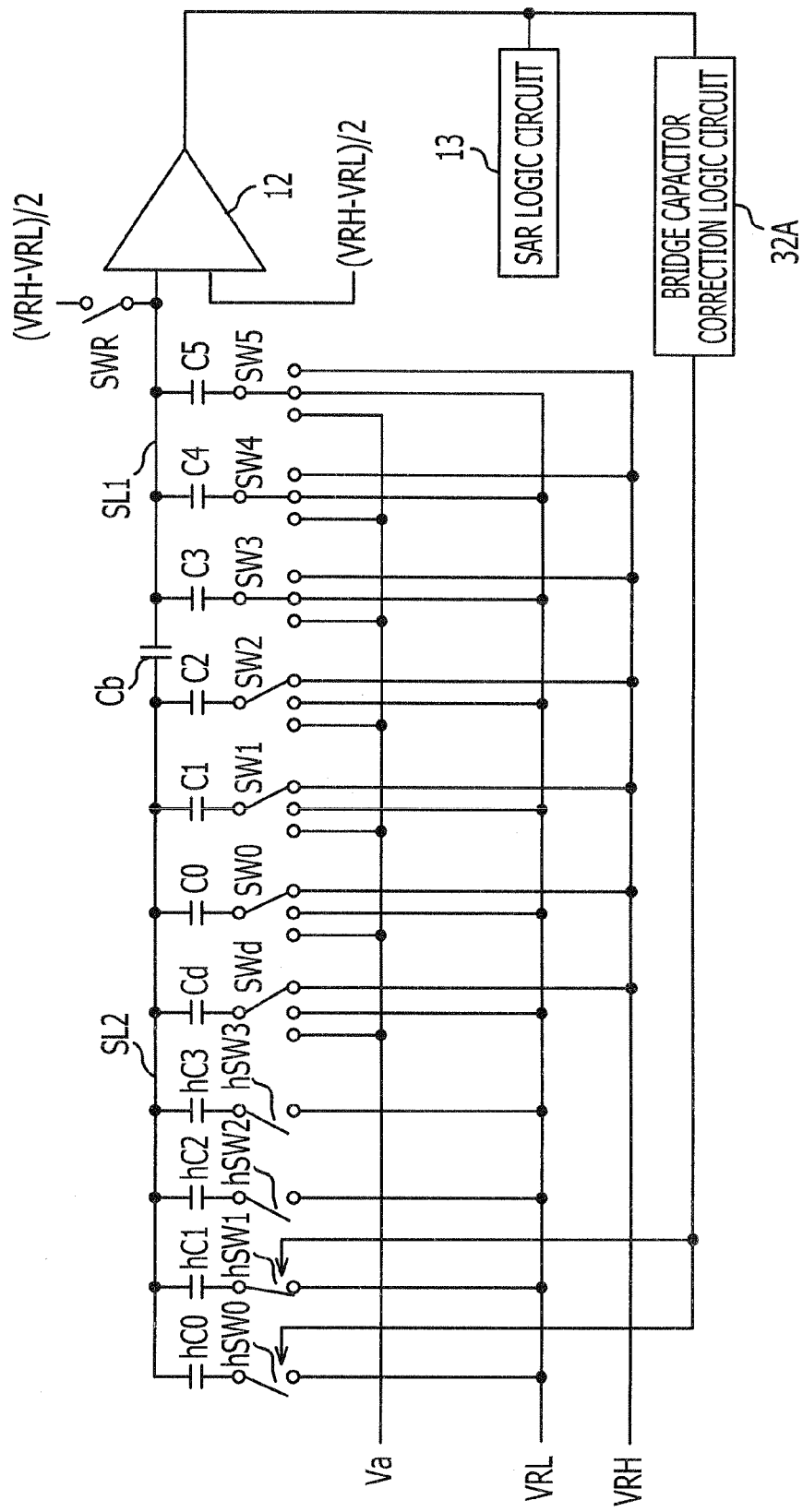
FIG. 31 illustrates an exemplary correction process of a CDAC with a bridge capacitor correction circuit.

If the output of the comparator 12 is at a high level, the switch hSW0 becomes open as illustrated in FIG. 30. After the switch hSW1 is coupled to the lower reference voltage VRL, the switches SW0-SW2, SW4, SW5, and SWd are coupled to the lower reference voltage VRL, the switch SW3 is coupled to the upper reference voltage VRH, and the switch SWR is coupled to the reference voltage (VRH−VRL)/2. As illustrated in FIG. 31, while the switch SWR becomes open and the switches SW4, and SW5 and the capacitor hC0 are coupled to the lower reference voltage VRL, the switches SW0-SW2 and SWd are coupled to the upper reference voltage VRH, the switch SW3 is coupled to the lower reference voltage VRL, and the output of the comparator 12 is determined.

The number of correction capacitors coupled to the lower reference voltage VRL is increased in a stepwise fashion, and the above-described process is repeated. If the output of the comparator 12 turns low, the number of capacitors stops being increased. For example, when the capacitance ratio of capacitances of the four capacitors is 1:2:4:8, the correction capacitance changes in 16 steps.

Figure 32:
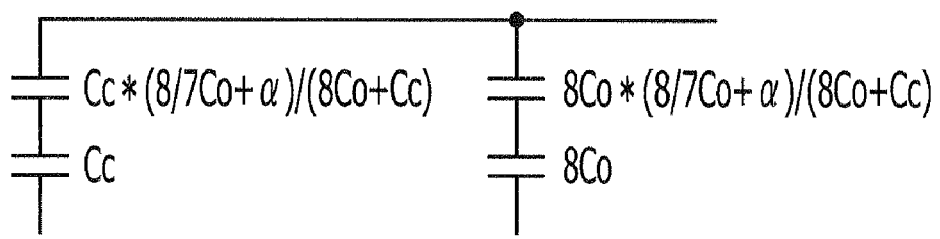
FIG. 32 illustrates exemplary capacitors.

Each of the capacitance of the capacitor C3, C0, and Cd may be Co, the capacitance of the bridge capacitor Cb may be $8Co/7+\alpha$, the sum of the four correction capacitors hC0-hC3 coupled to the lower reference voltage VRL may be Cc. FIG. 32 illustrates exemplary capacitors. For example, FIG. 32 illustrates the lower side reference capacitors when the output of the comparator 12 turns low and the correction capacitor with respect to the common signal line SL1 via the bridge capacitor. The correction capacitor Cc and $\alpha$ of the bridge capacitor Cb may have a relationship indicated by equation in FIG. 32.

Figure 33:
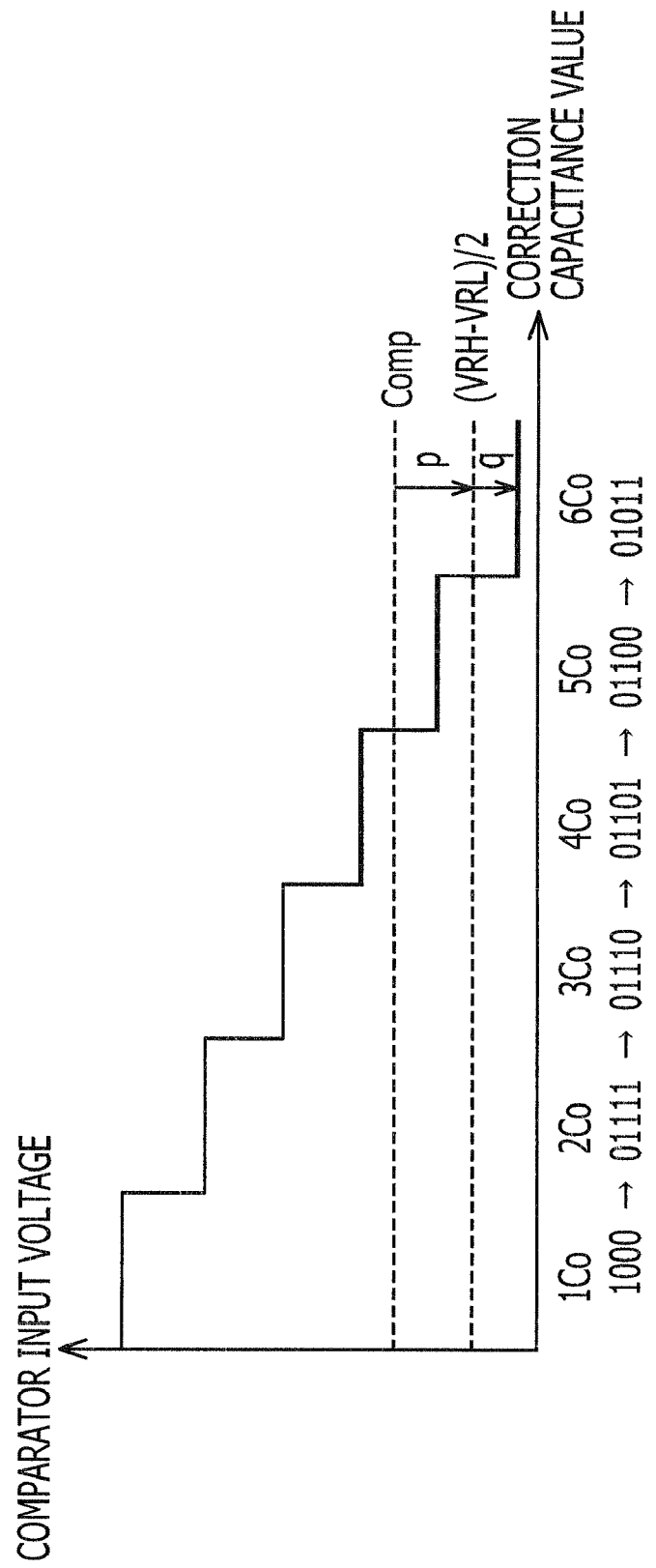
FIG. 33 illustrates an exemplary change in an input voltage to a comparator.

FIG. 33 illustrates an exemplary change in a comparator input voltage. For example, a change in the comparator input voltage when the bridge capacitor is corrected. Subsequent to the offset correction of the comparator 12, the bridge capacitor is corrected, and the residual offset is set to be positive. A comparison level Comp of the comparator 12 is higher than the reference voltage (VRH−VRL)/2 by the residual offset. As the correction capacitors coupled to the lower reference voltage VRL increases, the voltage output from the CDAC 11A, i.e., the comparator input voltage decreases in a stepwise fashion. If the comparison level Comp becomes higher than the comparator input voltage, the increasing of the correction capacitance stops. Therefore, a difference between the comparison level of the CDAC 11 and the comparator 12 and the reference voltage (VRH−VRL)/2 may be to within a minimum step where the correction capacitance changes.

If the correction of the CDAC 11A with the bridge capacitance correction function is complete, an AD conversion may be performed.

The connection of the switches hSW0-hSW3 may be set in the correction process.

The switch SWR is coupled to the reference voltage (VRH−VRL)/2=Vcm, and the switches SW0-SW5 and SWd are coupled to the analog signal Va to sample the analog signal Va. Each capacitor is directly or indirectly supplied with a difference voltage between the analog signal Va and the reference voltage Vcm and stores a charge corresponding to the voltage supplied thereto.

The switch SWR becomes open, the switch SW5 is coupled to the upper reference voltage VRH, and the switches SW0-SW4 and SWd are coupled to the lower reference voltage VRL. The voltage of the common signal line SL1 becomes Vcm−Va+Vcmx½. The comparator 12 compares the voltage on the common signal line SL1 with the reference voltage Vcm. If the voltage on the common signal line SL1 is higher than the reference voltage Vcm, the most significant bit (first bit) is set to be "1" and the switch SW5 remains coupled to the upper reference voltage VRH. If the voltage on the common signal line SL1 is lower than the reference voltage Vcm, the first bit is set to be "0" and the switch SW5 is coupled to the lower reference voltage VRL. For example, the voltage on the common signal line SL1 may be higher than the reference voltage Vcm.

The switch SW4 is coupled to the upper reference voltage VRH when the switch SW5 is coupled to the upper reference voltage VRH and the switches SW0-SW3 and SWd is coupled to the lower reference voltage VRL. The voltage of the common signal line SL1 becomes Vcm−Va+Vcmx½+Vcmx¼. If the voltage on the common signal line SL1 is higher than the reference voltage Vcm, the second bit is set to be "1" nd the switch SW4 remains coupled to the upper reference voltage VRH. If the voltage on the common signal line SL1 is lower than the reference voltage Vcm, the second bit is set to be "0" and the switch SW4 is coupled to the lower reference voltage VRL. The voltage on the common signal line SL1 may be lower than the reference voltage Vcm.

The switch SW3 is coupled to the upper reference voltage VRH when the switch SW5 is coupled to the upper reference voltage VRH, the switch SW4 is coupled to the lower reference voltage VRL, and the switches SW0-SW2 and SWd are coupled to the lower reference voltage VRL. The voltage of the common signal line SL1 becomes Vcm−Va+Vcmx½−Vcmx¼+Vcmx⅛. If the voltage of the common signal line SL1 is higher than the reference voltage Vcm, the third bit may be set to be "1" and the switch SW3 remains coupled to the upper reference voltage VRH. If the voltage of the common signal line SL1 is lower than the reference voltage Vcm, the third bit may be set to be "0" and the switch SW3 is coupled to the upper reference voltage VRH.

Similarly, the fourth through sixth bits are set.

The correction of the CDAC 11A with the bridge capacitance correction function may start from a state where the correction capacitors are coupled to the lower reference voltage VRL. The correction capacitors set to be open increase in a stepwise fashion. When the output of the comparator 12 becomes high, the increase of the correction capacitors may be stopped. The residual error of the CDAC 11A with the bridge capacitance correction function may be positive. Since the residual error is substantially the same polarity as that of the residual offset of the comparator 12, the correction code may revert back to the one-step preceding correction code.

Figure 34:
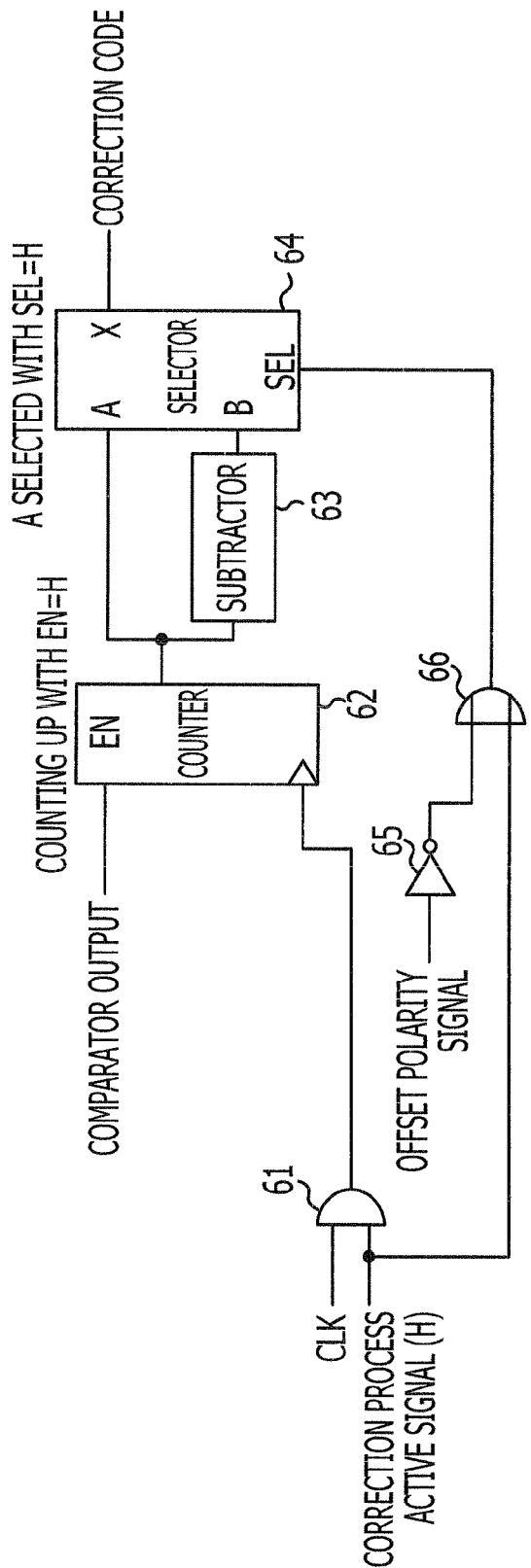
FIG. 34 illustrates an exemplary bridge capacitor correction logic circuit.

Since the polarity of the residual offset may not be set in the offset correction of the comparator 12 as illustrated in FIG. 10, the polarity of the residual offset may be notified to the bridge capacitance correction logic circuit 32A. The bridge capacitance correction logic circuit 32A starts the correction process with the correction capacitors open, and the number of the correction capacitors coupled to the lower reference voltage VRL is increased in a stepwise fashion. The bridge capacitance correction logic circuit 32A maintains the correction code if the notified residual offset is positive, and set back the correction code to the one-step preceding correction code. FIG. 34 illustrates an exemplary bridge capacitance correction logic circuit.

A counter 62 outputs a zero correction code at the initialization, and makes the switches hSW0-hSW3 open. A first comparison round is performed. The counter increases the correction code until the comparison result becomes low. When the comparison result becomes low, the correction code stops increasing. If the residual offset is positive, the correction code is selected. If the residual offset is negative, the correction code is set to be the correction code from one step preceding.

When the clock CLK is at a high level (CLK=H), the comparator 12 is reset, and the AD converter device performs a preparatory process. When the clock is at a low level (CLK=L), the comparator 12 performs a comparison process, and the AD converter device also performs a comparison process.

While the correction process active signal is at a high level, the clock CLK is supplied to the counter 62. The counter 62 outputs the correction code "0000" at the initialization. When the output of the comparator 12 is at a high level and the correction operation is being performed, the counter 62 count-ups in synchronization with the clock CLK. A −1-subtractor 63 outputs a value obtained by subtracting 1 from the output of the counter 62. A selector 64 selects the value of the counter 62 at the A input when SEL=H is established, and selects the output of the subtractor 63 at the B input when SEL=L is established.

The counter 62 count-ups in response to a change in the clock CLK, and outputs the count value as a correction code. The correction capacitors increase in a stepwise fashion. If the comparison result of the comparator 12 is at a high level, a circuit (not illustrated) causes the correction process active signal to be low. The counter 62 stops counting up.

A signal obtained by inversing the offset polarity signal indicates the residual offset. Therefore, the output of an inverter 65 indicates the residual offset. If the correction process active signal turns low, the output of a NOR gate 66 is set based on the signal indicating the residual offset. If the residual offset is positive, the NOR gate 66 outputs a high-level signal. If the residual offset is negative, the NOR gate 66 outputs a low-level signal. Therefore, if the residual offset is positive, the selector 64 selects the correction code output from the counter 62. If the residual offset is negative, the selector 64 selects, as the correction code, a value output from the −1-subtractor 63, which is obtained by subtracting 1 from the output of the counter 62.

Figure 35:
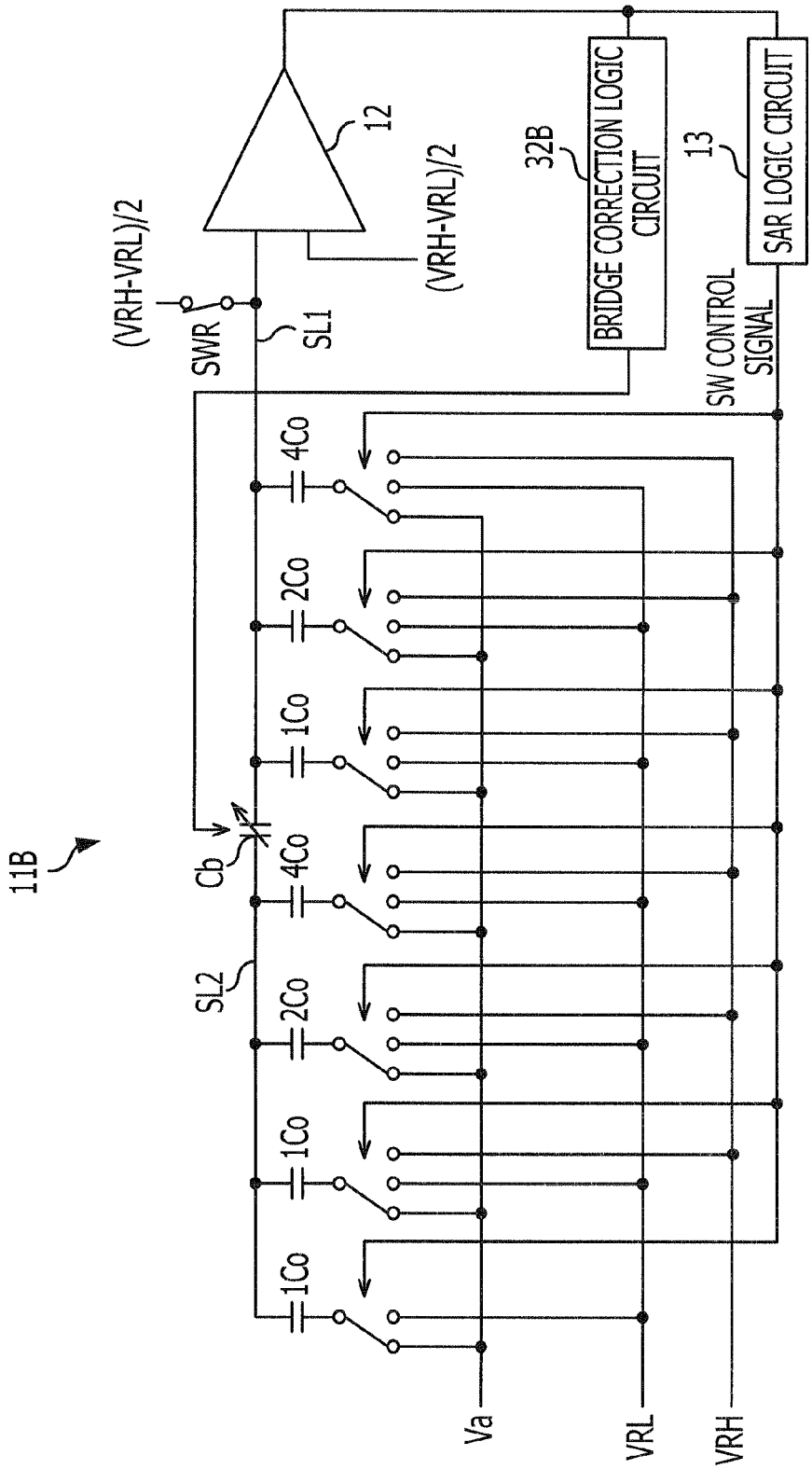
FIG. 35 illustrates an exemplary correction process of a CDAC with a bridge capacitor correction circuit.

FIG. 35 illustrates an exemplary CDAC 11B with a bridge capacitance correction function. In the CDAC 11A with the bridge capacitance correction function, one terminal of each of the four correction capacitors hC0-hC3 may be coupled to the signal line SL2 to which the lower side reference capacitors C0 and C1 and the dummy capacitor Cd are coupled. The other terminals of the four correction capacitors hC0-hC3 may be coupled to the lower reference voltage VRL. In the CDAC 11B with the bridge capacitance correction function illustrated in FIG. 35, the bridge capacitor Cb may be variable, or the bridge correction logic circuit 32B may correct the capacitance of the bridge capacitor Cb.

Figure 36:
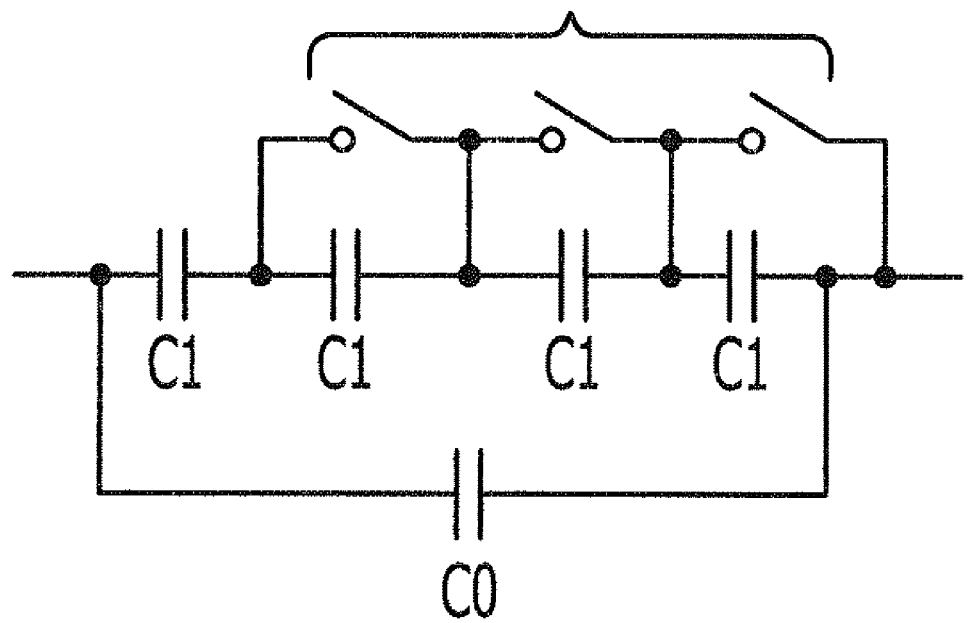
FIG. 36 illustrates exemplary bridge capacitors.

FIG. 36 illustrates an exemplary bridge capacitor. The capacitance of the bridge capacitor Cb illustrated in FIG. 36 changes under switch controlling based on a three-bit correction code.

The correction process may be substantially the same as or similar to the correction process of the AD converter device illustrated in FIG. 12.

Figure 37:
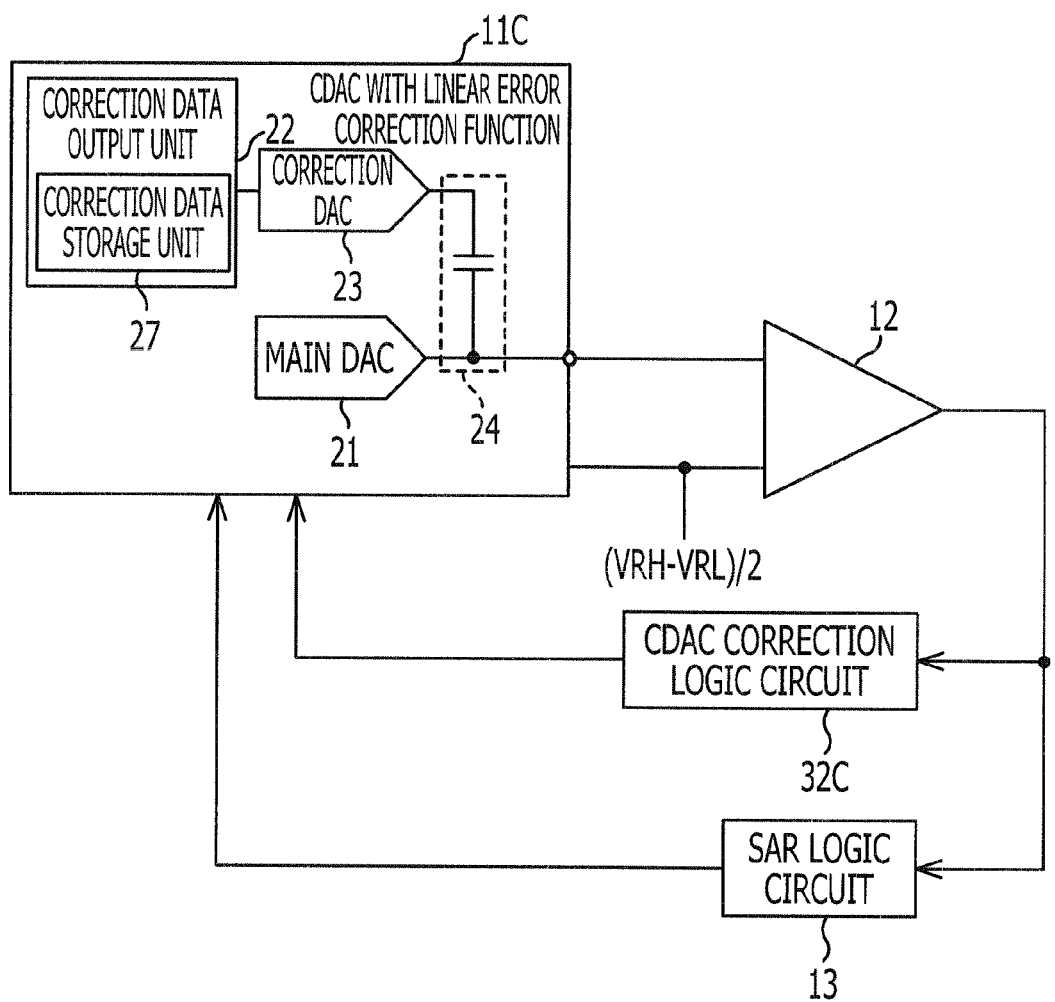
FIG. 37 illustrates an exemplary CDAC with a linear error correction function.

FIG. 37 illustrates an exemplary AD converter device. The AD converter device in FIG. 37 includes a CDAC 11C with a six-bit linear error correction function, a comparator 12, a SAR logic circuit 13, and a CDAC correction logic circuit 32C. The CDAC 11C is supplied with the analog signal Va, the upper reference voltage VRH, the lower reference voltage VRL, and the reference voltage (VRH−VRL)/2. The offset of the comparator 12 is corrected in accordance with the correction code. The SAR logic circuit 13 controls the switches of the CDAC 11C in response to comparison results of the comparator 12. For example, the SAR logic circuit 13 determines an AD conversion value so that the output Vi of the CDAC 11C approaches the reference voltage (VRH−VRL)/2. The CDAC 11C may perform a linear error correction process, and may have a configuration similar to that of the CDAC 11 of FIG. 4. The AD converter device in FIG. 37 may include the correction logic circuit 30 including the offset correction logic circuit 31.

Referring to FIG. 37, the CDAC 11C includes a main CDAC 21, a correction data output circuit 22, a correction CDAC 23, and an adder 24. The correction data output circuit 22 includes a correction data storage unit 27 which stores a CDAC correction code when a bit of a digital-to-analog (DA) conversion code supplied from the SAR logic circuit 13 is "1.". Upon receiving the DA conversion code, the correction data output unit 22 reads the CDAC correction code from the correction data storage unit 27, and adds the CDAC correction code to the DA conversion code in accordance with all the bits of the DA conversion code and outputs the correction data. The CDAC correction logic circuit 32C determines the CDAC correction code stored in the correction data storage unit 27.

After the offset of the comparator 12 is corrected, the linear correction of the CDAC 11C is performed. The correction of the offset of the comparator 12 may be substantially the same as or similar to the correction by the AD converter device illustrated in FIG. 12. The process of setting a negative residual offset to be positive may be omitted when the residual offset is negative. The CDAC correction logic circuit 32C is notified of the polarity of the residual offset.

Figure 38:
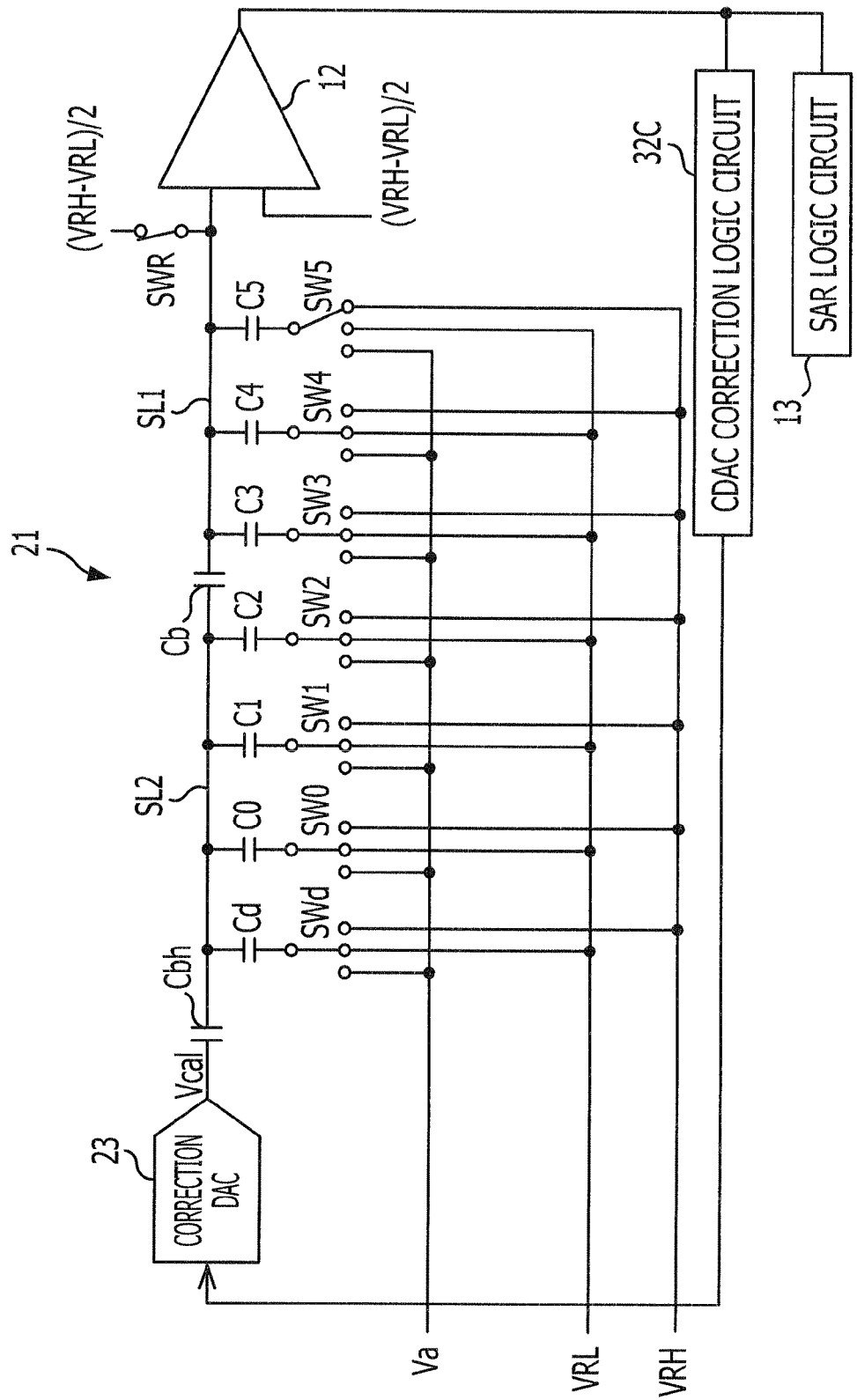
FIG. 38 illustrates an exemplary CDAC correction.
Figure 39:
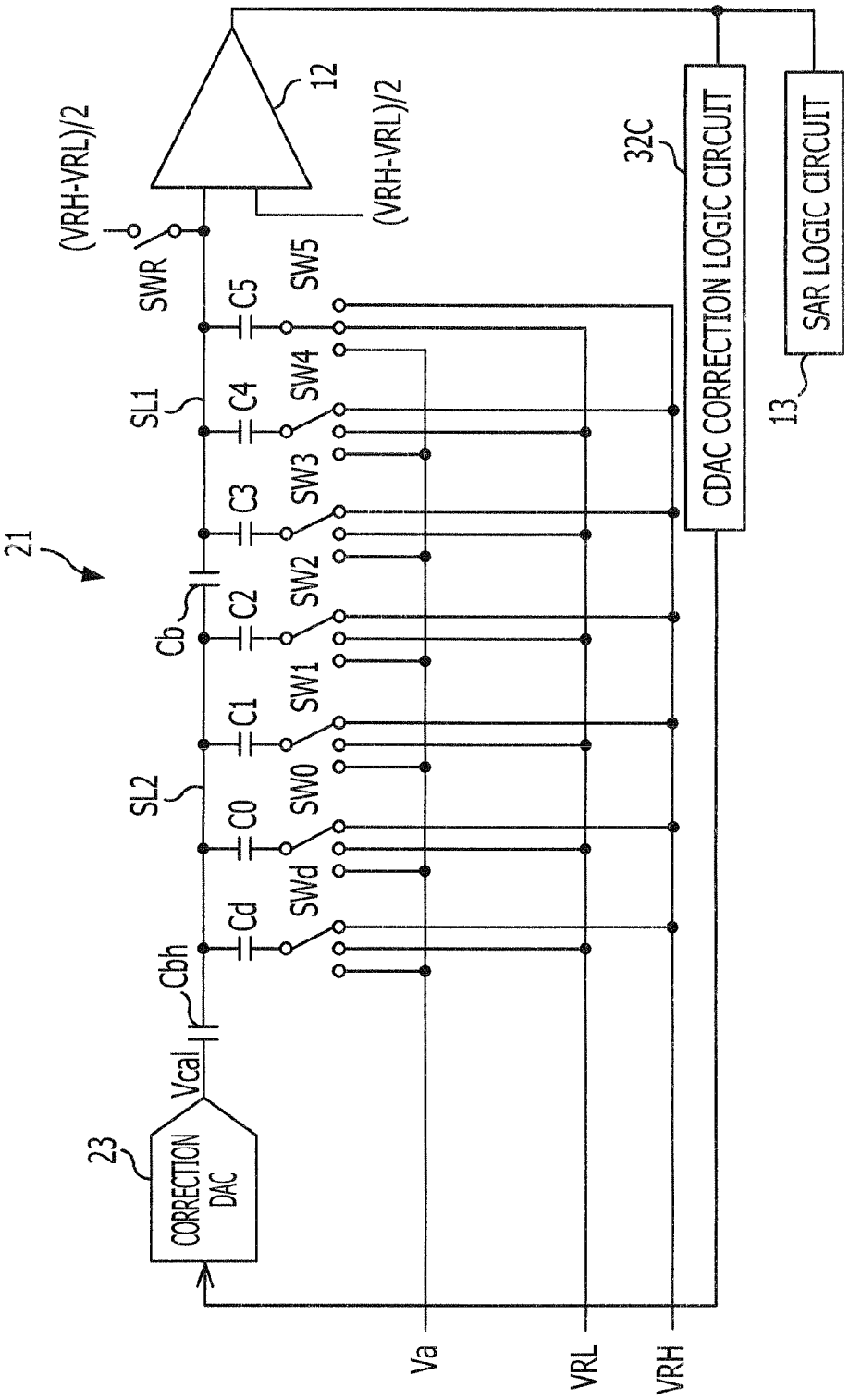
FIG. 39 illustrates an exemplary CDAC correction.

FIGS. 38 and 39 illustrate an exemplary CDAC correction. The main CDAC 21 includes three upper side capacitors C3-C5 having terminals coupled to a common signal line SL1, a bridge capacitor Cb having one terminal coupled to the common signal line SL1, three lower side capacitors C0-C2 having terminals coupled to a signal line SL2 coupled to the other terminal of the bridge capacitor Cb, a dummy capacitor Cd having one terminal coupled to the signal line SL2, switches SW0-SW5 coupling the other terminals of the three lower side capacitors C0-C2 and the three upper side capacitors C3-C5 to one of a terminal receiving an analog signal Va, a terminal receiving an upper reference voltage VRH, and a terminal receiving a lower reference voltage VRL. The main CDAC 21 further includes a switch SWd coupling the dummy capacitor Cd to one of the terminals of the upper reference voltage VRH and the lower reference voltage VRL, a switch SWR coupling the common signal line SL1 to the reference voltage (VRH−VRL)/2, and a correction bridge capacitor Cbh having one terminal coupled to the signal line SL2. An output Vcal of a correction CDAC 23 is applied to the other terminal of the correction bridge capacitor Cbh. The capacitance ratio of the capacitors Cd, C0-C5, and Cb may be set to be 1:1:2:4:1:2:4:8/7. The capacitance of the correction bridge capacitor Cbh may be set based on a correction range and a correction resolution.

The main CDAC 21 may have a configuration which is substantially the same as or similar to a configuration of the CDAC 11 in FIG. 1.

The output Vcal of the correction CDAC 23, for example, CDAC correction is determined so that the weight changes from the least significant bit in accordance with the power of 2. A combination of reference capacitors having a substantially equivalent weight may be used. For example, when the capacitances of the capacitors C0 and Cd may be substantially equal to each other, a comparison result of the comparator 12 may not change when the capacitor C0 is coupled to the upper reference voltage VRH and the capacitor Cd is coupled to the lower reference voltage VRL after the capacitor C0 is coupled to the lower reference voltage VRL, the capacitor Cd is coupled to the upper reference voltage VRH, and the sampling is performed. Therefore, the CDAC correction code is changed in a stepwise fashion, and the sampling and comparison processes may be repeated. A timing when the comparison result changes corresponds to an approach to the equivalent state, and the CDAC correction code is determined.

The capacitances of capacitors C0 and Cd may be substantially equal to each other, and the capacitance of capacitor C1 may be substantially equal to a combination of the capacitances of the capacitors C0 and Cd. Similarly, an equivalent combination may be present. The capacitance of the capacitor C5 corresponding to the most significant bit may be substantially equivalent to a combination of the capacitances of the capacitors C0-C4 and Cd.

The CDAC correction code of the most significant bit is determined after the CDAC correction code of the capacitors C0-C4 corresponding to the first through fifth bits are determined. As illustrated in FIG. 38, for example, the switch SWR is coupled to the reference voltage (VRH−VRL)/2, the switches SW0-SW4, and SWd are coupled to the lower reference voltage VRL, and the switch SW5 is coupled to the upper reference voltage VRH. The correction CDAC 23 outputs an output Vcal in response to an intermediate value "10000" of the CDAC correction code of 5 bits.

As illustrated in FIG. 39, the switch SWR is set to be open, the switches SW0-SW4 and SWd are coupled to the upper reference voltage VRH, and the switch SW5 is coupled to the lower reference voltage VRL. The correction CDAC 23 outputs the output Vcal in response to the CDAC correction code "10000." If the comparison result is at a high level, the CDAC correction code "10001" is set because the capacitance of the capacitor C5 is higher than the sum of capacitances of the capacitors C0-C4 and Cd. If the comparison result is at a low level, the CDAC correction code "011111" is set because the capacitance of the capacitor C5 is lower than the sum of capacitances of the capacitors C0-C4 and Cd. If the first comparison result is at a high level, the CDAC correction code increases one by one until the comparison result turns low. When the comparison result turns low, the CDAC correction code stops increasing. If the first comparison result is at a low level, the CDAC correction code decreases one by one until the comparison result turns high. When the comparison result turns high, the of the CDAC correction code stops decreasing.

Figure 40:
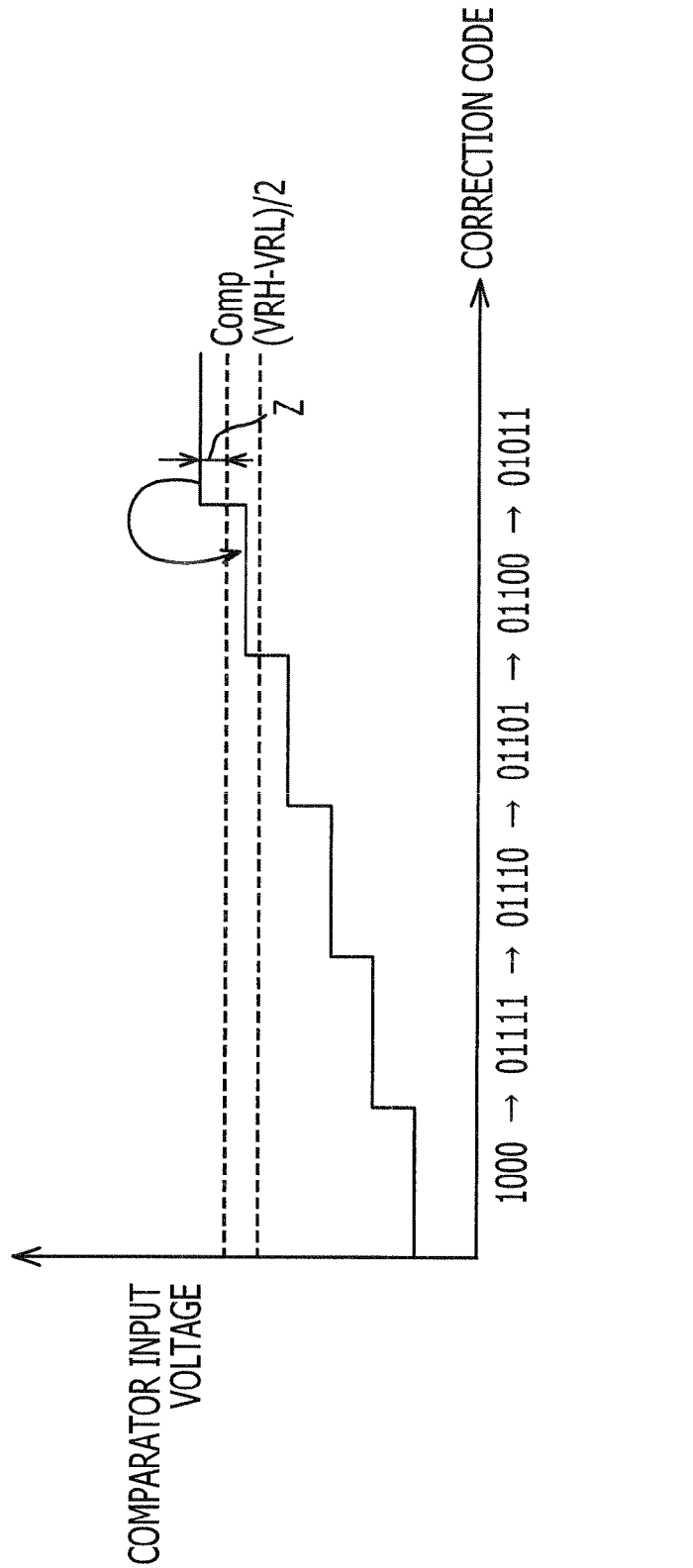
FIG. 40 illustrates an exemplary CDAC correction code.

FIG. 40 illustrates an exemplary CDAC correction code. A first comparison result may be at a low level in FIG. 40. The CDAC correction code decreases one by one, and the output of the CDAC 11C, for example, the input voltage of the comparator 12, rises. If the residual offset of the comparator 12 is positive, the comparison level Comp of the comparator 12 may be higher than the reference voltage (VRH−VRL)/2 by the residual offset. Therefore the CDAC correction code decreases one by one. If the decreasing of the CDAC correction code stops when the comparison result turns high, the error may increase due to an addition of the residual offset to the CDAC correction error. For this reason, the CDAC correction code may be set to be the correction code from one step preceding. If the residual offset of the comparator 12 is negative in FIG. 40, the residual offset and the CDAC correction error cancel each other. The CDAC correction code may be maintained.

When the first comparison result may be at a high level, the CDAC correction code may be the one-step preceding correction code if the residual offset of the comparator 12 is negative, and the CDAC correction code may be maintained if the residual offset of the comparator 12 is positive.

The CDAC correction code may be stored in the correction data storage unit 27.

Figure 41:
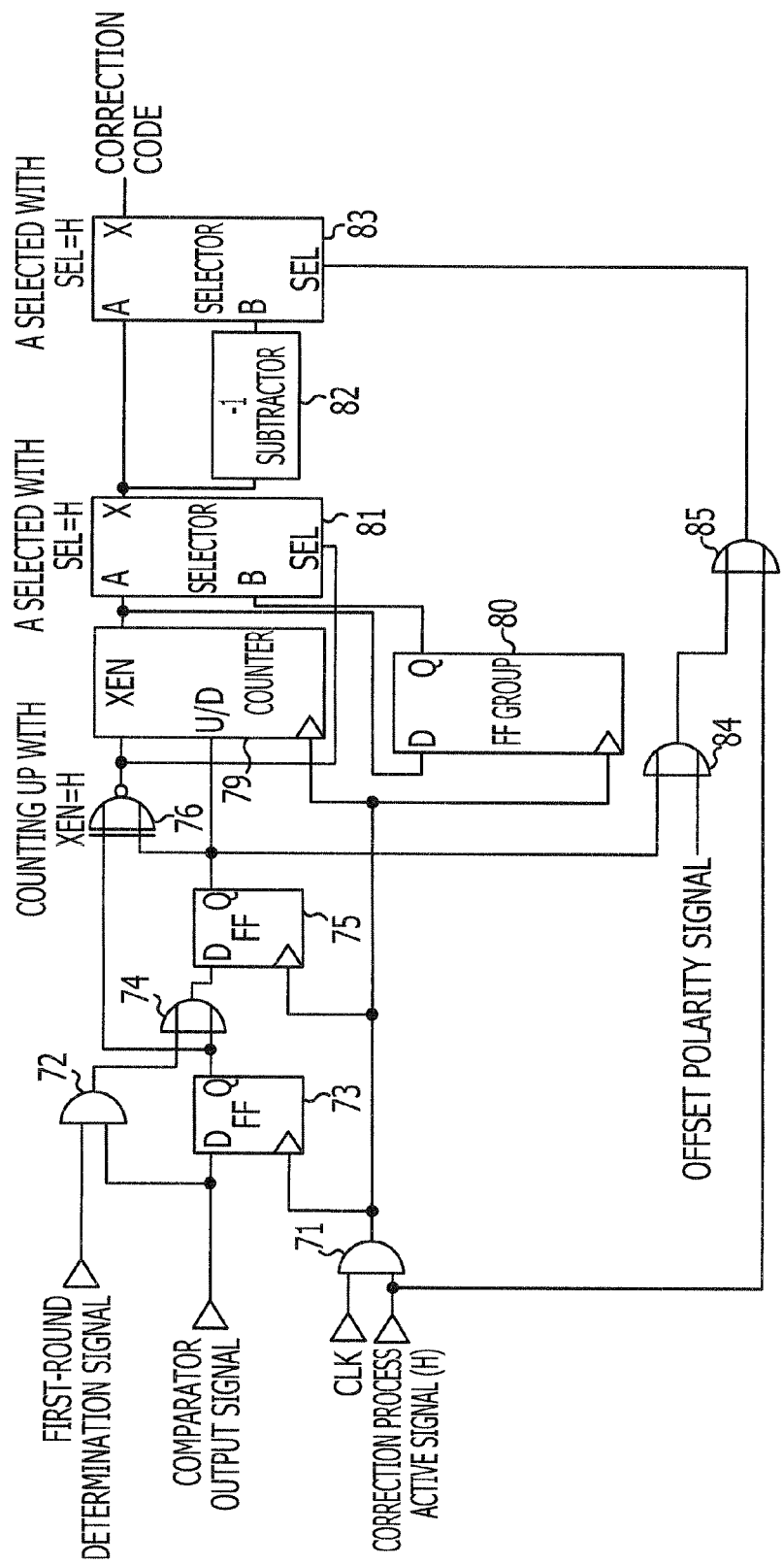
FIG. 41 illustrates an exemplary CDAC correction logic circuit.

FIG. 41 illustrates an exemplary CDAC correction logic circuit 32C. The configuration of The CDAC correction logic circuit 32C of FIG. 41 may be substantially the same as or similar to that of the offset correction logic circuit 31 of FIG. 25. The detailed description of the CDAC correction logic circuit 32C may be omitted or reduced. A counter 79 outputs an initial value "10000." If the first comparison result is at a high level, the counter 79 counts up. If the first comparison result is at a low level, the counter 79 counts down. The output of an FF 75 may indicate the direction of the CDAC correction. If the output of the FF 75 is at a high level, the residual error may be negative. If the output of the FF 75 is at a low level, the residual error may be positive. If the offset polarity signal is at a high level, the residual offset may be negative. If the offset polarity signal is at a low level, the residual offset may be positive. If the residual offset and the CDAC correction error have the same polarity, the CDAC correction code may be set to be the one-step preceding correction code. If the residual offset and the CDAC correction error are different in polarity, the CDAC correction code is maintained.

The output of an EXOR gate 84 becomes low if both the offset polarity signal and the output of the FF 75 are at a high level or at a low level. As illustrated in FIG. 41, a selector 83 selects the output of a subtractor 82 at the B input if the offset polarity signal and the output of the FF 75 are at a high level or at a low level so that an OR gate 85 allows the output of the EXOR gate 84 to pass therethrough after an completion of the correction process.

The correction code is set and stored on a per bit basis. The correction code may be set and stored on a per unit basis of DA conversion data. For example, if six-bit data is handled, six correction codes are set. If the correction codes are set in the DA conversion data, 64 correction codes are set.

All the reference capacitors may be set in accordance with the power of 2 instead of arranging the bridge capacitor Cb.

Figure 42:
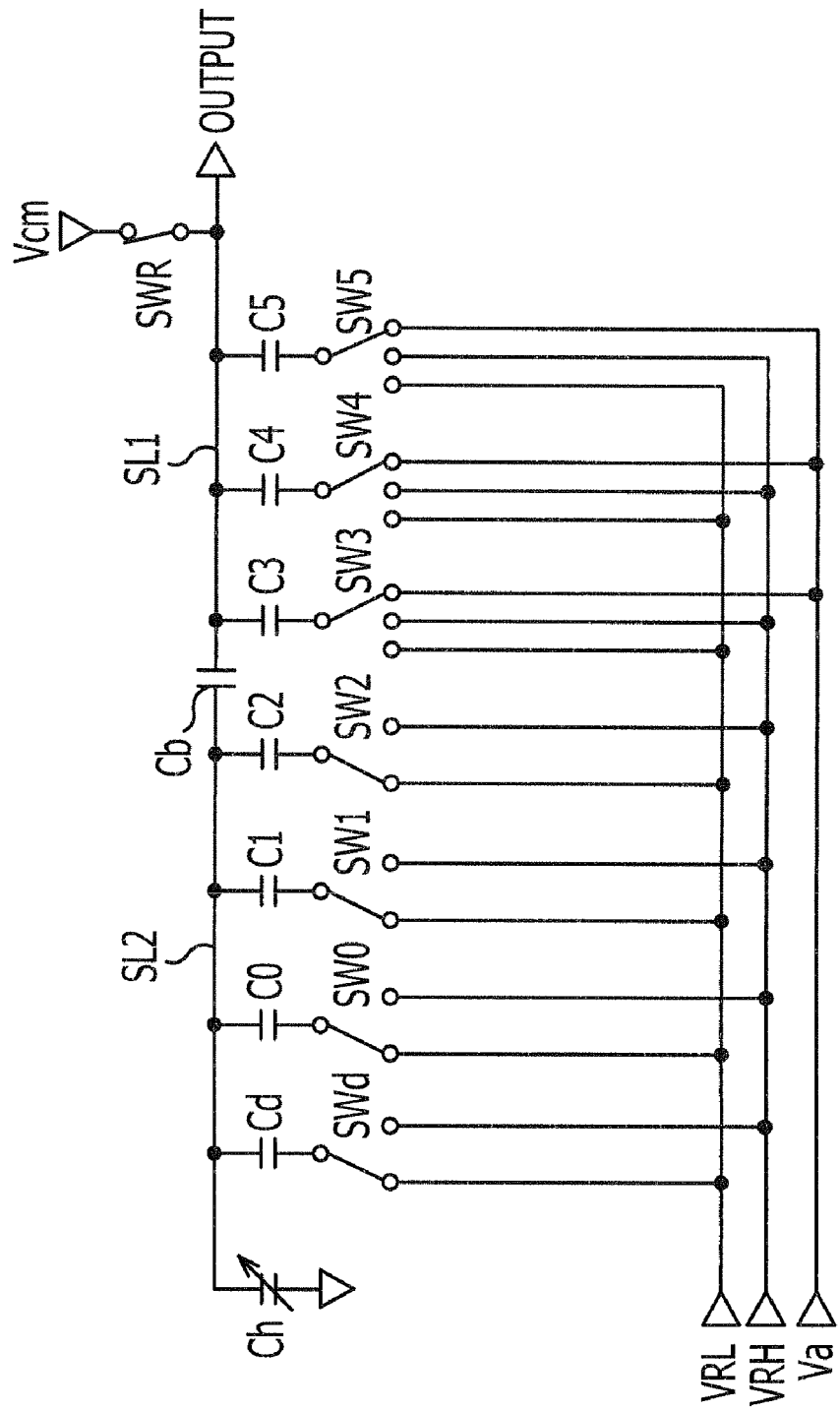
FIG. 42 illustrates an exemplary CDAC with a bridge capacitor correction function.

FIG. 42 illustrates an exemplary CDAC with a bridge capacitance correction function. In the CDAC 11A of FIG. 26, the other terminals of the lower side capacitors C0-C2 and the dummy capacitor Cd are coupled via the switches SW0-SW2 and SWd to one of the input terminals of the upper reference voltage VRH, the lower reference voltage VRL, and the analog signal Va. In the CDAC 11A with the bridge capacitance correction function of FIG. 42, the other terminals of the lower side capacitors C0-C2 and the dummy capacitor Cd are coupled via the switches SW0-SW2 and SWd to one of the input terminals of the upper reference voltage VRH and the lower reference voltage VRL. The other terminals may not be coupled to the input terminal of the analog signal Va. The capacitor Ch of FIG. 42 may correspond to the four correction capacitors hC0-hC3 and the switches hSW0-hSW3 of FIG. 26. The operation of the CDAC of FIG. 42 may be substantially the same as or similar to the operation of the CDAC of FIG. 26.

Figure 43:
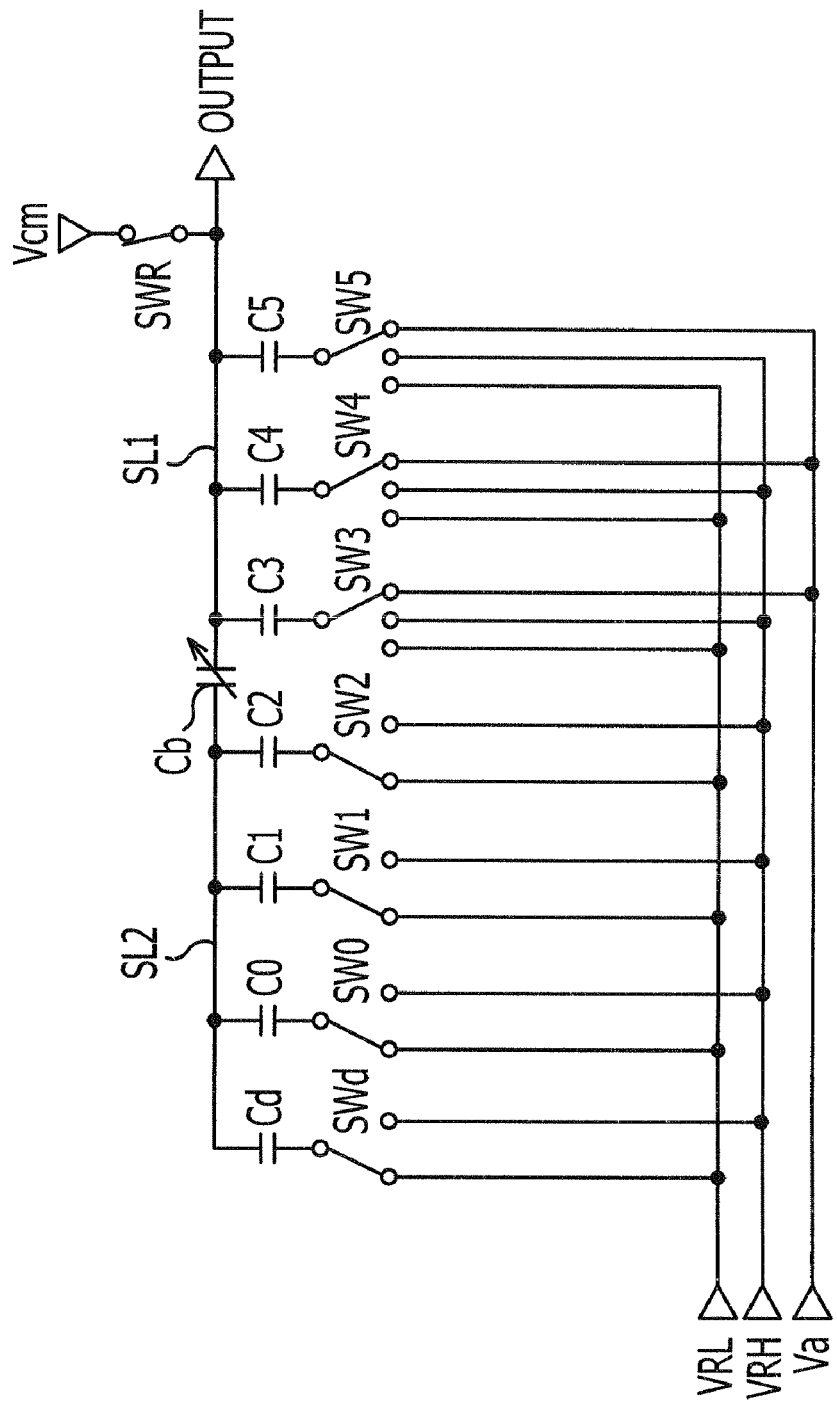
FIG. 43 illustrates an exemplary CDAC with a bridge capacitor correction function.

FIG. 43 illustrates an exemplary CDAC with a bridge capacitance correction function. The bridge capacitor of the CDAC with the bridge capacitance correction function of FIG. 43 may be variable. The configuration of the CDAC with the bridge capacitance correction function of FIG. 43 may be substantially the same as or similar to the configuration of each of the CDACs of FIGS. 35 and 42. The discussion thereof may be omitted or reduced.

Figure 44:
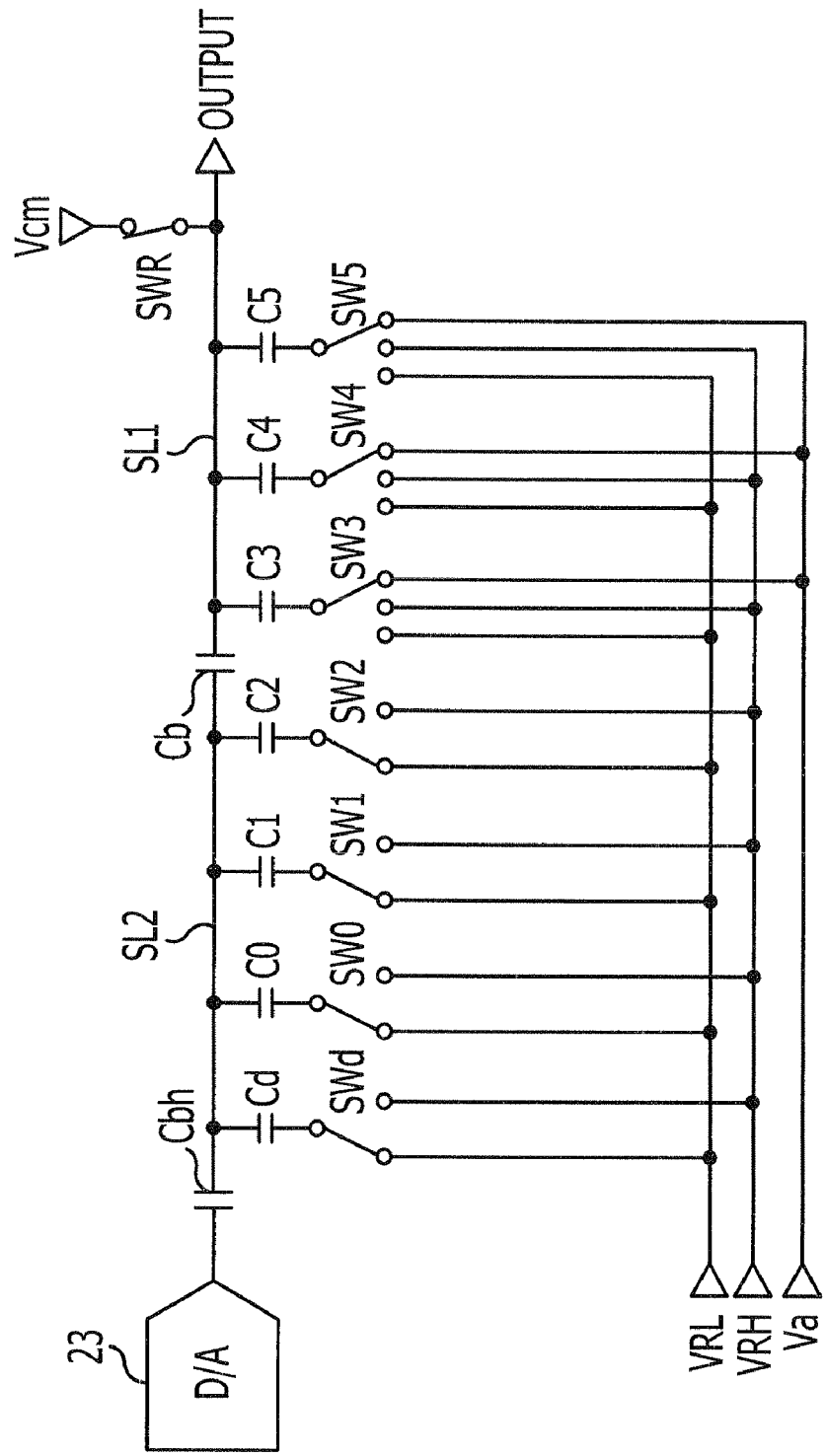
FIG. 44 illustrates an exemplary CDAC with a linear error correction function.

FIG. 44 illustrates an exemplary CDAC with the linear error correction function. The configuration of the CDAC with the linear error correction function of FIG. 44 may be substantially the same as or similar to the configuration of each of the CDACs 11C with the linear error correction function of FIGS. 38 and 42. The detailed discussion may be omitted or reduced.

Figure 45:
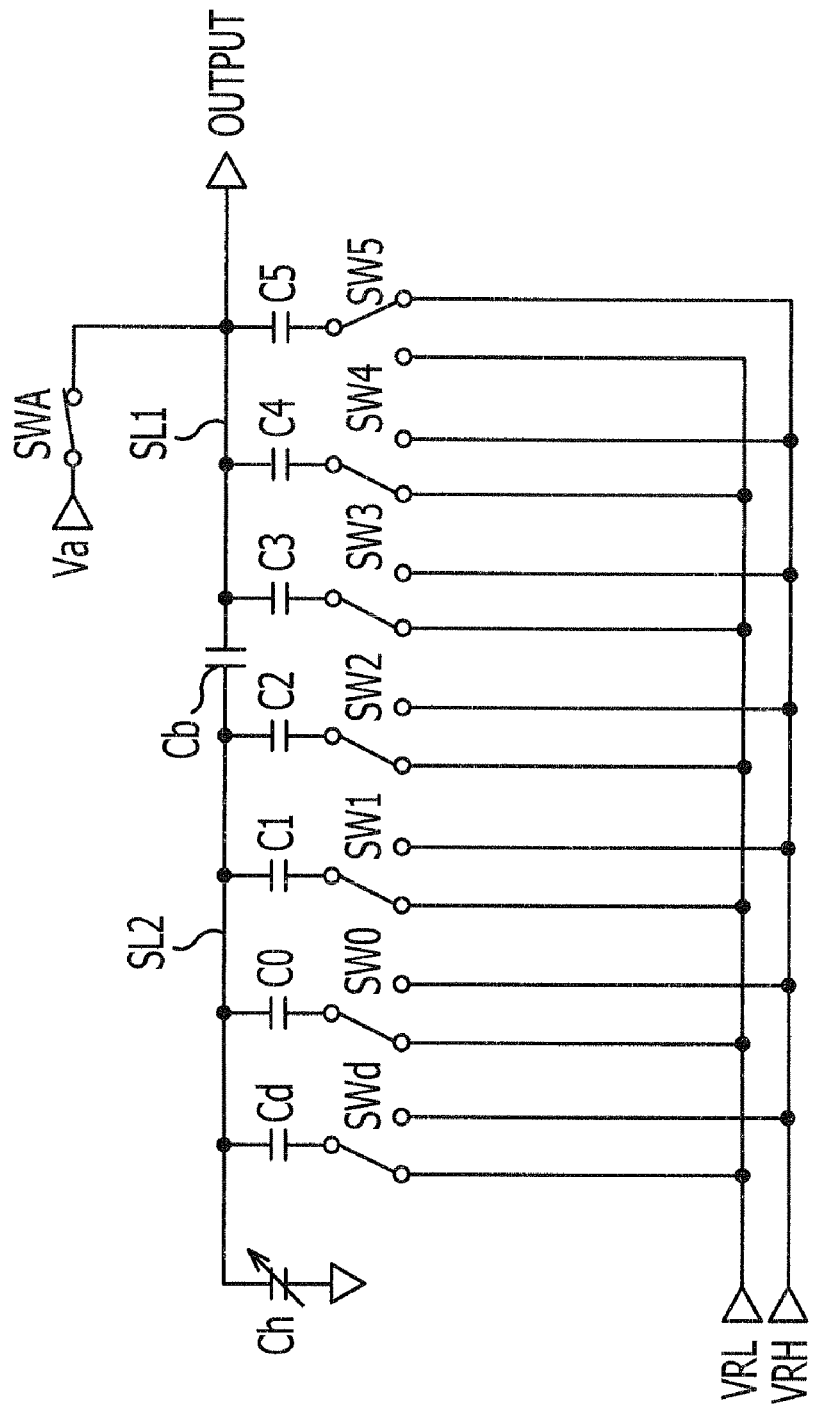
FIG. 45 illustrates an exemplary CDAC with a bridge capacitor correction function.

FIG. 45 illustrates an exemplary CDAC with a bridge capacitance correction function. In the CDAC 11A of FIG. 26, the other terminals of the lower side capacitors C0-C2, the three upper side capacitors C3-C5, and the dummy capacitor Cd are coupled via the switches SW0-SW2 and SWd to one of the input terminals of the upper reference voltage VRH, the lower reference voltage VRL, and the analog signal Va. In the CDAC 11A with the bridge capacitance correction function of FIG. 42, the other terminals of the lower side capacitors C0-C2, the three upper side capacitors C3-C5, and the dummy capacitor Cd are coupled via the switches SW0-SW2 and SWd to one of the input terminals of the upper reference voltage VRH and the lower reference voltage VRL. The other terminals might not be coupled to the input terminal of the analog signal Va. In the CDAC 11A of FIG. 26, the common signal line SL1 is coupled to the reference voltage via the switch SWR. In the CDAC of FIG. 45, the common signal line SL1 is coupled to the input terminal of the analog signal Va. The capacitor Ch of FIG. 42 may correspond to the four correction capacitors hC0-hC3 and the switches hSW0-hSW3 of FIG. 26. The operation of the CDAC of FIG. 42 may be substantially the same or similar to the operation of the CDAC of FIG. 26.

Figure 46:
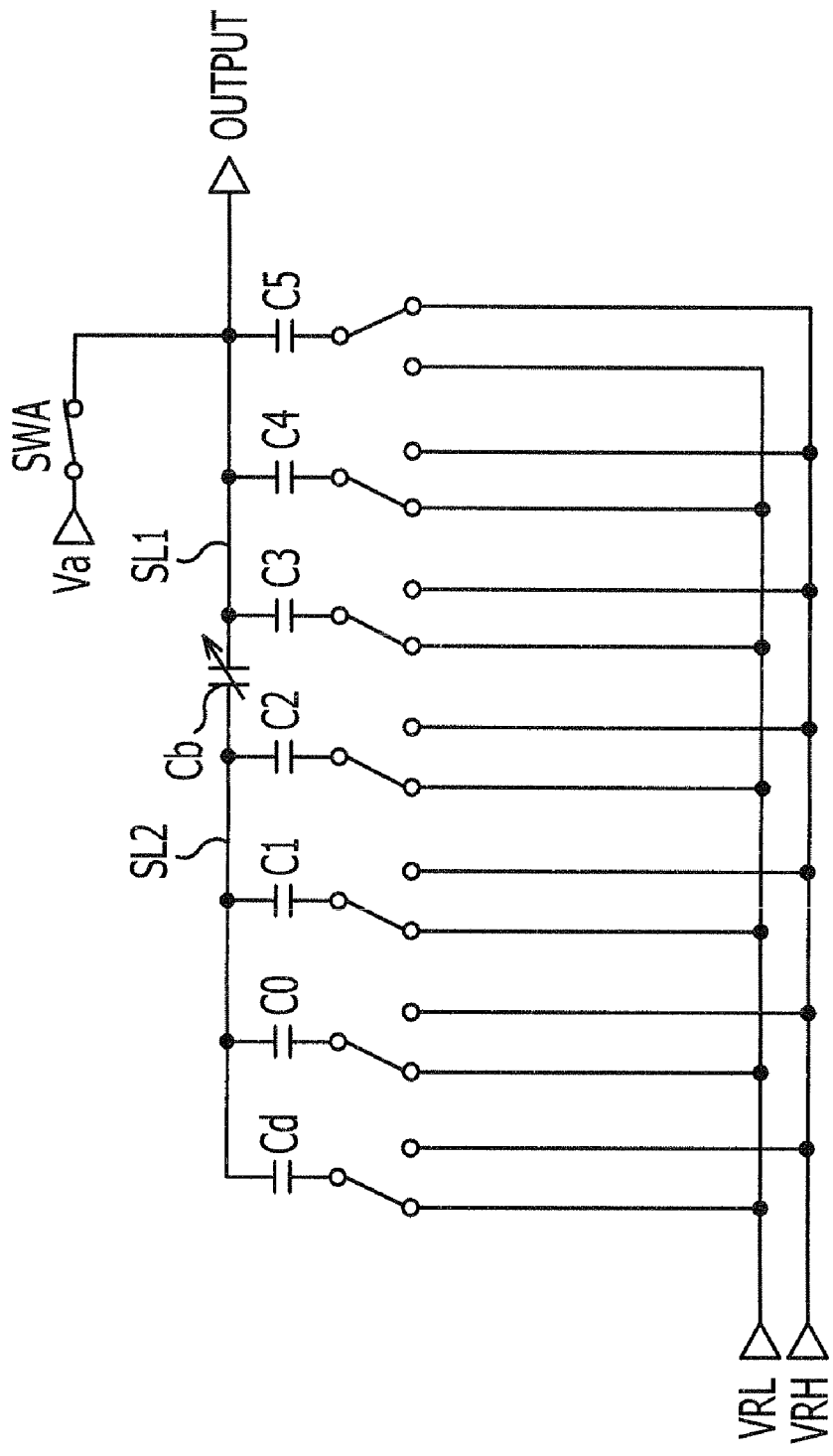
FIG. 46 illustrates an exemplary CDAC with a bridge capacitor correction function.

FIG. 46 illustrates an exemplary CDAC with the bridge capacitance correction function. The configuration of the CDAC with the bridge capacitance correction function of FIG. 46 may be substantially the same as or similar to the configuration of each of the CDACs of FIGS. 35 and 46.

Figure 47:
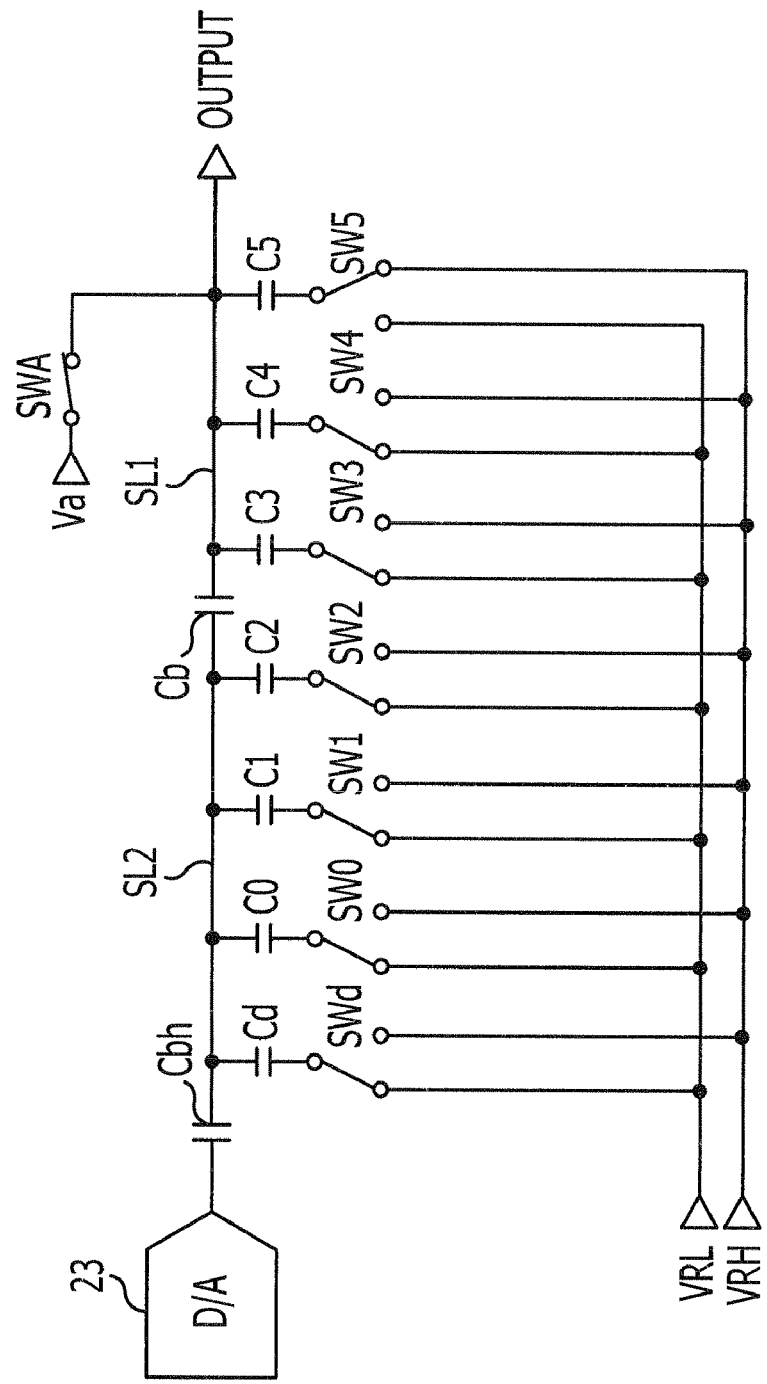
FIG. 47 illustrates an exemplary CDAC with a linear error correction function.

FIG. 47 illustrates an exemplary CDAC with the linear error correction function. The configuration of the CDAC with the linear error correction function of FIG. 47 may be substantially the same as or similar to the configuration of each of the CDACs 11C of FIGS. 38 and 45.

Figure 48:
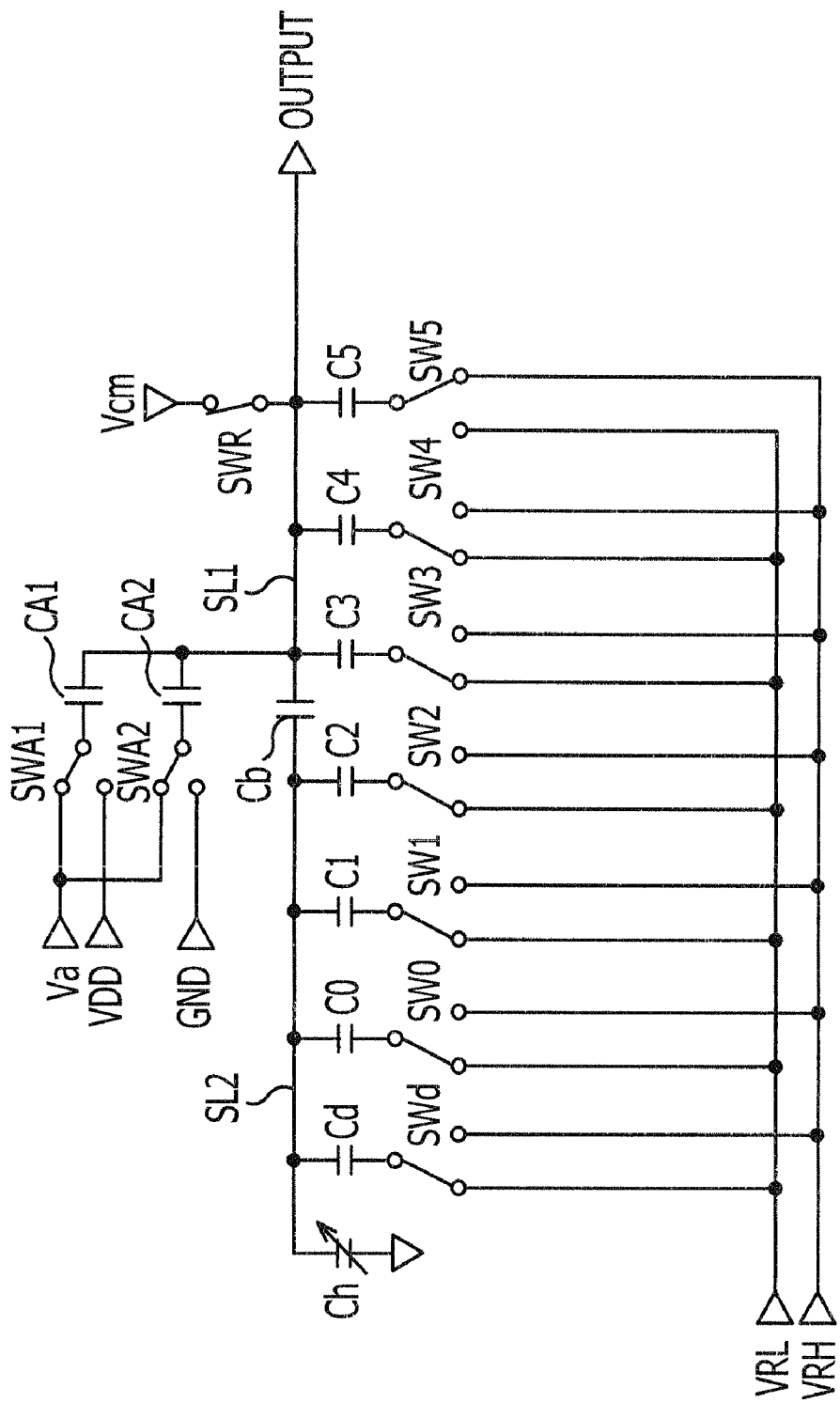
FIG. 48 illustrates an exemplary CDAC with a bridge capacitor correction function.

FIG. 48 illustrates an exemplary CDAC with the bridge capacitance correction function. In the CDAC 11A of FIG. 26, the other terminals of the lower side capacitors C0-C2, the three upper side capacitors C3-C5, and the dummy capacitor Cd are coupled via the switches SW0-SW2 and SWd to one of the input terminals of the upper reference voltage VRH, the lower reference voltage VRL, and the analog signal Va. In the CDAC of FIG. 48, the other terminals of the capacitors C0-C2, C3-C5 and Cd are coupled via the switches SW0-SW5 and SWd to one of the input terminals of the upper reference voltage VRH and the lower reference voltage VRL. The other terminals might not be coupled to the input terminal of the analog signal Va. The common signal line SL1 may be coupled to the input terminal of the analog signal Va or a high voltage source VDD via a capacitor CA1 and a switch SW1. The common signal line SL1 may be coupled to the input terminal of the analog signal Va or a low voltage source GND via a capacitor CA2 and a switch SW2. The capacitor Ch of FIG. 48 may correspond to the four correction capacitors hC0-hC3 and the switches hSW0-hSW3 of FIG. 26. The operation of the CDAC of FIG. 49 is substantially the same as or similar to the operation of the CDAC of FIG. 26.

Figure 49:
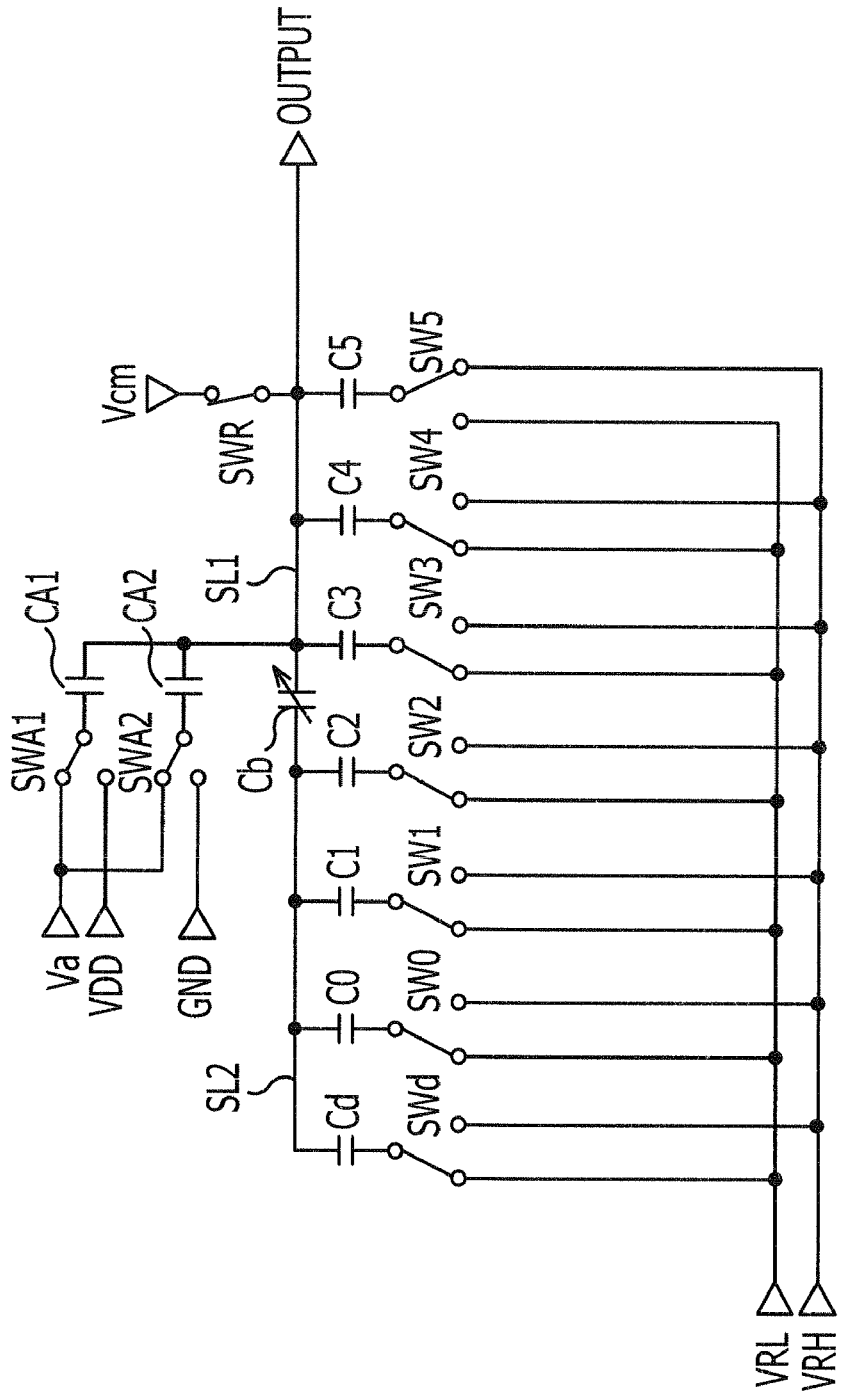
FIG. 49 illustrates an exemplary CDAC with a bridge capacitor correction function.

FIG. 49 illustrates an exemplary CDAC with the bridge capacitance correction function. The bridge capacitor FIG. 49 may be variable. The configuration of the CDAC with the bridge capacitance correction function of FIG. 49 may be substantially the same as or similar to to each of the CDACs of FIGS. 35 and 48.

Figure 50:
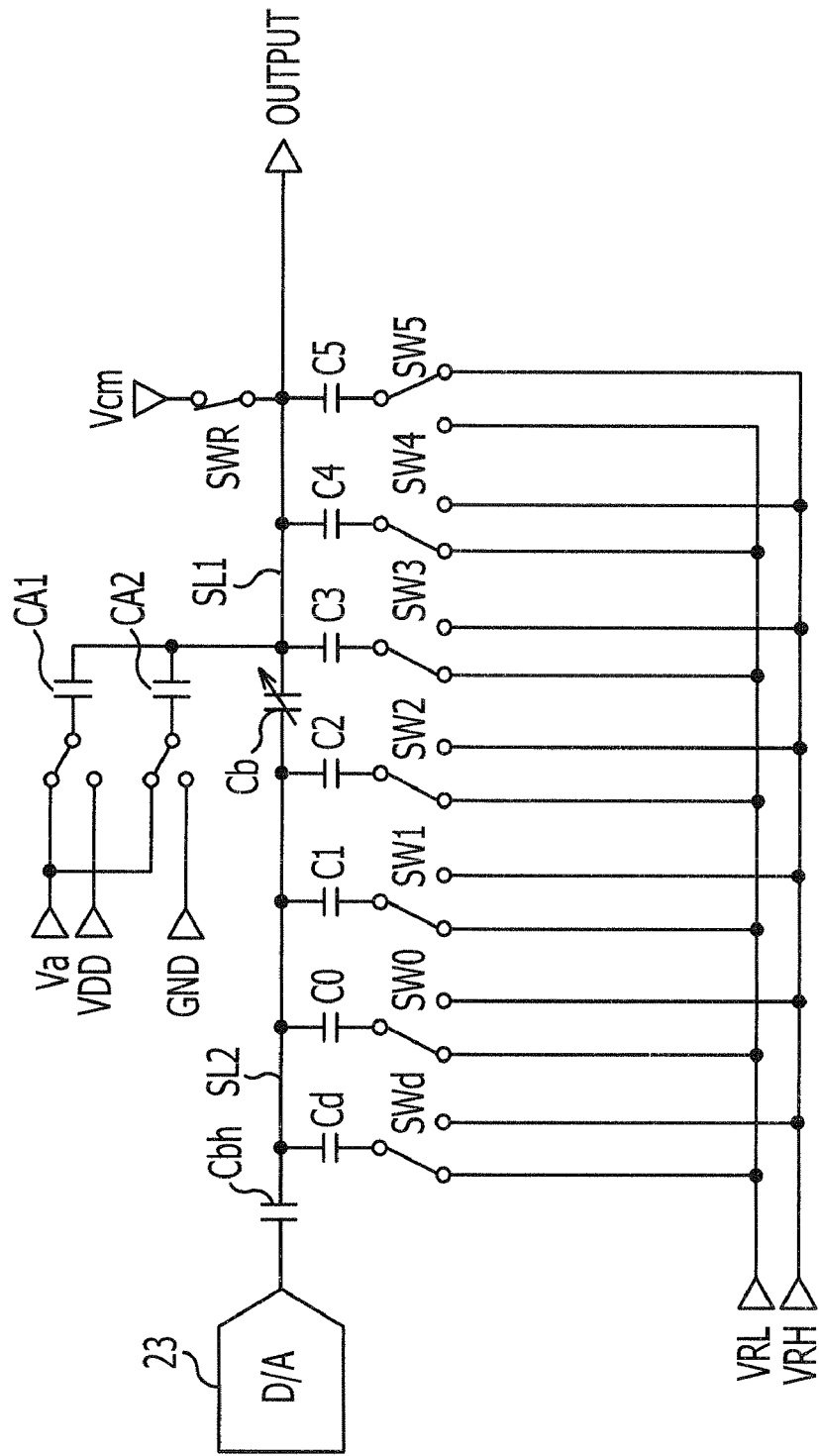
FIG. 50 illustrates an exemplary CDAC with a bridge capacitor correction function.

FIG. 50 illustrates an exemplary CDAC with a linear error correction function. The configuration of the CDAC with the linear error correction function of FIG. 50 may be substantially the same as or similar to the configuration of each of the CDACs of FIGS. 38 and 48.

The AD converter device may include one of a single-ended CDAC and a differential CDAC.

Figure 51:
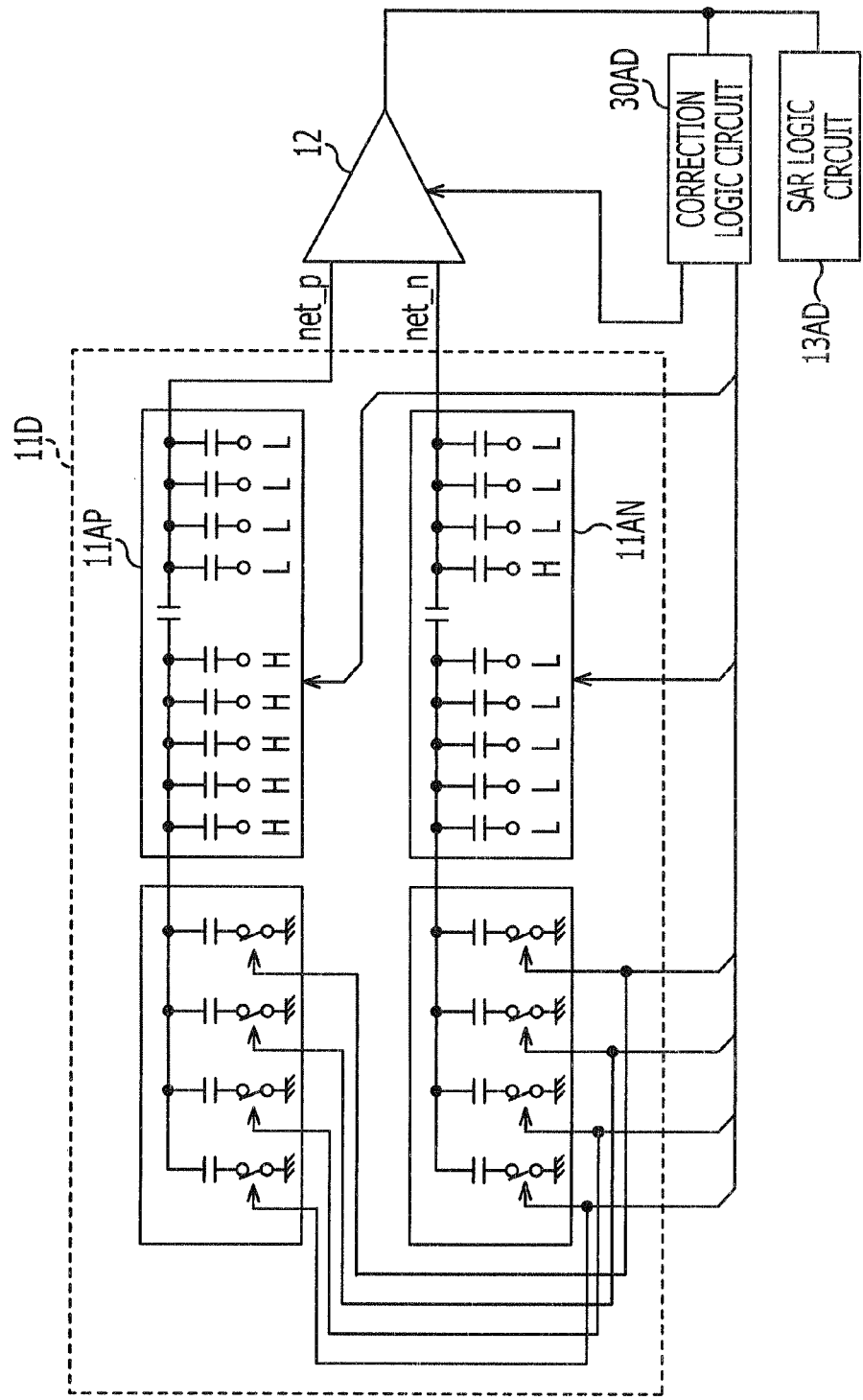
FIG. 51 illustrates an exemplary ADC device.

FIG. 51 illustrates an exemplary AD converter device. The AD converter device of FIG. 51 includes an eight-bit differential CDAC 11D. The AD converter device includes a differential CDAC 11D, a comparator 12, a SAR logic circuit 13AD, and a correction logic circuit 30AD. The comparator 12 performs an offset correction process. The configuration of the comparator 12 of FIG. 51 may be substantially the same as or similar to the configuration of the comparator 12 of FIG. 26. The correction logic circuit 30AD may include one of an offset correction logic circuit and a differential CDAC correction logic circuit.

The differential CDAC 11D includes a positive side CDAC 11AP receiving a positive side signal of the analog signal Va and a negative side CDAC 11AN receiving a negative side signal of the analog signal Va. The configuration of each of the positive side CDAC 11AP and the negative side CDAC 11AN may be substantially the same as or similar to the configuration of the CDAC 11A with the bridge capacitance correction function of FIG. 26. Four capacitors illustrated on the left-side portion in the figure may correspond to correction capacitors. In FIG. 51, reference symbols such as switches SW0-SW5, SWd, and SWR may be omitted or reduced.

When the capacitance of the bridge capacitor of the differential CDAC 11D is corrected, the positive side CDAC 11AP and the negative side CDAC 11AN may set correction capacitors to be coupled to the lower reference voltage VRL respectively. Errors for the positive side and the negative side may be reduced together, and the capacitance correction on the positive side and the capacitors on the negative side may be performed.

If all the correction capacitors are not coupled, the three upper reference capacitors (corresponding to bits 5-7) are coupled to the lower reference voltage VRL in each of the positive side CDAC 11AP and the negative side CDAC 11AN. In the positive side CDAC 11AP, the reference capacitor corresponding to bit 4 is coupled to the lower reference voltage VRL, and the reference capacitors corresponding to bits 0-3 and the dummy capacitor are coupled to the upper reference voltage VRH. In the negative side CDAC 11AN, the reference capacitor corresponding to bit 4 is coupled to the upper reference voltage VRH, and the reference capacitors corresponding to bits 0-3 and the dummy capacitor are coupled to the lower reference voltage VRL. In each of the positive side CDAC 11AP and the negative side CDAC 11AN, the switch SWR (not illustrated) couples an output signal line to a reference voltage.

The switch SWR is set to be open. In the positive side CDAC 11AP, the reference capacitor corresponding to bit 4 is coupled to the upper reference voltage VRH, and the reference capacitors corresponding to bits 0-3 and the dummy capacitor are coupled to the lower reference voltage VRL. In the negative side CDAC 11AN, the reference capacitor corresponding to bit 4 is coupled to the lower reference voltage VRL, and the reference capacitors corresponding to bits 0-3 and the dummy capacitor are coupled to the upper reference voltage VRH. The comparison result of the comparator 12 may become low in the initial state. Each of the positive side CDAC 11AP and the negative side CDAC 11AN changes the correction code and couples the correction capacitors in a stepwise fashion until the comparison result of the comparator 12 turns high. When the comparison result of the comparator 12 turns high, the capacitance stops changing.

Whether the residual offset and the bridge correction residual error have the same polarity or not is determined. If the residual offset and the bridge correction residual error do not have the same polarity, the correction code is maintained. If the residual offset and the bridge correction residual error have the same polarity, the correction code is set to be the correction code from one step preceding.

In the differential CDAC 11D of FIG. 51, the bridge capacitors of the positive side CDAC 11AP and the negative side CDAC 11AN may be corrected as a variable capacitor as illustrated in FIG. 35. The correction code is maintained or corrected depending on the polarity of the residual offset and the bridge correction residual error.

Figure 52:
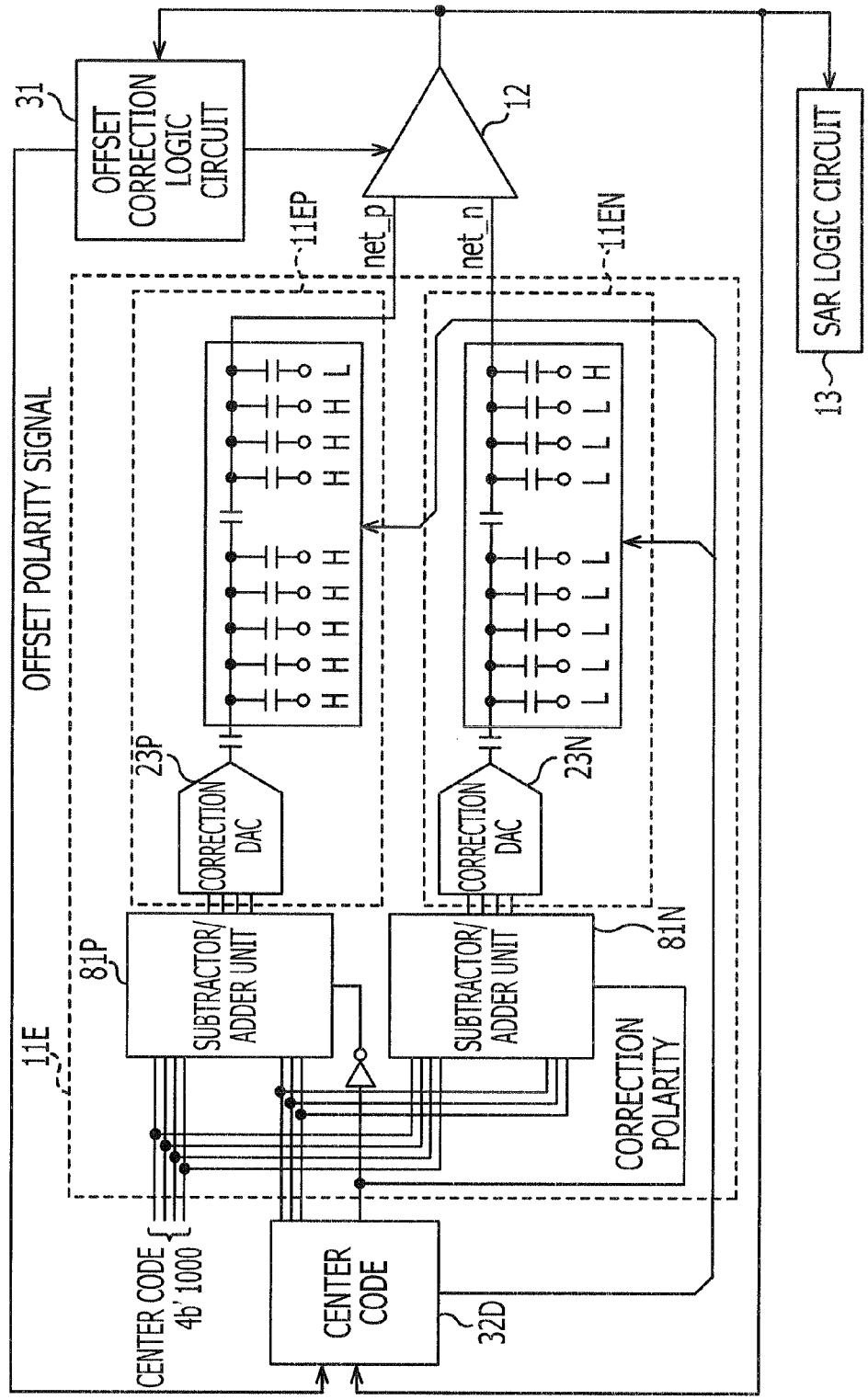
FIG. 52 illustrates an exemplary ADC device.

FIG. 52 illustrates an exemplary AD converter device. The AD converter device of FIG. 52 may include an eight-bit differential CDAC. As illustrated in FIG. 52, the AD converter device includes a differential CDAC 11E, a comparator 12, a SAR logic circuit 13CD, an offset correction logic circuit 31, and a differential CDAC correction logic circuit 32D. The offset correction logic circuit 31 and the differential CDAC correction logic circuit 32D correspond to the correction logic circuit 30.

The comparator 12 performs an offset correction, and may correspond to the comparator 12 of FIG. 26. An offset correction logic circuit 31 of FIG. 51 may correspond to the offset correction logic circuit of FIG. 26.

The differential CDAC 11E includes a positive side CDAC 11EP receiving a positive side signal of the analog signal Va, a negative side CDAC 11EN receiving a negative side signal of the analog signal Va, two subtractor/adder units 81P and 81N, and inverter 82. Configurations of the positive side CDAC 11EP and the negative side CDAC 11EN are substantially the same as or similar to the configurations to the CDACs 11C with the six-bit linear error correction function of FIGS. 37-39 respectively. In FIG. 52, the switches SW0-SW5, SWd, and SWR may not be illustrated.

When the linearity of the differential CDAC 11E is corrected, the correction code to be supplied to the correction CDAC 23P and the correction CDAC 23N may be set on a per bit basis in each of the positive side CDAC 11EP and the negative side CDAC 11EN. Errors both of the positive side and the negative side may be reduced, and the capacitance correction may be performed in the positive side and the negative side.

The correction code may be set starting from the least significant bit. The correction code of the most significant bit may be set after the correction codes of lower 7 bits are set. A voltage corresponding to an intermediate voltage is output from the correction CDAC 23P and the correction CDAC 23N. In the positive side CDAC 11EP as illustrated in FIG. 52, the reference capacitor corresponding to the most significant bit is coupled to the lower reference voltage VRL and the remaining reference capacitors and the dummy capacitor are coupled to the upper reference voltage VRH. In the negative side CDAC 11EN, the reference capacitor corresponding to the most significant bit is coupled to the upper reference voltage VRH and the remaining reference capacitors and the dummy capacitor are coupled to the lower reference voltage VRL. In each of the positive side CDAC 11EP and the negative side CDAC 11EN, the switch SWR (not illustrated) couples an output signal line to a reference voltage.

The switch SWR is set to be open. In the positive side CDAC 11EP, the reference capacitor corresponding to the most significant bit is coupled to the upper reference voltage VRH and the remaining reference capacitors and the dummy capacitor are coupled to the lower reference voltage VRL. In the negative side CDAC 11EN, the reference capacitor corresponding to the most significant bit is coupled to the lower reference voltage VRL and the remaining reference capacitors and the dummy capacitor are coupled to the upper reference voltage VRH. In response to the determination result of this setting, the correction codes supplied to the correction CDAC 23P and the correction CDAC 23N may be changed in an opposite direction from each other. For example, if the comparison result of the comparator 12 is at a high level, the correction code supplied to the correction CDAC 23P is reduced by 1, and the correction code supplied to the correction CDAC 23N is increased by 1. Until the comparison result of the comparator 12 is changed, the correction codes supplied to the correction CDAC 23P and the correction CDAC 23N are changed in mutually opposite directions and the correction voltages are changed in a stepwise fashion. The changing of the capacitors stops when the comparison result changes. Whether the residual offset and the bridge correction of the residual error have the same polarity or not is determined. If the residual offset and the bridge correction residual error do not have the same polarity, the correction code is maintained. If the residual offset and the bridge correction residual error have the same polarity, the correction code is set to be the one-step preceding correction code.

The subtractor/adder units 81P and 81N count up or count down in response to the correction polarity output from the differential CDAC correction logic circuit 32D. When the subtractor/adder unit 81P counts up, the subtractor/adder unit 81N counts down. When the subtractor/adder unit 81P counts down, the subtractor/adder unit 81N counts up.

Figure 53:
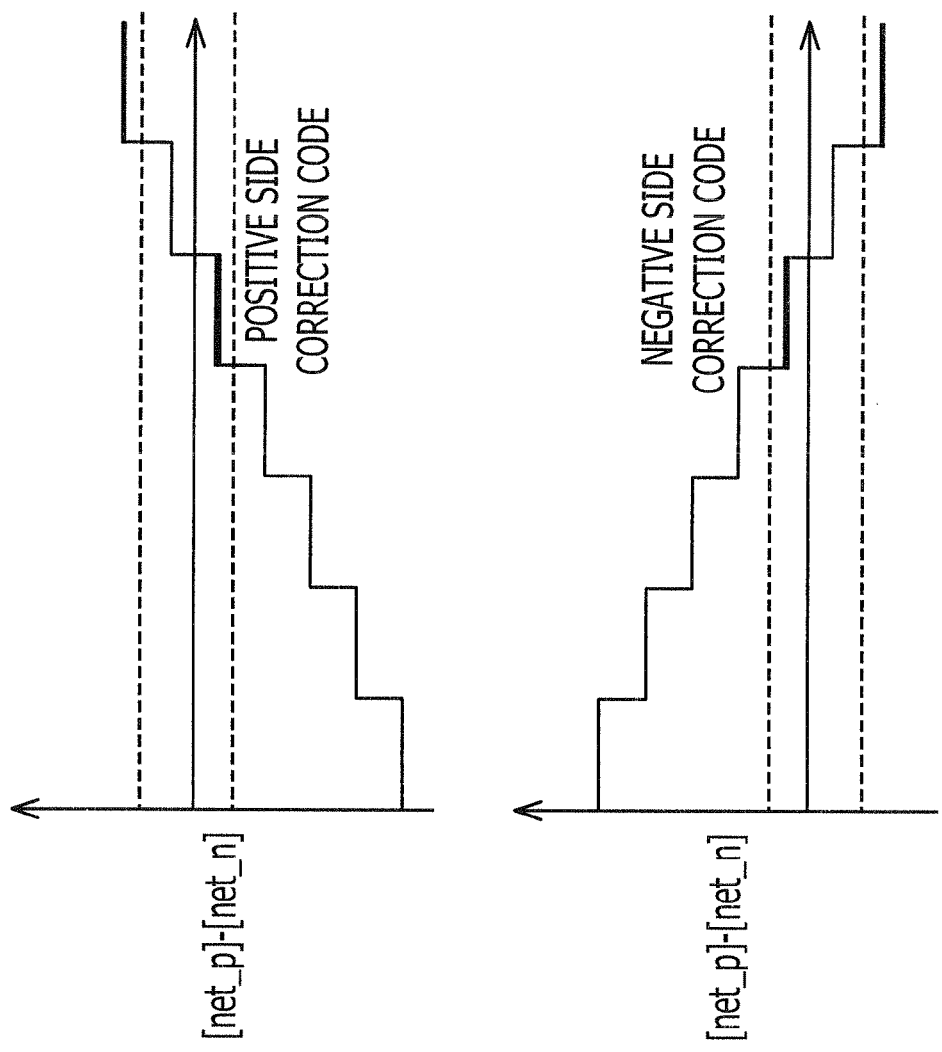
FIG. 53 illustrates an exemplary correction code.

FIG. 53 illustrates an exemplary correction code. FIG. 53 illustrates a change in the difference between the positive and negative input voltages in response to a change in the correction code during the correction process. The upper graph of FIG. 53 represents a change in the difference between the positive and negative input voltages in response to a change in the positive side correction code input to the correction CDAC 23P when the first comparison result is at a low level. The lower graph of FIG. 53 represents a change in the difference between the positive and negative input voltages in response to a change in the negative side correction code input to the correction CDAC 23N when the first comparison result is at a high level. As illustrated in the upper graph of FIG. 53, when the first comparison result is at a low level, the correction code is maintained if the offset polarity signal is negative, and the correction code is set to be the one-step preceding correction code if the offset polarity signal is positive. As illustrated in the lower graph of FIG. 53, when the first comparison result is at a high level, the correction code is maintained if the offset polarity signal is positive, and the correction code is set to be the one-step preceding correction code if the offset polarity signal is negative.

Figure 54:
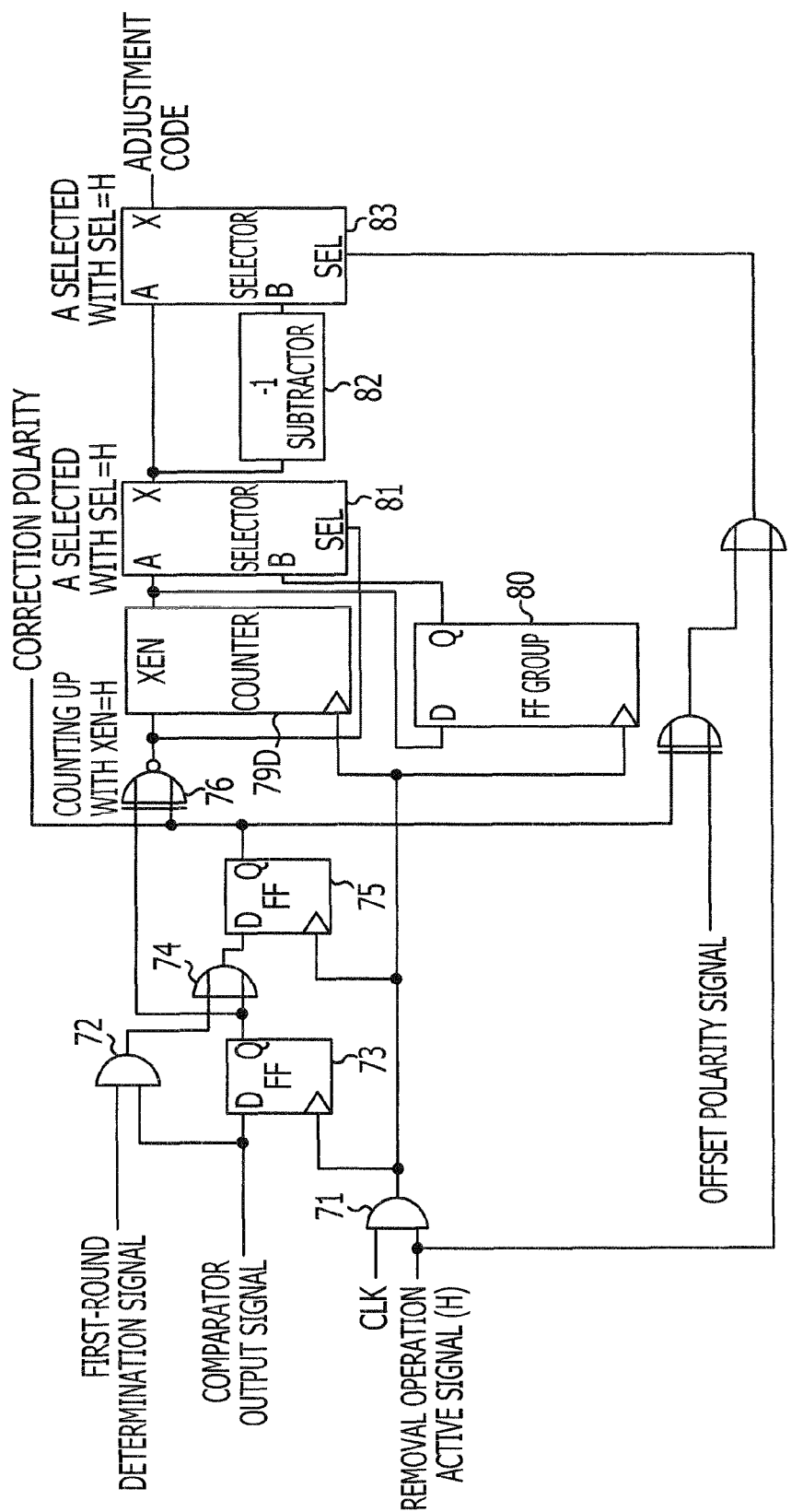
FIG. 54 illustrates an exemplary differential CDAC correction logic circuit.

FIG. 54 illustrates an exemplary differential CDAC. The configuration of the differential CDAC correction logic circuit 32D of FIG. 54 is substantially the same as or similar to the configuration of the CDAC correction logic circuit 32C of FIG. 41. The counter 79D in the CDAC correction logic circuit 32C outputs "000" as an initial value and counts up. The FF 75 outputs a correction polarity to the subtractor/adder units 81P and 81N.

Figure 55:
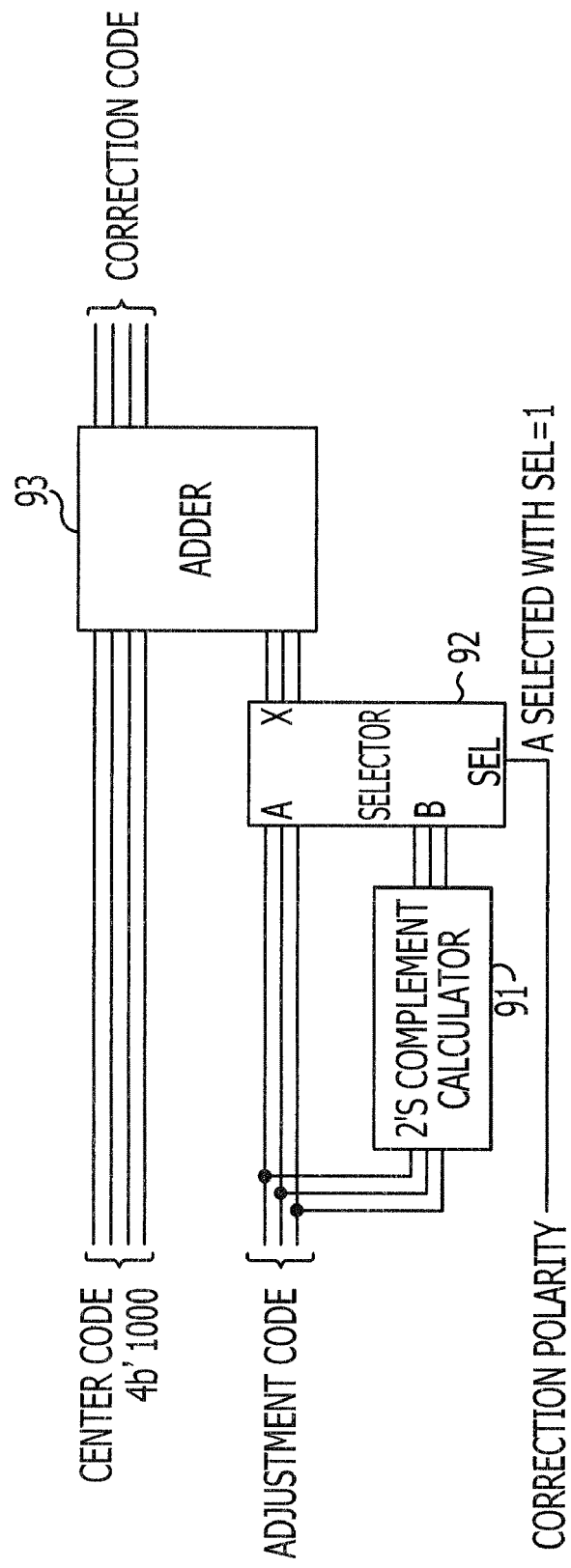
FIG. 55 illustrates an exemplary subtractor-adder unit.

FIG. 55 illustrates an exemplary subtractor/adder unit. Each of the subtractor/adder units 81P and 81N includes a 2's complement calculator 91, a selector 92, and an adder 93. Each of the subtractor/adder units 81P and 81N operates as an adder when the correction polarity output from the differential CDAC correction logic circuit 32D is at a high level, and operates as a subtractor when the correction polarity output from the differential CDAC correction logic circuit 32D is at a low level.

If the subtractor/adder unit operates as an adder, the selector 92 selects the A input thereof and outputs the A input to the adder 93. Each of the subtractor/adder units 81P and 81N adds an adjustment code output from the differential CDAC correction logic circuit 32D to a center code "1000" corresponding to the center of the four-bit correction code, and outputs the resulting sum as a correction code. Since the adjustment code is counted up, the correction code is also counted up.

If the subtractor/adder unit operates as an adder, the 2's complement calculator 91 outputs a complement of the adjustment code. The selector 92 selects the B input and outputs the B input to the adder 93. Each of the subtractor/adder units 81P and 81N subtracts the adjustment code output from the differential CDAC correction logic circuit 32D from the center code "1000" corresponding to the center of the four-bit correction code, and outputs the resulting sum as a correction code. Since the adjustment code is counted up, the correction code is counted down.

The single-ended AD converter devices illustrated in FIGS. 6-50 are applicable for the AD converter device of FIG. 51 or FIG. 52 if the single-ended AD converter devices illustrated in FIGS. 6-50 are modified to a differential type.

The correction code increases or decreases step by step. If the digital correction code is 4 bits, the digital correction code changes in 16 steps. Therefore, the search time for searching an entire correction range of the offset voltage may be long. The search method may include a binary search method in which each bit of the digital correction code is determined starting from the most significant bit.

Figure 56:
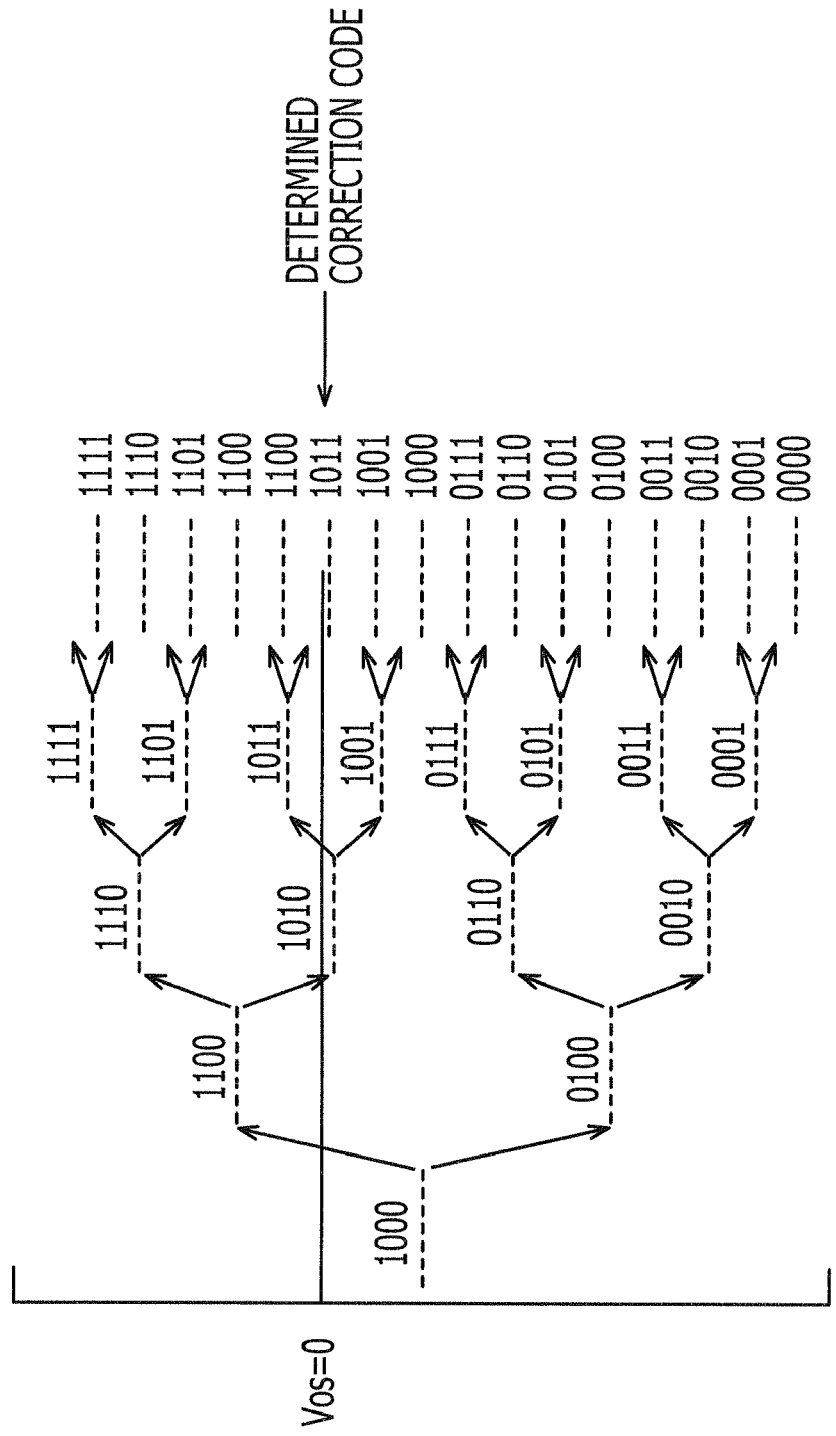
FIG. 56 illustrates an exemplary binary search.

FIG. 56 illustrates an exemplary binary search. The binary search of FIG. 56 may be a four-bit binary search. If the four-bit digital correction code is 1010, the offset Vos is set to 0. In a first operation, a comparison operation is performed with the digital correction code 1000. Since the offset voltage is negative, the first bit is determined as "1." In a second operation, the comparison operation is performed with the digital correction code 1100. Since the offset voltage is positive, the second bit is determined as "0." In a third operation, the comparison operation is performed with the digital correction code 1010. Since the offset voltage is negative, the third bit is determined as "1." In a fourth operation, the comparison operation is performed with the digital correction code 1011. Since the offset voltage is negative, the fourth bit is determined as "0." The residual offset is negative in the binary search of FIG. 56.

Since the residual offset and the residual error of the CDAC correction are determined as positive or negative in the binary search, the residual offset and the residual error of the CDAC correction may cancel each other.

The offset correction circuit and the CDAC correction circuit perform the correction so that the residual offset and the residual error of the CDAC correction may cancel each other. The correction process may be performed at a startup of the AD converter device, and may be performed at any time in response to the correction code stored subsequent to the startup.

The canceling operation of the residual offset of the comparator and the residual error of the CDAC may be used in a setting of the correction code in a manufacturing phase of the AD converter device or in a setting of the correction code of the AD converter device. The AD converter device may include the circuit of FIG. 13, which applies an offset correction voltage of the comparator in response to the offset correction code, and the CDAC error correction mechanism of FIGS. 26 and 37. During the manufacturing phase, an external test device may set up the offset correction code of the comparator and the error correction code of the CDAC. The correction code may be adjusted so that the residual offset of the comparator and the residual error of the CDAC cancel each other, and is set in a correction code register in the AD converter device.

Example aspects in accordance with the present invention have now been described in accordance with the above advantages. It will be appreciated that these examples are merely illustrative of the invention. Many variations and modifications will be apparent to those skilled in the art.

The invention claimed is:

1. An analog-to-digital (AD) converter device, comprising:
a capacitive digital-to-analog converter (DAC) including a reference capacitor group having a plurality of capacitors which are weighted with a ratio, and to store an analog input signal applied at a sampling time, one terminal of each of the plurality of capacitors being coupled to a common signal line, the other terminal of each of the plurality of capacitors being coupled to at least one of a plurality of reference power supplies via at least one of a plurality of switches;
a comparator to compare a voltage of the common signal line with a reference voltage; a successive approximation routine circuit to control the plurality of switches based on a comparison result of the comparator;
an offset correction circuit to correct an offset of the comparator; and
a DAC correction circuit to correct an error in a voltage change of the common signal line, the offset correction circuit and the DAC correction circuit to perform a correction so that a residual offset of the comparator and a residual error of the capacitive DAC cancel each other.

2. The AD converter device according to claim 1, wherein the capacitive DAC includes an upper side capacitor group including a plurality of upper capacitors, a lower side capacitor group including a plurality of lower capacitors, and a correction capacitor group including a plurality of correction capacitors, one terminal of each of the plurality of upper capacitors being coupled to the common signal line, one terminal of each of the plurality of lower capacitors being coupled to the common signal line via a bride bridge capacitor, one terminal of each of the plurality of correction capacitors being coupled to the common signal line via a bride bridge capacitor, the other terminal of each of the plurality of correction capacitors being coupled to at least one of the plurality of reference power suppliers, wherein the DAC correction circuit couples the other terminal of at least one of the plurality of correction capacitors to at least one of the plurality of reference power supplies so that the sum of weights of the lower side capacitor group is substantially equal to the weight of a capacitor having a minimum capacitance of the upper side capacitor group.

3. The AD converter device according to claim 1, wherein the capacitive DAC includes an upper side capacitor group including a plurality of upper capacitors, a plurality of bride bridge capacitors, and a lower side capacitor group including a plurality of lower capacitors, one terminal of each of the plurality of upper capacitors being coupled to the common signal line, one terminal of each of the plurality of bride bridge capacitors being coupled to the common signal line, one terminal of each of the plurality of lower capacitors being coupled to the common signal line via one of the plurality of the bride bridge capacitors, wherein the DAC correction circuit performs a correction so that the weight of the lower side capacitor group is substantially equal to a minimum capacitance among the plurality of upper capacitors, upon a change of a capacitance of the bridge capacitor.

4. The AD converter device according to claim 1, wherein the capacitive DAC includes a correction voltage source to output a correction voltage, one terminal of the correction voltage source being coupled to the common signal line via a connection capacitor, and wherein the DAC correction circuit controls the correction voltage source to change the voltage of the common signal line by changing the weight of the reference capacitor group in accordance with a power of 2.

5. The AD converter device according to claim 4, wherein the reference capacitor group includes an upper side capacitor group including a plurality of upper capacitors, a plurality of bride bridge capacitors, and a lower side capacitor group including a plurality of lower capacitors, one terminal of each of the plurality of upper capacitors being coupled to the common signal line, one terminal of each of the plurality of bride bridge capacitors being coupled to the common signal line, one terminal of each of the plurality of lower capacitors being coupled to the common signal line via one of the plurality of the bride bridge capacitors, and wherein the correction voltage source is coupled to the other terminal of one of the plurality of bridge capacitors via the connection capacitor.

6. The AD converter device according to claim 1, wherein the offset correction circuit corrects the offset of the comparator in a stepwise fashion and sets a first polarity of a residual offset, and wherein the DAC correction circuit maintains a correction value of the capacitive DAC when a residual error of the capacitive DAC has a polarity opposite to the first polarity, and sets the correction value of the capacitive DAC to a previous correction value when the residual error of the capacitive DAC has the same polarity as the first polarity.

7. The AD converter device according to claim 1, wherein the offset correction circuit corrects the offset of the comparator in a stepwise fashion; wherein the DAC correction circuit corrects the error of the capacitive DAC, checks whether a residual error and a residual offset cancel each other, maintains the correction value of the capacitive DAC when the residual error and the residual offset cancel each other, and to set the correction value to a previous correction value when the residual error and the residual offset do not cancel each other.

8. The AD converter device according to claim 1, wherein the offset correction circuit corrects the offset of the comparator, and wherein the DAC correction circuit sets a search direction of DAC correction in response to the residual offset.

9. An analog-to-digital (AD) converter device, comprising:
a capacitive digital-to-analog converter (DAC) including two reference capacitor groups each having a plurality of capacitors which are weighted with a ratio, one terminal of each of the plurality of capacitors being coupled to a common signal line, the other terminal of each of the plurality of capacitors being coupled to at least one of a plurality of reference power supplies via at least one of a plurality of switches;
a comparator to compare a voltage of the common signal line with a reference voltage;
a successive approximation routine circuit to control the plurality of switches based on a comparison result of the comparator;
an offset correction circuit to correct an offset of the comparator; and
a DAC correction circuit to correct an error in a voltage change of the common signal line, wherein the offset correction circuit and the DAC correction circuit to perform a correction so that a residual offset of the comparator and a residual error of the capacitive DAC cancel each other.

10. The AD converter device according to claim 9, wherein the capacitive DAC includes an upper side capacitor group including a plurality of upper capacitors, a lower side capacitor group including a plurality of lower capacitors, and a correction capacitor group including a plurality of correction capacitors, one terminal of each of the plurality of upper capacitors being coupled to the common signal line, one terminal of each of the plurality of lower capacitors being coupled to the common signal line via a bride bridge capacitor, one terminal of each of the plurality of correction capacitors being coupled to the common signal line via a bride the bridge capacitor, the other terminal of each of the plurality of correction capacitors being coupled to at least one of the plurality of reference power suppliers, wherein the DAC correction circuit couples the other terminal of at least one of the plurality of correction capacitors to at least one of the plurality of reference power supplies so that the sum of weights of the lower side capacitor group is substantially equal to the weight of a capacitor having a minimum capacitance of the upper side capacitor group.

11. The AD converter device according to claim 9, wherein the capacitive DAC includes an upper side capacitor group including a plurality of upper capacitors, a plurality of bride bridge capacitors, and a lower side capacitor group including a plurality of lower capacitors, one terminal of each of the plurality of upper capacitors being coupled to the common signal line, one terminal of each of the plurality of bride bridge capacitors being coupled to the common signal line, one terminal of each of the plurality of lower capacitors being coupled to the common signal line via one of the plurality of the bride bridge capacitors, wherein the DAC correction circuit performs a correction so that the weight of the lower side capacitor group is substantially equal to a minimum capacitance among the plurality of upper capacitors, upon a change of a capacitance of the bridge capacitor.

12. The AD converter device according to claim 9, wherein the capacitive DAC includes a correction voltage source to output a correction voltage, one terminal of the correction voltage source being coupled to the common signal line via a connection capacitor, and wherein the DAC correction circuit controls the correction voltage source to change the voltage of the common signal line by changing the weight of the reference capacitor group in accordance with a power of 2.

13. The AD converter device according to claim 9, wherein the reference capacitor group includes an upper side capacitor group including a plurality of upper capacitors, a plurality of bride bridge capacitors, and a lower side capacitor group including a plurality of lower capacitors, one terminal of each of the plurality of upper capacitors being coupled to the common signal line, one terminal of each of the plurality of bride bridge capacitors being coupled to the common signal line, one terminal of each of the plurality of lower capacitors being coupled to the common signal line via one of the plurality of the bride bridge capacitors, and wherein the correction voltage source is coupled to the other terminal of one of the plurality of bridge capacitors via the connection capacitor.

14. The AD converter device according to claim 9, wherein the offset correction circuit corrects the offset of the comparator in a stepwise fashion and sets a first polarity of a residual offset, and wherein the DAC correction circuit maintains a correction value of the capacitive DAC when a residual error of the capacitive DAC has a polarity opposite to the first polarity, and sets the correction value of the capacitive DAC to a previous correction value when the residual error of the capacitive DAC has the same polarity as the first polarity.

15. The AD converter device according to claim 9, wherein the offset correction circuit corrects the offset of the comparator in a stepwise fashion; wherein the DAC correction circuit corrects the error of the capacitive DAC, checks whether a residual error and a residual offset cancel each other, maintains the correction value of the capacitive DAC when the residual error and the residual offset cancel each other, and sets the correction value to a previous correction value when the residual error and the residual offset do not cancel each other.

16. The AD converter device according to claim 9, wherein the offset correction circuit corrects the offset of the comparator, and wherein the DAC correction circuit sets a search direction of DAC correction in response to the residual offset.

17. A correction method of an analog-to-digital (AD) converter device, comprising:
- coupling one terminal of each of a plurality of capacitors to at least one of a plurality of reference power sources via at least one of a plurality of switches, the plurality of capacitors being included in a reference capacitor group and being weighted with a ratio, one terminal of each of the plurality of capacitors being coupled to a common signal line;
- storing an analog input signal applied at a sampling time through a capacitive digital-to-analog converter (DAC);
- comparing a voltage on the common signal line with a reference voltage through a comparator;
- controlling the plurality of switches in response to a comparison result;
- correcting an offset of the comparator in a stepwise fashion; and
- correcting an error in a voltage change of the common signal line in a stepwise fashion through a DAC correction circuit;
- checking whether a residual offset of the comparator and a residual error of the capacitive DAC cancel each other;
- maintaining offset correction data and DAC correction data when the residual offset of the comparator and the residual error of the capacitive DAC cancel each other; and
- setting the offset correction data or the DAC correction data to previous correction data when the residual offset of the comparator and the residual error of the capacitive DAC do not cancel each other.

18. The correction method of the AD converter device according to claim 17, further comprising, outputting a correction voltage in steps of a voltage change of the common signal line so that the weight of the reference capacitor group changes in accordance with a power of 2.

* * * * *